United States Patent
Tanizaki et al.

(10) Patent No.: US 6,411,560 B1
(45) Date of Patent: Jun. 25, 2002

(54) SEMICONDUCTOR MEMORY DEVICE CAPABLE OF REDUCING LEAKAGE CURRENT FLOWING INTO SUBSTRATE

(75) Inventors: Hiroaki Tanizaki; Shigeki Tomishima; Mitsutaka Niiro; Masanao Maruta; Hiroshi Kato; Masatoshi Ishikawa; Takaharu Tsuji; Hideto Hidaka; Tsukasa Ooishi, all of Hyogo (JP)

(73) Assignees: Mitsubishi Denki Kabushiki Kaisha; Mitsubishi Electric Engineering Company Limited, both of Tokyo (JP)

( * ) Notice: Subject to any disclaimer, the term of this patent is extended or adjusted under 35 U.S.C. 154(b) by 0 days.

(21) Appl. No.: 09/987,277

(22) Filed: Nov. 14, 2001

(30) Foreign Application Priority Data

Jun. 22, 2001 (JP) .......................... 2001-188948

(51) Int. Cl.[7] ................................. G11C 5/14
(52) U.S. Cl. .................. 365/227; 365/226; 365/189.02; 365/189.07; 365/189.09
(58) Field of Search ................ 365/227, 226, 365/189.09, 189.02, 189.11, 189.07, 190

(56) References Cited

U.S. PATENT DOCUMENTS

| | | | |
|---|---|---|---|
| 5,287,314 A | * 2/1994 | Flannagan et al. | .......... 365/208 |
| 5,736,733 A | * 4/1998 | Shima et al. | ............ 250/208.2 |
| 5,859,799 A | * 1/1999 | Matsumoto et al. | ... 365/189.09 |
| 6,163,493 A | * 12/2000 | Yamagata et al. | .......... 365/226 |
| 6,310,569 B1 | * 10/2001 | Chaudhry et al. | .......... 341/144 |

OTHER PUBLICATIONS

"Ultra LSI Memory," Kiyoo Ito, Advanced Electronics Series, I–9, Baifukan, Nov. 5, 1994, pp. 175–176.

* cited by examiner

*Primary Examiner*—Andrew Q. Tran
(74) *Attorney, Agent, or Firm*—McDermott, Will & Emery

(57) ABSTRACT

A first power supply voltage is supplied to a power supply node of a sense amplifier. A bit line driver outputs a column select signal composed of a second power supply voltage to the gate terminals of N channel MOS transistors of a GIO line gate circuit. When input/output data is [1], a third power supply voltage lower than the first power supply voltage is supplied onto a global data line. In this case, with a threshold voltage of N channel MOS transistors used, a relation is established: second power supply voltage ≦ third power supply voltage+threshold voltage. As a result, a leakage current can be reduced in a semiconductor memory device driven by plural power supply voltages with respective different voltage levels.

19 Claims, 33 Drawing Sheets

INPUT SIGNAL AND OUTPUT VOLTAGE

| A TERMINAL | B TERMINAL | C TERMINAL | B. I. | VccP POTENTIAL |
|---|---|---|---|---|
| H | L | L | L | 1.5v |
| L | H | L | L | 1.7v |
| L | L | H | L | 2.0v |
| L | L | L | H | B. I. +0.5v |

SEMICONDUCTOR MEMORY DEVICE CAPABLE OF REDUCING LEAKAGE CURRENT FLOWING INTO SUBSTRATE

BACKGROUND OF THE INVENTION

1. Field of the Invention

The present invention relates to a semiconductor memory device, and particularly, to a semiconductor memory device with plural power supply voltages at respective different voltage levels, capable of reducing a leakage current flowing into a substrate.

2. Description of the Background Art

Attention has been focused on DRAM (Dynamic Random Access Memory), SRAM (Static Random Access Memory) and so on as a memory capable of inputting/outputting data at high speed.

Referring to FIG. 33, a prior art semiconductor memory device 1000 includes: memory cells 1001 and 1002; a sense amplifier 1010; a gate circuit 1020; peripheral circuit 1030; and a bit line driver 1070. Note that FIG. 33 shows only a part of semiconductor memory device 1000 since the figure is to describe fundamental operation of semiconductor memory device 1000.

Memory cell 1001 is connected to a bit line BL and a word line W1. Memory cell 1002 is connected to a bit line /BL and a word line W2. When word line W1 is activated, memory cell 1001 outputs data onto bit line BL or data is inputted to memory cell 1001 from bit line BL. When word line W2 is activated, memory cell 1002 outputs data onto bit line /BL or data is inputted to memory cell 1002 from bit line /BL.

Sense amplifier 1010 includes P channel MOS transistors 1011 to 1013; and N channel MOS transistors 1014 to 1016. P channel NOS transistor 1011 is connected between a power supply node 1017 and a node 1031 and receives a sense amplifier activation signal /SE at the gate terminal thereof. P channel MOS transistor 1012 and N channel MOS transistor 1014 are connected in series between nodes 1031 and 1032. P channel MOS transistor 1013 and N channel MOS transistor 1015 are connected in series between nodes 1031 and 1032. P channel MOS transistor 1012 and N channel MOS transistor 1014 in series connection are connected in parallel to P channel MOS transistor 1013 and N channel MOS transistor 1015 in series connection. N channel MOS transistor 1016 is connected between node 1032 and a ground node 1018 and receives a sense amplifier activation signal SE at the gate terminal thereof.

A node 1033 is connected to bit line BL. A node 1034 is connected to bit line /BL. P channel MOS transistor 1012 and N channel MOS transistor 1014 receive a voltage on bit line BL at the gate terminals thereof. P channel MOS transistor 1013 and N channel MOS transistor 1015 receive a voltage on bit line /BL at the gate terminals thereof. An array power supply voltage VccA is supplied onto power supply node 1017 and ground voltage is supplied onto ground node 1018.

When word line W1 is activated and data [1] is read out from memory cell 1001, the voltage on bit line BL comes to be voltage VccA/2+α slightly higher than a precharge voltage VccA/2 and bit line /BL assumes a precharge voltage VccA/2. In such a state, sense amplifier activation signal SE at H (logical high) level is inputted to sense amplifier 1010. Thereby, sense amplifier 1010 is activated. Voltage VccA/2+α is transmitted along bit line BL and applied onto the gate terminals of P channel MOS transistor 1012 and N channel MOS transistor 1014. Then, P channel MOS transistor 1012 is turned off, while N channel MOS transistor 1014 is turned on, with the result that a voltage on node 1034 is lowered to ground voltage (0 V) and in turn, a voltage on bit line /BL comes to 0 V.

Since a voltage on bit line /BL is applied to the gate terminals of P channel MOS transistor 1013 and N channel MOS transistor 1015, P channel MOS transistor 1013 is turned on, while N channel MOS transistor 1015 is turned off to cause a voltage on node 1033 to be array power supply voltage VccA. Then, a voltage on bit line BL becomes array power supply voltage VccA. In such operation, voltages on bit lines BL and /BL showing data [1] read out from memory cell 1001 are amplified from (VccA/2+α, VccA/2) to (VccA, 0), respectively.

When data [0] is read out from memory cell 1001, a voltage on bit line BL becomes a voltage VccA/2−α slightly lower than precharge voltage VccA/2, and a voltage on bit line /BL becomes precharge voltage VccA/2. Voltage VccA/2 is transmitted along bit line /BL and applied onto the gate terminals of P channel MOS transistor 1013 and N channel MOS transistor 1015 of sense amplifier 1010. Then, P channel MOS transistor 1013 is turned off, while N channel MOS transistor 1015 is turned on to cause a voltage on node 1033 to be ground voltage (0V). Thus, a voltage on bit line BL becomes 0 V.

Since a voltage on bit line BL is applied onto the gate terminals of P channel MOS transistor 1012 and N channel MOS transistor 1014, P channel MOS transistor 1012 is turned on, while N channel MOS transistor 1014 is turned off to cause a voltage on node 1034 to be array power supply voltage VccA. Then, a voltage on bit line /BL becomes array power supply voltage VccA. In such operation, voltages on bit lines BL and /BL showing data [0] read out from memory cell 1001 are amplified from (VccA/2−α, VccA/2) to (0, VccA), respectively.

When data is read out from memory cell 1002, as well, sense amplifier 1010 amplifies voltages on bit lines BL and /BL performing the above operation.

When data is written onto memory cells 1001 and 1002, sense amplifier 1010 transfers voltages transmitted from a global data line pair GIO and /GIO as VccA and 0 (or 0 and VccA) onto bit line pair BL and /BL, respectively.

Therefore, sense amplifier 1010 amplifies data read out from memory cells 1001 and 1002 using a cross-coupled latch, or alternatively transfers data written from outside semiconductor memory device 1000 onto bit lines BL and /BL using the cross-coupled latch.

Gate circuit 1020 includes N channel MOS transistors 1021 and 1022. N channel MOS transistor 1021 is connected to bit line BL at the drain terminal thereof and to global data line GIO at the source terminal, and receives a column select signal VACSL at the gate terminal thereof. N channel MOS transistor 1022 is connected to bit line /BL at the drain terminal thereof and to global data line /GIO at the source terminal, and receives column select signal VACSL at the gate terminal thereof. Therefore, N channel MOS transistor 1021 is turned on when receiving column select signal VACSL at H level at the gate terminal thereof to connect global data line GIO to bit line BL. N channel MOS transistor 1022 is turned on when receiving column select signal VACSL at the gate terminal thereof to connect global data line /GIO to bit line /BL.

Peripheral circuit 1030 includes: a GIO line write driver 1040; a read amplifier 1050; and a GIO line equalize circuit 1060. GIO line write driver 1040 includes: inverters 1041 and 1044 to 1047; NAND gates 1042 and 1043; P channel MOS transistors 1048 and 1051; and N channel MOS transistors 1049 and 1052. Inverter 1041 inverts a signal inputted at terminal 1028 to output the inverted input to one terminal of NAND gate 1043. NAND gate 1042 receives a signal inputted at terminals 1028 and 1029 to invert a logical product of the received two signals and output the inverted logical product as a signal. NAND gate 1043 receives an output signal of inverter 1041 and a signal inputted at terminal 1029 to invert a logical product of the received two signals and output the inverted logical product as a signal. Inverter 1044 inverts an output signal of NAND gate 1042. Inverter 1045 inverts an output signal of NAND gate 1043. Inverter 1046 inverts an output signal of inverter 1044. Inverter 1047 inverts an output signal of inverter 1045.

P channel MOS transistor 1048 and N channel MOS transistor 1049 are connected in series between a power supply node 1053 and a ground node 1054. P channel MOS transistor 1048 receives an output signal of inverter 1046 at the gate terminal thereof. N channel MOS transistor 1049 receives an output signal of inverter 1045 at the gate terminal thereof.

P channel MOS transistor 1051 and N channel MOS transistor 1052 are connected in series between power supply node 1053 and ground node 1054. P channel MOS transistor 1051 receives an output signal of inverter 1047 at the gate terminal thereof. N channel MOS transistor 1052 receives an output signal of inverter 1044 at the gate terminal thereof.

Global data line GIO is connected to a node 1055 between P channel MOS transistor 1048 and N channel MOS transistor 1049. Furthermore, global data line /GIO is connected to a node 1056 between P channel MOS transistor 1051 and N channel MOS transistor 1052. Power supply voltage Vcc lower than array power supply voltage VccA is supplied to power supply node 1053 and ground voltage (0 V) is supplied to ground node 1054.

When data is written, a signal WM of H level is inputted at terminal 1029 and a signal WD of H level or L (logical low) level corresponding to data [1] or [0] is inputted at terminal 1028. When data [1] is written, signal WD of H level is inputted at terminal 1028 and signal WD of H level is inputted at terminal 1029. Subsequently, inverter 1041 outputs a signal of L level, NAND gate 1043 outputs a signal of H level and inverter 1045 outputs a signal of L level. Then, inverter 1047 outputs a signal of H level.

On the other hand, NAND gate 1042 outputs a signal of L level and inverter 1044 outputs a signal of H level. Then, inverter 1046 outputs a signal of L level.

In such a situation, P channel MOS transistor 1048 and N channel MOS transistor 1052 are turned on, while N channel MOS transistor 1049 and P channel MOS transistor 1051 are turned off. Then, GIO line driver 1040 supplies power supply voltage Vcc onto global data line GIO and ground voltage onto global data line /GIO.

When data [0] is written, signal WD of L level is inputted at terminal 1028 and signal WM of H level is inputted at terminal 1029. Then, inverter 1041 outputs a signal of H level, NAND gate 1043 outputs a signal of L level, and inverter 1045 outputs a signal of H level. Receiving the signal of H level from inverter 1045, inverter 1047 outputs a signal of L level.

On the other hand, NAND gate 1042 outputs a signal of H level and inverter 1044 outputs a signal of L level. Receiving the signal of L level from inverter 1044, inverter 1046 outputs a signal of H level.

In such a situation, N channel MOS transistor 1049 and P channel MOS transistor 1051 are turned on, while P channel MOS transistor 1048 and N channel MOS transistor 1052 are turned off. Then, GIO line driver 1040 supplies ground voltage onto global data line GIO and power supply voltage Vcc onto global data line /GIO.

Note that when signal WM of L level is inputted at terminal 1029, NAND gates 1042 and 1043 output a signal of H level regardless of a logical level of a signal inputted at terminal 1028 and therefore, inverters 1044 and 1045 output signals of L level. With the signals of L level from inverters 1044 and 1045, inverters 1046 and 1047 output signals of H level. In such a situation, P channel MOS transistors 1048 and 1051 and N channel MOS transistors 1049 and 1052 are all turned off to put global data line pair GIO ad /GIO into floating state, where no data write is performed.

In such a manner, GIO line write driver 1040 supplies voltages (Vcc, 0) or (0, Vcc) to global data line pair GIO and /GIO, respectively, in response to data inputted at terminal 1028.

Read amplifier 1050 receives data read out from memory cell 1001 or 1002 through global data line GIO and /GIO to amplify the received data and output the read data to an input/output terminal.

GIO line equalize circuit 1060 is constructed of a P channel MOS transistors 1061 to 1063. P channel MOS transistor 1061 is connected between global data lines GIO and /GIO. P channel MOS transistors 1062 and 1063 are connected in series between global data lines GIO and /GIO. Power supply voltage Vcc is supplied to a node 1064 from a power supply node 1065. P channel MOS transistors 1061 to 1063 receive a GIO line equalize signal GIOEQ at the gate terminals thereof.

When GIO line equalize signal GIOEQ of L level is inputted to GIO line equalize circuit 1060, P channel MOS transistors 1061 to 1063 are turned on and GIO line equalize circuit 1060 supplies power supply voltage Vcc onto both of global data line pair GIO and /GIO from node 1064. In this situation, since P channel MOS transistor 1061 is in on state, potentials on global data lines GIO and /GIO are equal to each other, thus equalizing global data line pair GIO and /GIO.

Bit line driver 1070 includes: a P channel MOS transistor 1071 and an N channel MOS transistor 1072. P channel MOS transistor 1071 and N channel MOS transistor 1072 are connected in series between a power supply node 1073 and a ground node 1074. A power supply voltage VccP is supplied to power supply node 1073. Bit line driver 1070 is included in a column decoder and inputted with a signal of H level or L level in response to a decoded column address.

When bit line pair BL and /BL corresponding to bit line driver 1070 is selected, P channel MOS transistor 1071 and N channel MOS transistor 1072 receives a signal of L level at the gate terminals thereof. As a result, P channel MOS transistor 1071 is turned on, while N channel MOS transistor 1072 is turned off, and bit line driver 1070 outputs column select signal VACSL composed of power supply voltage VccP to gate circuit 1020.

When bit line pair BL and /BL corresponding to bit line driver 1070 is not selected, P channel MOS transistor 1071 and N channel MOS transistor 1072 receive a signal of H level. As a result, P channel MOS transistor 1071 is turned off, while N channel MOS transistor 1072 is turned on, and bit line driver 1070 outputs column select signal VACSL composed of ground voltage to gate circuit 1020.

When data is inputted to or outputted from memory cell 1001 (or 1002), GIO line equalize circuit 1060 receives GIO line equalize signal GIOEQ of L level to supply power supply voltage Vcc to both of global data line GIO and /GIO and equalize global data line GIO and /GIO, as described above. Then, GIO line equalize signal GIOEQ of H level is inputted to GIO line equalize circuit 1060 and P channel MOS transistors 1061 to 1063 are turned off, thereby completing equalization of global data line pair GIO and /GIO.

After the equalization of global data line pair GIO and /GIO, bit line driver 1070 outputs column select signal VACSL composed of power supply voltage VccP to gate circuit 1020 according to the way described above. Thereby, N channel MOS transistors 1021 and 1022 are turned on and gate circuit 1020 connects global data line pair GIO and /GIO to bit line pair BL and /BL, respectively.

Thereafter, when data is written onto memory cell 1001 (or 1002), GIO line write driver 1040 supplies voltages (Vcc and 0) or (0 and Vcc) to global data line pair GIO and /GIO as described above. Then, voltages on global data line pair GIO and /GIO are supplied onto bit line pair BL and /BL, respectively, through N channel MOS transistors 1021 and 1022.

With supply of the voltages onto bit line pair BL and /BL, sense amplifier 1010 transfers a voltage on a bit line supplied with power supply voltage Vcc of bit line pair BL and /BL as power supply voltage VccA to memory cell 1001 (or 1002).

When data is read out from memory cell 1001 (or 1002), sense amplifier 1010 sets voltages on bit line pair BL and /BL to (VccA and 0) or (0 and VccA), thus amplifying read data. When amplification of the read data in sense amplifier 1010 ends, bit line driver 1070 outputs column select signal VACSL composed of power supply voltage VccP to turn on N channel MOS transistors 1021 and 1022 of gate circuit 1020. By doing so, voltages on bit line pair BL and /BL are transmitted onto global data line pair GIO and /GIO, respectively, through N channel MOS transistors 1021 and 1022. In this case, global data line pair GIO and /GIO are equalized to power supply voltage Vcc before N channel MOS transistors 1021 and 1022 are turned on.

Accordingly, when data is inputted to or outputted from memory cell 1001 (or 1002), array power supply voltage VccA is applied onto the drain terminals (bit line pair BL and /BL sides) of N channel MOS transistors 1021 and 1022 in gate circuit 1020 and power supply voltage Vcc is supplied onto the source terminals (global data line pair GIO and /GIO sides) of N channel MOS transistors 1021 and 1022. Furthermore, power supply voltage VccP is applied onto the gate terminals of N channel MOS transistors 1021 and 1022.

Recently, however, in company with progress toward a high speed operation in a semiconductor memory device, MOS transistors constituting peripheral circuitry 1030 have been increasingly adopted a thin gate oxide film. With increase in adoption of a thin gate oxide film, power supply voltage Vcc of the peripheral circuitry has been in a trend toward a lower voltage, and set lower than array power supply voltage VccA of sense amplifier 1010. In such a situation, a problem arises since a leakage current flows into substrates of P channel MOS transistors constituting GIO line write driver 1040 and GIO line equalize circuit 1060 from bit line pair BL and /BL.

Moreover, in a case where plural MOS transistors with plural power supply voltages at respective different levels use an output node commonly among them, a problem arises since, when one of the power supply voltages varies largely, a forward leakage current of a PN junction flows to the substrate of a MOS transistor from an active region in which the drain of the MOS transistor is formed. That is, referring to FIG. 34, a P channel MOS transistor 1100 and an N channel MOS transistor 1101 are connected in series between power supply node 1102 and a ground node 1103. Furthermore, a P channel MOS transistor 1104 and an N channel MOS transistor 1105 are connected in series between a power supply node 1106 and a ground node 1107.

A power supply voltage Vcc1 is supplied onto power supply node 1102 and a ground voltage Vs1 is supplied onto a ground node 1103. A power supply voltage Vcc2 is supplied to power supply node 1106 and a ground voltage Vs2 is supplied onto a ground node 1107. P channel MOS transistor 1100 and N channel MOS transistor 1101 use an output node 1108 of P channel MOS transistor 1104 and N channel MOS transistor 1105 commonly therewith.

In such a configuration, when power supply voltage Vcc2 is higher than power supply voltage Vcc1, a bias in the forward direction is applied across the PN junction in the drain region of P channel MOS transistor 1100 and thereby, a leakage current flows into a substrate of P channel MOS transistor 1100. Furthermore, when ground voltage Vs2 is lower than ground voltage Vs1, a bias in the forward direction is applied across the PN junction in the drain region of P channel MOS transistor 1101 and thereby, a leakage current flows into a substrate of P channel MOS transistor 1101.

The leakage current shown in FIG. 34 occurs between a pair of P channel MOS transistor 1013 and N channel MOS transistor 1015 constituting sense amplifier 1010 and a pair of P channel MOS transistor 1048 and N channel MOS transistor 1049 constituting GIO line write driver 1040, shown in FIG. 33. Furthermore, the leakage current shown in FIG. 34 also occurs between a pair of P channel MOS transistor 1012 and N channel MOS transistor 1014 constituting sense amplifier 1010 and a pair of P channel MOS transistor 1051 and N channel MOS transistor 1052 constituting GIO line write driver 1040.

SUMMARY OF THE INVENTION

It is accordingly an object of the present invention to provide a semiconductor memory device driven by plural power supply voltages with respective different levels, capable of reducing a leakage current.

According to the present invention, a semiconductor memory device of the present invention comprises: plural memory cells; plural bit line pairs, provided correspondingly to the plural memory cells, and each for inputting or outputting data to or from a memory cell; plural sense amplifiers, provided correspondingly to the plural bit line pairs, and each supplying a first power supply voltage to one of a corresponding bit line pair when data is inputted to or outputted from a memory cell; plural global data line pairs provided correspondingly to the plural bit line pairs; a write/read circuit supplying a second power supply voltage lower than the first power supply voltage to one of a corresponding global data line pair when data is written onto a memory cell, and receiving the second power supply voltage from one of a corresponding global data line pair when data is read from a memory cell; a column decoder circuit outputting an activation signal for activating a bit line pair provided correspondingly to a memory cell onto or from which data is inputted or outputted among the plural bit line pairs when data is inputted to or outputted from the memory cell, and a deactivation signal for deactivating bit line pairs provided correspondingly to memory cells other than a memory cell onto or from which data is inputted or outputted; and plural gate circuits provided correspondingly to the plural bit line pairs and plural global data line pairs, wherein each of the plural gate circuits connects a corresponding bit line pair to a corresponding global data line pair when receiving the activation signal, while disconnecting a corresponding bit line pair from a corresponding global data line pair when receiving the deactivation signal, and a current flowing from the bit line pair toward the global data line pair through a gate circuit receiving the activation signal is smaller than a predetermined value.

Preferably, the activation signal is composed of a third power supply voltage and each of the plural gate circuits includes MOS transistors to be activated by the third power supply voltage.

Preferably, each of the plural gate circuits includes: a first MOS transistor connected to one of a global data line pair at a source terminal thereof and to one of a bit line pair at a drain terminal thereof, and receiving the third power supply voltage at a gate terminal thereof; and a second MOS transistor connected to the other of the global data line pair at a source terminal thereof and to the other of the bit line pair at a drain terminal thereof, and receiving the third power supply voltage at a gate terminal thereof, wherein when threshold voltages of the first and second MOS transistors are Vth, the second power supply voltage is Vcc and the third power supply voltage is VccP by definition, a relation VccP≦Vcc+Vth is satisfied.

Preferably, each of the plural gate circuits includes: a first MOS transistor of a first conductive type, connected to one of a global data line pair at a source terminal thereof and to one of a bit line pair at a drain terminal thereof, and receiving the third power supply voltage at a gate terminal thereof, and a second MOS transistor of the first conductive type, connected to the other of the global data line pair at a source terminal thereof, to the other of the bit line pair at a drain terminal thereof, and receiving the third power supply voltage at a gate terminal thereof and the write/read circuit includes: a third MOS transistor of a second conductive type, wherein when threshold voltages of the first and second MOS transistors are Vth, the second power supply voltage is Vcc, the third power supply voltage is VccP and a built-in potential of the third MOS transistor is Vb by definition, a relation VccP≦Vcc+Vth+Vb is satisfied.

Preferably, the activation signal is composed of the third power supply voltage generated in response to a voltage level of the second power supply voltage.

Preferably, the semiconductor memory device further comprises: a power supply voltage change-over circuit receiving a voltage level change-over signal for changing voltage levels of the third power supply voltage therebetween in response to a voltage level of the second power supply voltage to change over voltage levels of the third power supply voltage based on thus received voltage change-over signal and output the third power supply voltage with a changed voltage level to the column decoder circuit, wherein the column decoder circuit generates the activation signal composed of the third power supply voltage outputted by the power supply change-over circuit.

Preferably, each of the plural gate circuits includes: a first MOS transistor connected to one of a global data line pair at a source terminal thereof and to one of a bit line pair at a drain terminal thereof, and receiving the third power supply voltage at a gate terminal thereof; and a second MOS transistor connected to the other of the global data line pair at a source terminal thereof and to the other of the bit line pair at a drain terminal thereof, and receiving the third power supply voltage at a gate terminal thereof, wherein when threshold voltages of the first and second MOS transistors are Vth, the second power supply voltage is Vcc and the third power supply voltage is VccP by definition, a relation VccP≦Vcc+Vth is satisfied.

Preferably, each of the plural gate circuits includes: a first MOS transistor of a first conductive type, connected to one of a global data line pair at a source terminal thereof and to one of a bit line pair at a drain terminal thereof, and receiving the third power supply voltage at a gate terminal thereof; and a second MOS transistor of the first conductive type, connected to the other of the global data line pair at a source terminal thereof and to the other of the bit line pair at a drain terminal thereof, and receiving the third power supply voltage at a gate terminal thereof and the write/read circuit includes: a third MOS transistor of a second conductive type, wherein when threshold voltages of the first and second MOS transistors are Vth, the second power supply voltage is Vcc, the third power voltage is VccP and a built-in potential of the third MOS transistor is Vb by definition, a relation VccP≦Vcc+Vth+Vb is satisfied.

Preferably, the power supply voltage change-over circuit changes voltage over levels of the third power supply voltage based on a mode change-over signal.

Preferably, the power supply voltage change-over circuit changes voltage over levels of the third power supply voltage by means of changing wire bonding or changing masks.

Preferably, the power supply voltage change-over circuit receives the voltage level change-over signal from a decoding circuit changing modes.

Preferably, the semiconductor memory device further includes: a power supply voltage change-over circuit changing voltage levels of the third power supply voltage with reference to a reference voltage whose voltage level changes in response to a voltage level of the second power supply voltage.

Preferably, the power supply voltage change-over circuit includes: a reference voltage generation circuit generating plural reference voltages; a select circuit selecting a reference voltage in response to a voltage level of the second voltage among the plural reference voltages; and a step-down circuit reducing an external power supply voltage down to a selected reference voltage to generate the third power supply voltage.

Preferably, the power supply voltage change-over circuit includes: a reference voltage generation circuit generating a reference voltage with a different voltage level by changing a voltage division ratio for an external power supply voltage in response to a voltage level of the second power supply voltage; and a step-down circuit reducing the external power supply voltage down to the reference voltage received from the reference voltage generation circuit to generate the third power supply voltage.

Furthermore, according to the present invention, a semiconductor memory device of the present invention includes: plural power supply terminals for supplying plural power supply voltages with different voltage levels; plural ground terminals for supplying plural ground voltages with different voltage levels; and plural circuits using an output node commonly therebetween, and for inputting or outputting data to or from a memory cell, wherein each of the plural circuits is different from the other in drive voltage and includes: a MOS transistor of a first conductive type provided between a power supply node and the output node; and a MOS transistor of a second conductive type provided between the output node and a ground node, the MOS transistor of a first conductive type receiving a power supply voltage with the highest voltage level among the plural power supply voltages as a substrate voltage thereof from said power supply terminal and the MOS transistor of a second conductive type receiving a ground voltage with the lowest voltage level among the plural ground voltages as a substrate voltage thereof from said ground terminal.

Preferably, the power supply voltage with the highest voltage level coincides with a voltage supplied to a power supply node of a circuit whose drive voltage is the highest among the plural circuits, and the ground voltage with the lowest voltage level coincides with a voltage supplied to a ground node of a circuit whose drive voltage is the highest among the plural circuit.

Preferably, the semiconductor memory device further includes: a first switch circuit selecting a power supply voltage with the highest voltage level among the plural power supply voltages to give the selected power supply voltage to the MOS transistor of a first conductive type; and a second switch selecting a ground voltage with the lowest voltage level among the plural ground voltages to give the selected ground voltage to the MOS transistor of a second conductive type.

Preferably, the semiconductor memory device includes: a first comparison circuit comparing voltage levels of the plural power supply voltages therebetween to output a result of the comparison; a second comparison circuit comparing voltage levels of the plural ground voltages therebetween to output a result of the comparison; a first switch selecting a power supply voltage with the highest voltage level based on the result of the comparison from the first comparison circuit to give the selected power supply voltage to the MOS transistor of a first conductive type; and a second switch selecting a ground voltage with the lowest voltage level based on the result of the comparison from the second comparison circuit to give the selected ground voltage to the MOS transistor of a second conductive type.

Preferably, the semiconductor memory circuit further includes: a power supply voltage supply circuit selecting a power supply voltage with the highest voltage level based on voltage levels of the plural power supply voltages to give the selected power supply voltage to the MOS transistor of a first conductive type; and a ground voltage supply circuit selecting a ground voltage with the lowest voltage level based on voltage levels of the plural ground voltages to give the selected ground voltage to the MOS transistor of a second conductive type.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention referring to the accompanying drawings, wherein the same reference symbols are attached to the same or corresponding constituents and description thereof is not repeated.

First Embodiment

Figure 1:
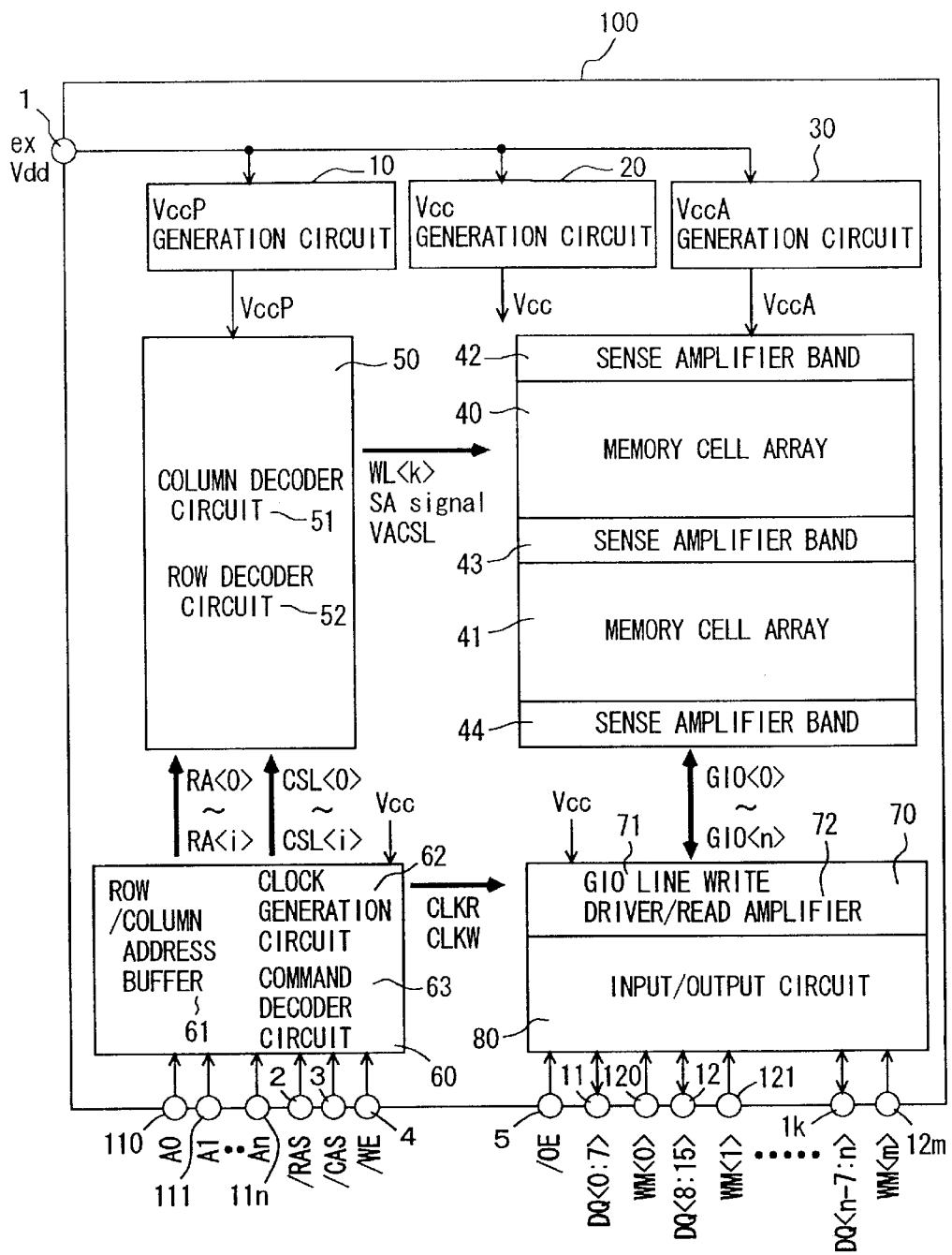
FIG. 1 is a schematic block diagram of a semiconductor memory device according to a first embodiment.

Referring to FIG. 1, a semiconductor memory device 100 according to a first embodiment includes: a VccP generation circuit 10; a Vcc generation circuit 20; a VccA generation circuit 30; memory cell arrays 40 and 41; sense amplifier bands 42 to 44; peripheral circuits 50, 60 and 70; and an input/output. circuit 80. Memory cell array 40 is placed between sense amplifier bands 42 and 43 and memory cell array 41 is placed between sense amplifier bands 43 and 44. Peripheral circuit 50 includes: a column decoder circuit 51 and a row decoder circuit 52. Peripheral circuit 60 includes: a row/column address buffer 61; a clock generation circuit 62; and a command decoder circuit 63. Peripheral circuit 70 includes: a GIO line write driver 71; and a read amplifier 72. GIO line write driver 71 and read amplifier 72 are provided correspondingly to each of plural bit line pairs included in memory cell arrays 40 and 41.

VccP generation circuit 10 reduces an external power supply voltage exVdd inputted at a terminal 1 to generate a power supply voltage VccP satisfying conditions described later. VccP generation circuit 10 outputs generated power supply voltage VccP to peripheral circuit 50. Vcc generation circuit 20 reduces external power supply voltage exVdd inputted at terminal 1 to generate power supply voltage Vcc and output thus generated power supply voltage Vcc to peripheral circuits 60 and 70, and to input/output circuit 80. VccA generation circuit 30 reduces external power supply voltage exVdd inputted at a terminal 1 to generate power supply voltage VccA and output thus generated power supply voltage VccA to sense amplifier bands 42 to 44.

Memory cell arrays 40 and 41 includes: plural memory cells arranged in a matrix, plural word lines arranged in the row direction; and plural bit line pairs arranged in the column direction. Sense amplifier bands 42 to 44 each include plural sense amplifiers corresponding to the respective plural bit line pairs provided in memory cell arrays 40 and 41.

Column decoder circuit 51 outputs a column select signal VACSL composed of power supply voltage VccP based on column select signals CSL <0> to CSL <i>, a block select signal and a column bank signal. Row decoder circuit 52 outputs a word line activation signal WL <k> and a sense amplifier activation signal SA based on row predecode signals RA <0> to RA <i> inputted.

Row/column address buffer 61 predecodes addresses A0 to An inputted at terminals 110 to 11n to generate row predecode signals RA <0> to RA <i>. Clock generation circuit 62 generates clocks to output a read clock CLKR and a write clock CLKW. Command decoder circuit 63 decodes a row address strobe signal /RAS inputted at a terminal 2, a column address strobe signal /CAS inputted at a terminal 3 and a write enable signal /WE inputted at a terminal 4 to output results of the decoding to peripheral circuit 50 and input/output circuit 80.

GIO line write driver 71 writes write data inputted from input/write circuit 80 onto a global data line pair by means of a method described later. On the other hand, GIO line write driver 71 causes a global data line pair to enter a floating state as described later not to write write data onto the global data line pair when signals WM <0> to WM <m> are inputted from input/output circuit 80. Read amplifier 72 receives read data read out from a memory cell included in memory cell arrays 40 and 41 to amplify the received read data and output the amplified data to input/output circuit 80. Input/output circuit 80 outputs read data from read amplifier 72 to terminals 11 to 1k based on an output enable signal /OE inputted at a terminal 5. Furthermore, input/output circuit 80 outputs write data inputted at terminal 11 to 1k to GIO line write driver 71. Moreover, input/output circuit 80 outputs signals WM <0> to WM <m> inputted at terminals 120, 121 to 12m to GIO line write driver 71. Signals WM <0> to WM <m> are signals for controlling write data so as not to be written and each are inputted to input/output circuit 80 through one WM <0> or the like provided correspondingly to an input/output terminal DQ <0:7> of 8 bits.

Figure 2:
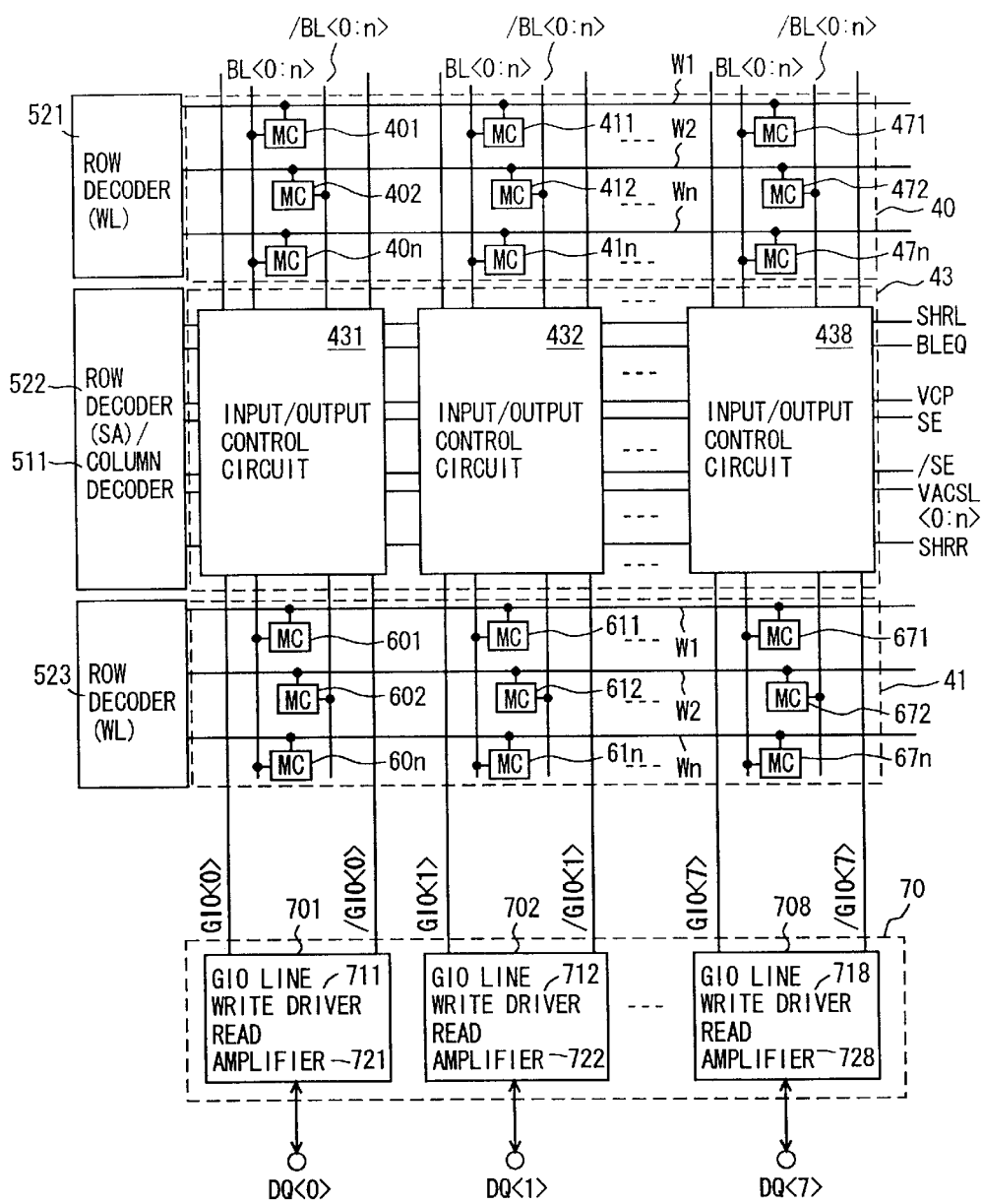
FIG. 2 is a block diagram of a sense amplifier band, a memory cell array, a row decoder, a column decoder and an input/output circuit shown in FIG. 1.

Referring to FIG. 2, detailed description will given of memory cell arrays 40 and 41, sense amplifier band 43, column decoder circuit 51, row decoder circuit 52, GIO write driver 71 and read amplifier 72.

Memory cell array 40 includes: memory cells 401 to 40n, 411 to 41n, . . . , 471 to 47n. Memory cell array 41 includes: memory cells 601 to 60n, 611 to 61n, . . . , 671 to 67n. Sense amplifier band 43 includes input/output control circuits 431 to 438. N bit line pairs BL <0:n> and /BL <0:n> are connected to each of input/output control circuits 431 to 438.

Column decoder circuit 51 includes a column decoder 511. Column decoder 511 outputs a column select signal VACSL composed of power supply voltage VccP for selecting one bit line pair among n bit line pairs BL <0:n> and /BL <0:n>. Row decoders 521 and 523 each activate one of word lines W1 to Wn based on a row address. Row decoder 522 outputs sense amplifier activation signals SE and /SE for activating one of n sense amplifiers included in each of input/output control circuits 431 to 438. Bit line equalize signal BLEQ is a signal for equalizing each of bit line pairs BL <0:n> and /BL <0:n> at a precharge voltage.

A signal SHRL is a signal for accessing memory cells 401 to 40n, 411 to 41n, . . . , 471 to 47n included in memory cell array 40 and a signal SHRR is a signal for accessing memory cells 601 to 60n, 611 to 61n, . . . , 671 to 67n included in memory cell array 41. Therefore, when each of n sense amplifiers included in each of input/output control circuit 431 to 438 accesses to a memory cell included in memory cell array 40, a gate of a bit line shared circuit disposed at memory cell array 40 side is opened by activated signal SHRL, while a gate of a bit line shared circuit disposed at memory cell array 41 side is closed by deactivated signal SHRR. Furthermore, when each of n sense amplifiers accesses to a memory cell included in memory cell array 41, a gate of a bit line shared circuit disposed at memory cell array 41 side is opened by activated signal SHRR, while a gate of a bit shared circuit disposed at the memory cell array 40 side is closed by deactivated signal SHRL.

Peripheral circuit 70 includes input/output circuits 701 to 708. Input/output circuits 701 to 708 are provided correspondingly to respective input/output control circuits 431 to 438. Global data line pairs GIO <0> and /GIO <0> to GIO <7> and /GIO <7> are connected to respective input/output circuits 701 to 708. Input/output circuits 701 to 708 include respective GIO line write drivers 711 to 718 and respective read amplifiers 721 to 728.

GIO line write drivers 711 to 718 write data inputted from input/output terminals DQ <0> to DQ <7> onto respective global data line pairs GIO <0> and /GIO <0> to GIO <0> and /GIO <7>. Read amplifiers 721 to 728 amplify read data received from respective global data line pairs GIO <0> and /GIO <0> to GIO <0> and /GIO <7> to output the amplified data to input/output terminals DQ <0> to DQ <7>.

Figure 3:
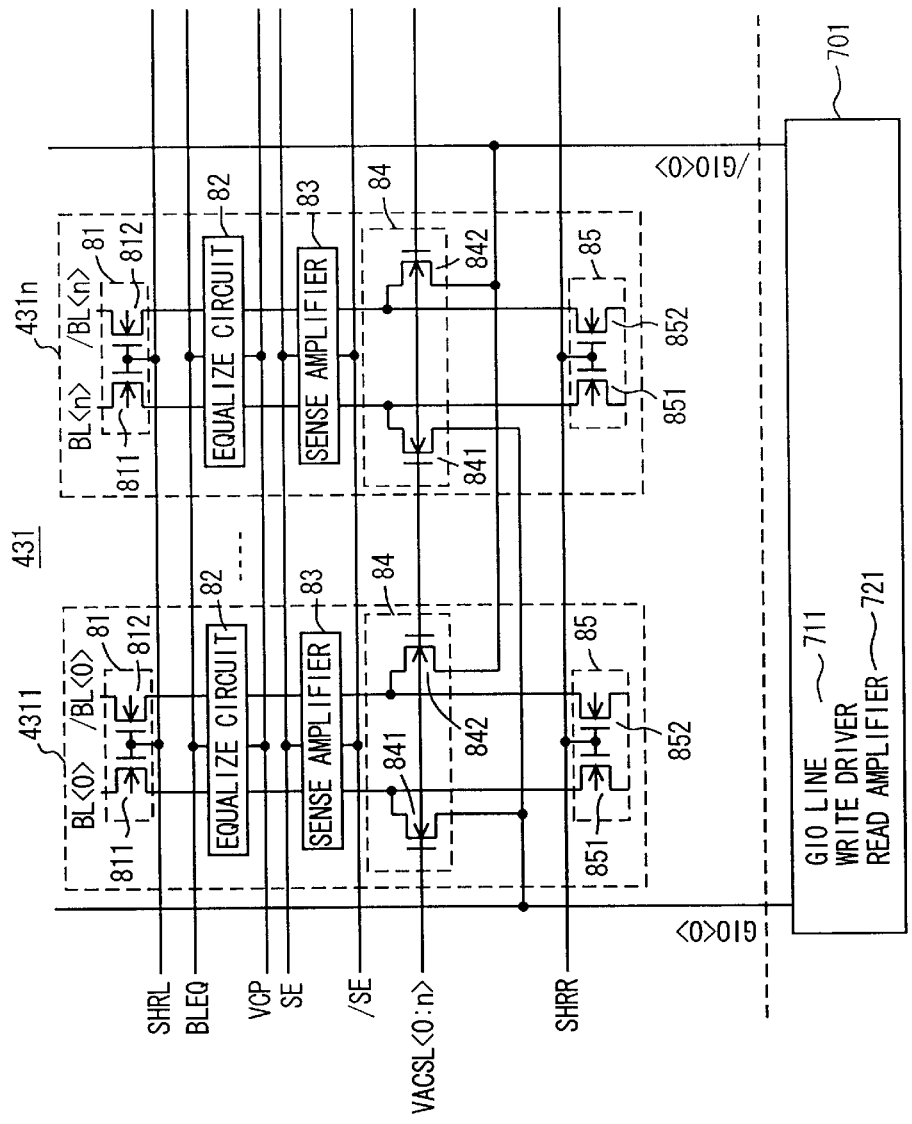
FIG. 3 is a block diagram and circuit diagram of the input/output control circuit shown in FIG. 2.

Referring to FIG. 3, detailed description will be given of input/output control circuit 431. Input/output control circuit 431 includes sense amplifier circuit 4311 to 431n. Each of sense amplifier circuits 4311 to 431n includes bit line shared circuits 81 and 85, an equalize circuit 82; a sense amplifier 83; and a GIO line gate circuit 84. Sense amplifier circuits 4311 to 431n are provided correspondingly to respective bit line pairs BL <0> and/BL <0> to BL <n> and /BL <n>.

Bit line shared circuit 81 is constructed of N channel MOS transistors 811 and 812. N channel MOS transistor 811 is inserted in series with each of bit lines BL <0> to BL <n>. N channel MOS transistor 812 is inserted in series with each of bit lines /BL <0> to /BL <n>. N channel MOS transistors 811 and 812 receives signal SHRL at the gate terminals thereof. Therefore, bit line shared circuit 81 connects sense amplifier 83 to each of bit line pairs BL <0> and /BL <0> to BL <n> and /BL <n> when signal SHRL of H level is inputted, while disconnecting sense amplifier 83 from each of bit line pairs BL <0> and /BL <0> to BL <n> and /BL <n> when signal SHRL of L level is inputted. Equalize circuit 82 equalizes each of bit line pairs BL <0> and /BL <0> to BL <n> and /BL <n> according to bit line equalize signal BLEQ and signal VCP. Sense amplifier 83 is driven by sense amplifier activation signals SE and /SE to amplify read data received from each of bit line pairs BL <0> and /BL <0> to BL <n> and /BL <n> and transfer write data received from each of global data line pairs GIO <0> and /GIO <0> to bit line pairs BL <0> and /BL <0> to BL <n> and /BL <n>.

GIO line gate circuit 84 is constructed of N channel MOS transistors 841 and 842. N channel MOS transistor 841 is connected to each of bit lines BL <0> to BL <n> at the drain terminal thereof and to global data line GIO <0> at the source terminal thereof and receives column select signal VACSL at the gate terminal thereof. N channel MOS transistor 842 is connected to each of bit lines /BL <0> to /BL <n> at the drain terminal thereof and to global data line /GIO at the source terminal thereof and receives column select signal VACSL of the gate terminal thereof. Therefore, when receiving column select signal VACSL at H level, GIO line gate circuit 84 connects each of bit line pairs BL <0> and /BL <0> to BL <n> and /BL <n> to global data line pairs GIO <0> and /GIO <0>.

Bit line shared circuit 85 is constructed of N channel MOS transistors 851 and 852. N channel MOS transistor 851 is inserted in series with each of BL <0> to BL <n>. N channel MOS transistor 852 is inserted in series with each of /BL <0> to /BL <n>. N channel MOS transistors 851 and 852 receives signal SHRR at the gate terminals thereof.

Therefore, when signal SHRR of H level is inputted, bit line shared circuit 85 connects sense amplifier 83 to each of bit line pairs BL <0> and /BL <0> to BL <n> and /BL <n>, while when signal SHRR of L level is inputted, bit line shared circuit 85 disconnects sense amplifier 83 from each of pairs BL <0> and /BL <0> to BL <n> and /BL <n>.

GIO line write driver 711 writes write data onto global data line pair GIO <0> and /GIO <0>. Read amplifier 721 amplifies read data received from global data line pair GIO <0> and /GIO <0> to output the amplified read data to input/output terminal DQ <0>.

When the gate of bit line shared circuit 81 is opened by signal SHRL of H level and the gate of bit line shared circuit 85 is closed by signal SHRR of L level, sense amplifier 83 receives read data from a memory cell arranged at bit line shared circuit 81 side, from one of bit line pairs BL <0> and /BL <0> to BL <n> and /BL <n> and transfers write data from GIO line gate circuit 84 to one of bit line pairs BL <0> and /BL <0> to BL <n> and /BL <n>. Furthermore, when the gate of bit line shared circuit 85 is opened by signal SHRR of H level and the gate of bit line shared circuit 81 is closed by signal SHRL of L level, sense amplifier 83 receives read data from a memory cell arranged at bit line shared circuit 85 side, from one of bit line pairs BL <0> and /BL <0> to BL <n> and /BL <n> and transfers write data from GIO line gate circuit 84 to one of bit line pairs BL <0> and /BL <0> to BL <n> and /BL <n>.

The gates of n GIO line gate circuits 84 included respective sense amplifier circuit 4311 to 431n are selectively opened by column select signal VACSL <0:n>. When the gate of GIO line gate circuit 84 included in sense amplifier circuit 4311 is opened, column select signal VACSL <0> composed of power supply voltage VccP and column select signal VACSL <1:n> at ground voltage are inputted to input/output control circuit 431. This is also applied to cases where the gate of GIO line gate circuit 84 included in other sense amplifier circuits is opened.

Input/output control circuits 432 to 438 are of the same configuration as is input/output control circuit 431.

Figure 4:
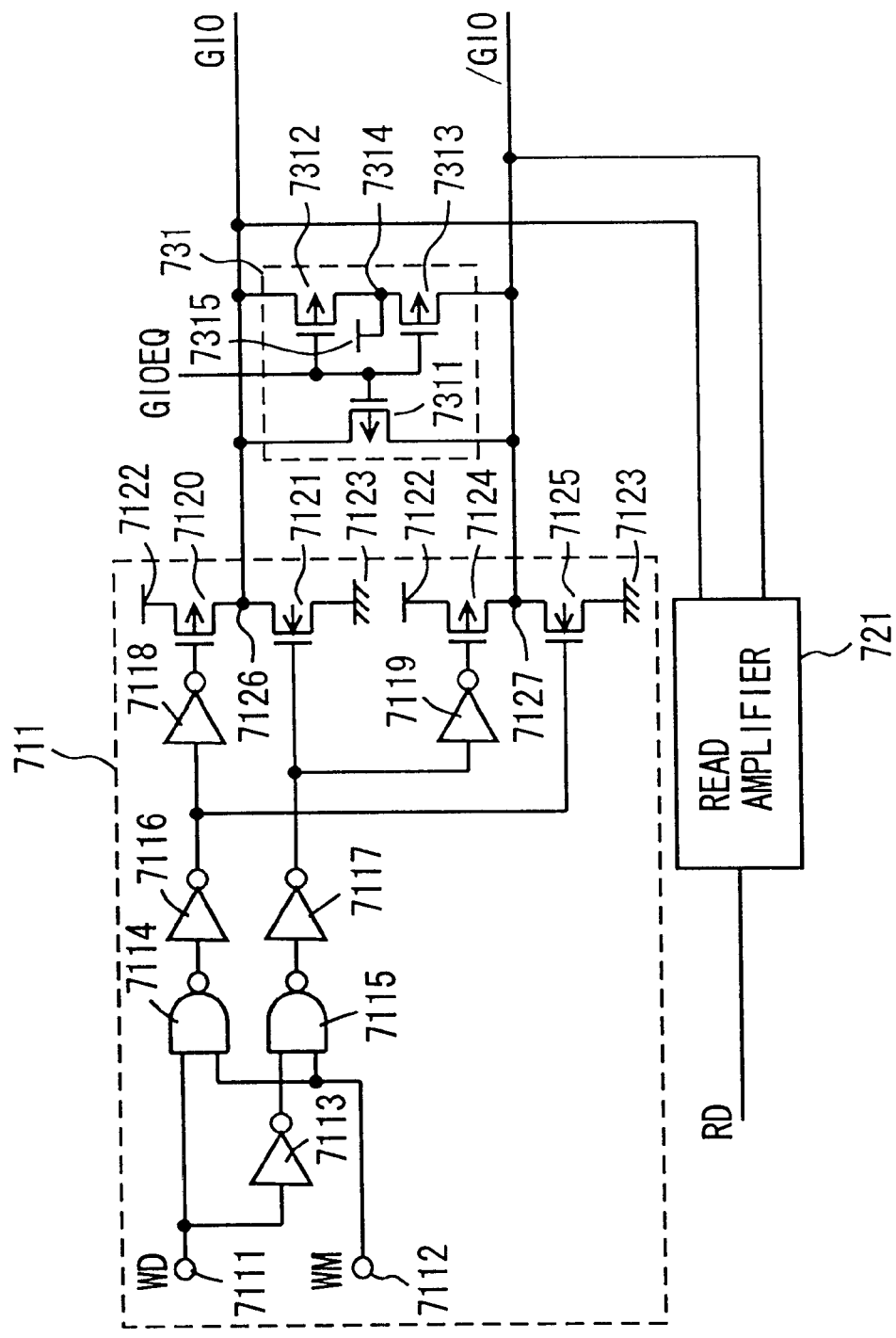
FIG. 4 is a circuit diagram of a GIO line write driver and a GIO line equalize circuit shown in FIG. 3.

Referring to FIG. 4, detailed description will be given of GIO line write driver 711 and a GIO line equalize circuit 731. GIO line write driver 711 is constructed of: inverters 7113 and 7116 to 7119; NAND gates 7114 and 7115; P channel MOS transistors 7120 and 7124; and N channel MOS transistors 7121 and 7125. Inverter 7113 inverts a signal inputted at a terminal 7111 to output the inverted signal to one terminal of NAND gate 7115. NAND gate 7114 receives signals inputted at terminals 7111 and 7112 to output a signal obtained by inverting a logical product of the two signals received. NAND gate 7115 receives an output signal of inverter 7113 and a signal inputted at terminal 7112 to output a signal obtained by inverting a logical product of the two signal received. Inverter 7116 inverts an output signal of NAND gate 7114. Inverter 7117 inverts an output signal of NAND gate 7115. Inverter 7118 inverts an output signal of inverter 7116. Inverter 7119 inverts an output signal of inverter 7117.

P channel MOS transistor 7120 and N channel MOS transistor 7121 are connected in series between a power supply node 7122 and a ground node 7123. P channel MOS transistor 7120 receives an output signal of inverter 7118 at the gate terminal thereof. N channel MOS transistor 7121 receives an output signal of inverter 7117 at the gate terminal thereof P channel MOS transistor 7124 and N channel MOS transistor 7125 are connected in series between power supply node 7122 and ground node 7123. P channel MOS transistor 7124 receives an output signal of inverter 7119 at the gate terminal thereof. N channel MOS transistor 7125 receives an output signal of inverter 7116 at the gate terminal thereof.

Global data line GIO is connected to a node 7126 between P channel MOS transistor 7120 and N channel MOS transistor 7121. Global data line /GIO is connected to a node 7127 between P channel MOS transistor 7124 and N channel MOS transistor 7125. Power supply voltage Vcc lower than power supply voltage VccA is supplied onto power supply node 7122 and ground voltage (0 V) is supplied onto ground node 7123.

When data is written, signal WM of H level is inputted at terminal 7112 and signal WD of H level or L level is inputted at terminal 7111 in response to data [1] or [0]. When data [1] is written, signal WD of H level is inputted at terminal 7111 and signal WM of H level is inputted at terminal 7112. Then, inverter 7113 outputs a signal of L level, NAND gate 7115 outputs a signal of H level and inverter 7117 outputs a signal of L level. With the signal of L level from inverter 7117 inputted, inverter 7119 outputs a signal of H level.

On the other hand, NAND gate 7114 outputs a signal of L level and inverter 7116 outputs a signal of H level. Receiving the signal of H level from inverter 7116, inverter 7118 outputs a signal of L level.

In such a situation, P channel MOS transistor 7120 and N channel MOS transistor 7125 are turned on, while N channel MOS transistor 7121 and P channel MOS transistor 7124 are turned off. Then, GIO line write driver 711 supplies power supply voltage Vcc onto global data line GIO and ground voltage onto global data line /GIO.

When data [0] is written, signal WD of L level is inputted at terminal 7111 and signal WM of H level is inputted at terminal 7112. Then, inverter 7113 outputs a signal of H level, NAND gate 7115 outputs a signal of L level and inverter 7117 outputs a signal of H level. With the signal of H level from inverter 7117 inputted, inverter 7119 outputs a signal of L level.

On the other hand, NAND gate 7114 outputs a signal of H level and inverter 7116 outputs a signal of L level. With the signal of L level from inverter 7116 inputted, inverter 7118 outputs a signal of H level.

In such a situation, N channel MOS transistor 7121 and P channel MOS transistor 7124 are turned on, while P channel MOS transistor 7120 and N channel MOS transistor 7125 are turned off. GIO line write driver 711 supplies ground voltage onto global data line GIO and power supply voltage Vcc onto global data line /GIO.

Note that when signal WM of L level is inputted at terminal 7112, NAND gates 7114 and 7115 output signals of H level and inverters 7116 and 7117 output signals of L level, regardless of a logic level of a signal inputted at terminal 7111. With the signals of L level from inverters 7116 and 7117 inputted, inverters 7118 and 7119 output signals of H level. In such a situation, P channel MOS transistors 7120 and 7124 and N channel MOS transistors 7121 and 7125 are turned off, and global data line pair GIO and /GIO enter a floating state, whereby no data write is performed.

In such a manner, GIO line write driver 711 supplies voltages (Vcc and 0) or (0 and Vcc) onto global data line pair GIO and /GIO in response to data inputted at terminal 7111.

Read amplifier 721 receives data read out from a memory cell through global data line pair GIO and /GIO to amplify the received data and output the read data to an input/output terminal.

GIO line equalize circuit 731 is constructed of: P channel MOS transistors 7311 to 7313. P channelMOS transistor 7311 is connected between global data line GIO and global data line /GIO. P channel MOS transistors 7312 and 7313 are connected in series between global data line GIO and global data line /GIO. Power supply voltage Vcc is supplied onto a node 7314 from a power supply node 7315. P channel MOS transistors 7311 to 7313 receive GIO line equalize signal GIOEQ at the gate terminals thereof.

When GIO line equalize signal GIOEQ of L level is inputted to GIO line equalize circuit 731, P channel MOS transistors 7311 to 7313 are turned on and GIO line equalize circuit 731 supplies power supply voltage Vcc to both of global data line pair GIO and /GIO through node 7314. At this time, since P channel MOS transistor 7311 is in on state, potentials on global data lines GIO and /GIO becomes equal to each other, thus global data line pair GIO and /GIO is equalized.

Figure 5:
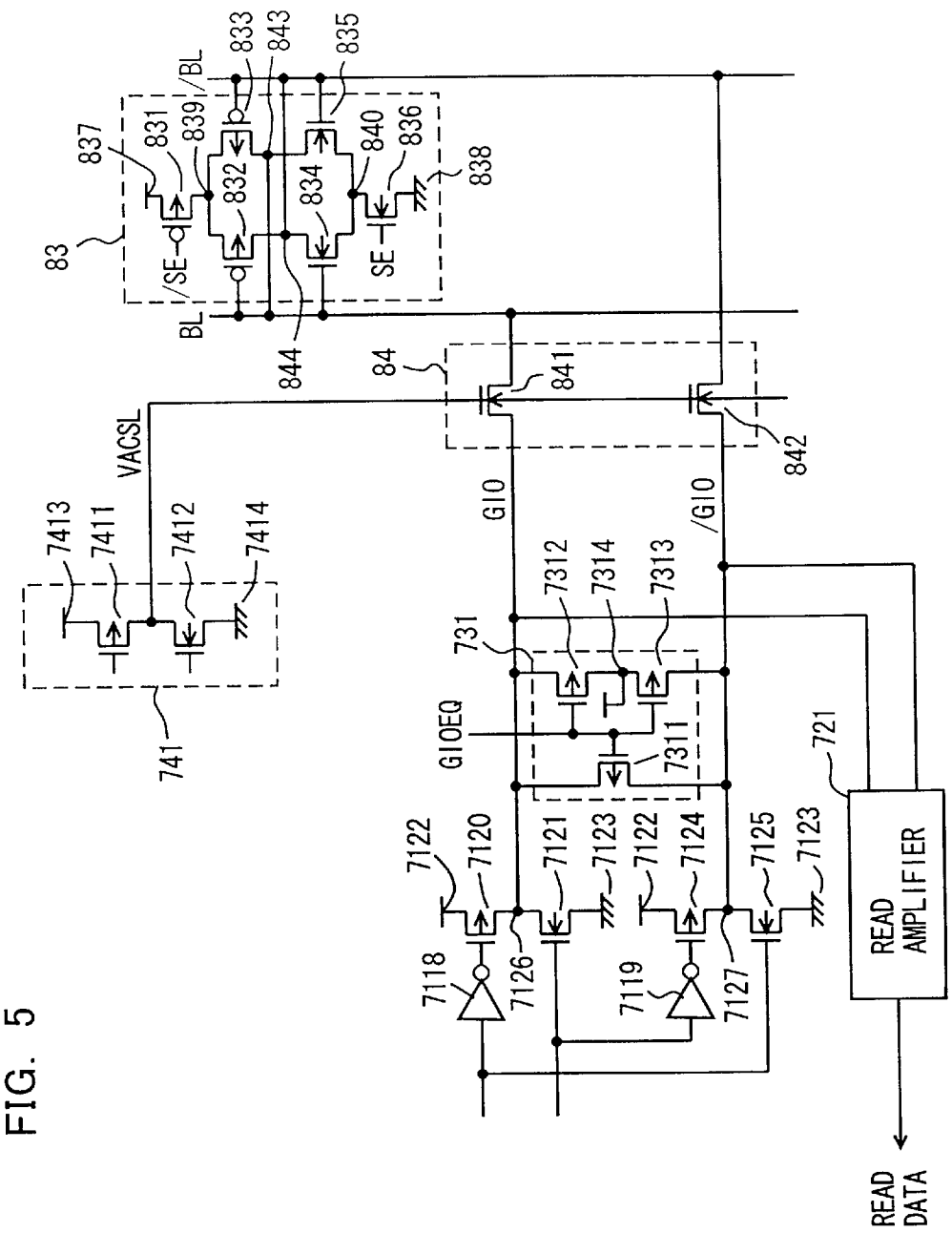
FIG. 5 is a circuit diagram of a GIO line write driver, a GIO line equalize circuit, a bit line driver, a gate circuit and a sense amplifier.

Referring to FIG. 5, a bit line driver 741 includes a P channel MOS transistor 7411 and an N channel MOS transistor 7412. P channel MOS transistor 7411 and N channel MOS transistor 7412 are connected in series between a power supply node 7413 and a ground node 7414. Power supply node 7413 is supplied with power supply voltage VccP from VccP generation circuit 10. Bit line driver 741 is included in column decoder 511 and inputted with a signal of H level or L level according a decoded column address.

When bit line pair BL and /BL corresponding to bit line driver 741 is selected, P channel MOS transistor 7411 and N channel MOS transistor 7412 receive a signal of L level at the gate terminals thereof. As a result, P channel MOS transistor 7411 is turned on, while N channel MOS transistor 7412 is turned off, and bit line driver 741 outputs column select signal VACSL composed of power supply voltage VccP to GIO line gate circuit 84.

When bit line pair BL and /BL corresponding to bit line driver 741 is not selected, P channel MOS transistor 7411 and N channel MOS transistor 7412 receive a signal of H level at the gate terminals thereof As a result, P channel MOS transistor 7411 is turned off, while N channel MOS transistor is turned on, and bit line driver 741 outputs column select signal VACSL composed of ground voltage to GIO line gate circuit 84.

GIO gate circuit 84 is constructed of N channel MOS transistors 841 and 842. N channel MOS transistor 841 is connected to bit line BL at the drain terminal thereof and to global data line GIO at the source terminal thereof, and receives column select signal VACSL at the gate terminal thereof. N channel MOS transistor 842 is connected to bit line /BL at the drain terminal thereof and to global data line /GIO at the source terminal thereof, and receives column select signal VACSL at the gate terminal thereof. Therefore, when receiving column select signal VACSL composed of power supply voltage VccP at the gate terminal thereof, N channel MOS transistor 841 is turned on to connect global data line GIO to bit line BL. When receiving column select signal VACSL composed of power supply voltage VccP at the gate terminal thereof, N channel MOS transistor 842 is turned on to connect global data line /GIO to bit line /BL.

Sense amplifier 83 includes P channel MOS transistors 831 to 833, and N channel MOS transistors 834 to 836. P channel MOS transistor 831 is connected between a power supply node 837 and a node 839 and receives sense amplifier activation signal /SE at the gate terminal thereof. P channel MOS transistor 832 and N channel MOS transistor 834 are connected in series between nodes 839 and 840. P channel MOS transistor 833 and N channel MOS transistor 835 are connected in series between nodes 839 and 840. P channel MOS transistor 832 and N channel MOS transistor 834 in series connection with each other are further connected in parallel to P channel MOS transistor 833 and N channel MOS transistor 835 in series connection with each other. N channel MOS transistor 836 is connected between node 840 and a ground node 838 and receives sense amplifier activation signal SE at the gate terminal thereof.

A node 843 is connected to bit line BL. A node 844 is connected to bit line /BL. P channel MOS transistor 832 and N channel MOS transistor 834 receive a voltage on bit line BL at the gate terminals thereof. P channel MOS transistor 833 and N channel MOS transistor 835 receive a voltage on bit line /BL at the gate terminals thereof. Power supply node 837 is supplied with power supply voltage VccA from VccA generation circuit 30 and ground node 838 is supplied with ground voltage.

When one of word lines W1 to Wn is activated and data [1] is read out from one of memory cells 401 to 40n, a voltage on bit line BL becomes voltage VccA/2+α slightly higher than precharge voltage VccA/2 and a voltage on bit line /BL becomes VccA/2. Then, sense amplification activation signal SE of H level is inputted to sense amplifier 83. With inputting of sense amplification activation signal SE of H level, sense amplifier 83 is activated. Voltage VccA/2+α is transmitted along bit line BL and applied the gate terminals of P channel MOS transistor 832 and N channel MOS transistor 834 of sense amplifier 83. In such a situation, P channel MOS transistor 832 is tuned off, while N channel MOSA transistor 834 is turned off to cause a voltage on node 844 to be ground voltage (0 V). Thus, a voltage on bit line /BL becomes 0 V.

Since a voltage on bit line /BL is applied onto the gate terminals of P channel MOS transistor 833 and N channel MOS transistor 835, P channel MOS transistor 833 is turned on, while N channel MOS transistor 835 is turned off to cause a voltage on node 843 to be power supply voltage VccA. Thus, a voltage on bit line BL becomes power supply voltage VccA. In such an operation, voltages on bit line pair BL and /BL showing data [1] read out from one of memory cells 401 to 40n are amplified from (VccA/2+α and VccA/2) to (VccA and 0).

When data [0] is read out from one of memory cells 401 to 40n, a voltage on bit line BL becomes a voltage VccA/2−α slightly lower than precharge voltage VccA/2 and a voltage on bit line /BL becomes precharge voltage VccA/2. Voltage VccA/2 is transmitted along bit line /BL and applied to the gate terminals of P channel MOS transistor 833 and N channel MOS transistor 835. In such a situation, P channel MOS transistor 833 is turned off, while N channel MOS transistor 835 is turned on, and a voltage on node 843 becomes ground voltage (0). With ground voltage (0 V) on node 843, a voltage on bit line BL becomes 0 V.

Since a voltage on bit line BL is applied to the gate terminals of P channel MOS transistor 832 and N channel MOS transistor 834, P channel MOS transistor 832 is turned on, while N channel MOS transistor 834 is turned off to cause a voltage on node 844 to be power supply voltage VccA. Thus, a voltage on bit line /BL becomes power supply voltage VccA. In such an operation, voltages on bit line pair BL and /BL showing data [0] read out from one of memory cells 401 to 40n are amplified from (VccA/2−α and VccA/2) to (0 and VccA).

When data is written onto one of memory cells 401 to 40n, sense amplifier 83 transfers voltages transmitted from global data line pair GIO and /GIO as (VccA and 0) or (0 and VccA) onto bit line pair BL and /BL.

Therefore, sense amplifier 83 amplifies data read out from one of memory cells 401 to 40n in a cross-coupled latch, and transfers data written externally through a cross-coupled latch to bit line pair BL and /BL.

Figure 6:
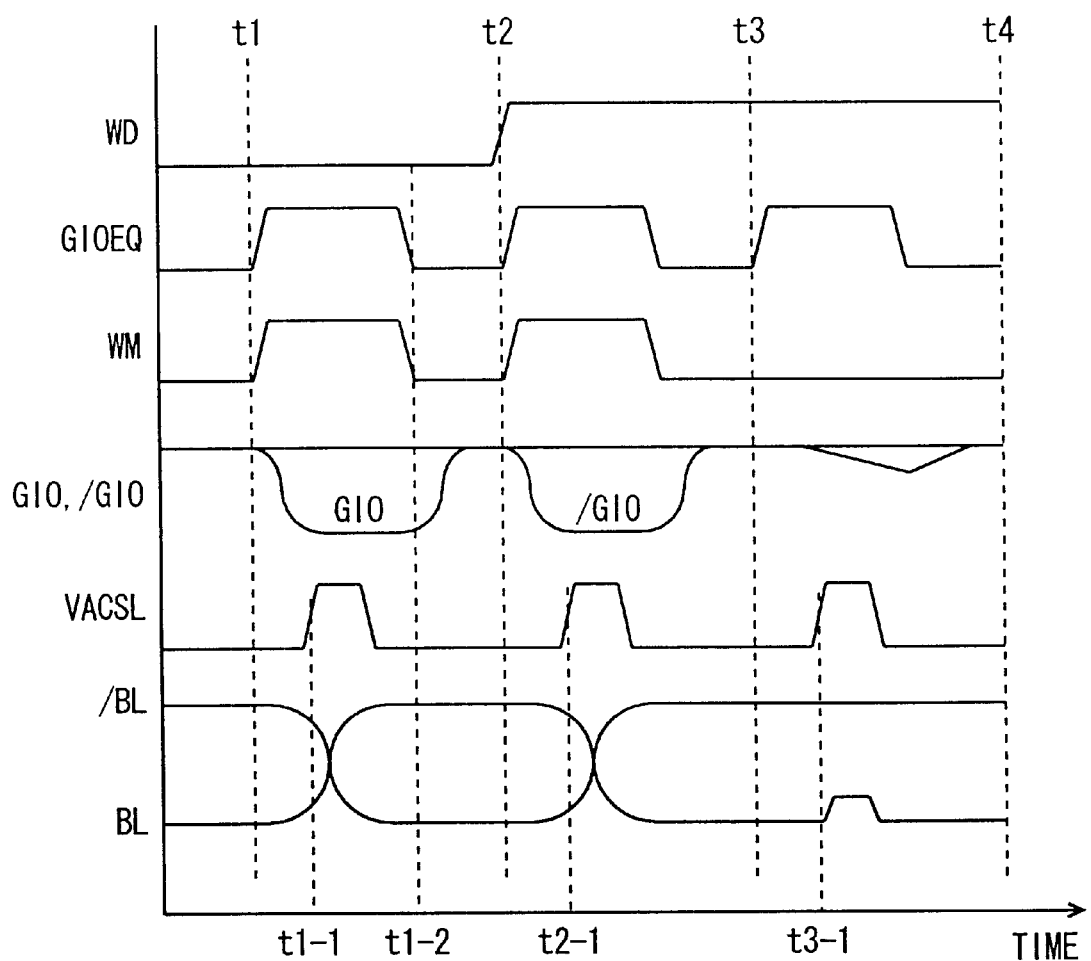
FIG. 6 is a timing chart for describing operation of inputting or outputting data to or from a memory cell.

Referring to FIG. 6, description will be given of inputting or outputting data to or from one of memory cells 401 to 40n. Taken up, first of all, is a data write operation onto one of memory cells 401 to 40n. In this case, at a timing t1, GIO equalize signal GIOEQ is transitioned from L level to H level and GIO line equalize circuit 731 has finished equalization of global data line pair GIO and /GIO. When, at timing t1, signal WM of H level is inputted at terminal 7112 and signal WD of L level is inputted at terminal 7111, GIO line write driver 711 outputs a signal of L level composed of ground voltage onto global data line GIO and a signal of H level composed of power supply voltage Vcc onto global data line /GIO. Hence, global data line GIO transitions from H level to L level. Thereafter, when, at a timing t1-1, bit line driver 741 outputs column select signal VACSL of H level composed of power supply voltage VccP onto GIO line gate circuit 84, N channel MOS transistors 841 and 842 of GIO line gate circuit 84 are turned on, and ground voltage on global data line GIO is transmitted onto bit line BL through N channel MOS transistor 841, while power supply voltage Vcc on global data line /GIO is transmitted onto bit line /BL through N channel MOS transistor 842. Then, voltages on bit line pair BL and /BL are inverted by sense amplifier 83 and written onto one of memory cells 401 to 40n.

When at timing t1-2, GIO line equalize signal GIOEQ and signal WM become L level, GIO line equalize circuit 731 equalizes global data line pair GIO and /GIO to precharge global data line pair GIO and /GIO to power supply voltage Vcc.

Thereafter, at a timing t2, GIO line equalize signal GIOEQ becomes H level to finish equalization of global data line pair GIO and /GIO, and signal WD of H level and signal WM of H level are inputted at respective terminals 7111 and 7112. Then, GIO line write driver 711 outputs a signal of H level composed of power supply voltage Vcc onto global data line GIO and a signal of L level composed of ground level onto global data line /GIO. Therefore, global data line /GIO transitions from H level to L level. Thereafter, when, at a timing t2-1, bit line driver 741 outputs column select signal VACSL of H level composed of power supply voltage VccP to GIO line gate circuit 84, N channel MOS transistors 841 and 842 of GIO line gate circuit 84 are turned on to transmit power supply voltage Vcc on global data line GIO onto bit line BL through N channel MOS transistor 841 and transmit ground voltage on global data line /GIO onto bit line /BL through N channel MOS transistor 842. Then, voltages on bit line pair BL ad /BL are inverted in sense amplifier 83 to be written onto one of memory cells 401 to 40n.

Next, description will be given of a data read operation from one of memory cells 401 to 40n. At a timing t3, GIO line equalize signal GIOEQ becomes H level and GIO line equalize circuit 731 finishes equalization of global data line pair BL and /BL. Then, data is read out from one of memory cells 401 to 40n and sense amplifier 83 amplifies voltages on bit line pair BL and /BL to (VccA and 0) or (0 and VccA). Thereafter, at a timing t3-1, bit line driver 741 outputs column select signal VACSL of H level composed of power supply voltage VccP to GIO line gate circuit 84 to turn on N channel MOS transistors 841 and 842. Then, voltages (VccA and 0) or (0 and VccA) on bit line pair BL and /BL are transmitted onto global data line pair GIO and /GIO through N channel MOS transistors 841 and 842. Accordingly, one of global data line pair GIO and /GIO decreases to L level. When a voltage on bit line BL is low, a voltage on global data line GIO decreases to L level, and when a voltage on bit line /BL is low, a voltage on global data line /GLO decreases to L level.

Read amplifier 721 receives a difference in voltage amplitude between global data line pair GIO and /GIO and amplifies the difference in amplitude received to output read data to an input/output terminal.

Inputting and outputting data to and from a memory cell are performed in semiconductor memory device 100 as described above. In the present invention, VccP generation circuit 10 generates power supply voltage VccP satisfying the following condition. If threshold voltages of N channel MOS transistors 841 and 842 of GIO line gate circuit 84 are Vth by definition, VccP generation circuit 10 generates power supply voltage VccP satisfying the condition:

$$VccP = Vcc + Vth \qquad (1)$$

or $$VccP < Vcc + Vth \qquad (2).$$

When bit line driver 741 receives power supply voltage VccP from VccP generation circuit 10 at power supply node 7413 and a signal at low level is inputted, bit line driver 741 outputs column select signal VACSL composed of power supply voltage VccP to GIO line gate circuit 84. When data is read out from a memory cell and if a voltage on bit line BL is set to power supply voltage VccA by sense amplifier 83, power supply voltage VccA is applied to the drain terminal of N channel MOS transistor 84, power supply voltage Vcc is applied to the source terminal thereof and furthermore, power supply voltage VccP is applied to the gate terminal thereof.

In this case, since power supply voltage VccP and power supply voltage Vcc satisfy the equations (1) or (2), a voltage substantially equal to or lower than a threshold voltage Vth of N channel MOS transistor 841 is applied to the gate terminal thereof. Hence, even if power supply voltage VccA is higher than power supply voltage Vcc, very small current flows from bit line BL to global data line GIO; therefore, very small leakage current also flows into a substrate of P channel MOS transistor 7120 of GIO line write driver 711 or a substrate of P channel MOS transistors 7311 and 7312 of GIO line equalize circuit 731.

When a voltage on bit line /BL becomes power supply voltage VccA, too, a voltage substantially equal to or lower than a threshold voltage of N channel MOS transistor 842 is applied onto the gate terminal thereof; therefore, very small leakage current flows into a substrate of P channel MOS transistor 7124 of GIO line write driver 711 or into a substrate of P channel MOS transistors 7311 and 7313 of GIO line equalize circuit 731 from bit line /BL through global data line /GIO.

Furthermore, in the present invention, since current does not flow into the substrate of P channel MOS transistors 7120 and 7124 of GIO line write driver 711 or into the substrate of P channel MOS transistors 7311 to 7313 of GIO line equalize circuit 731 unless a bias exceeds a built-in potential Vb of a PN junction, VccP generation circuit 10 in the present invention generates power supply voltage VccP satisfying the following condition:

$$VccP = Vcc + Vth + Vb \qquad (3)$$

or $$VccP < Vcc + Vth + Vb \qquad (4).$$

In a case where power supply voltage VccP satisfies the equations (3) or (4), a bias exceeding built-in potential Vb is not applied across the PN junction of each of P channel MOS transistors 7120 and 7124 of GIO line write driver 711, and P channel MOS transistors 7311 to 7313 of GIO line equalize circuit 731; therefore, no leakage current flows into the substrate of P channel MOS transistors 7120 and 7124 of GIO line write driver 711 and into a substrate of P channel MOS transistors 7311 to 7313 of GIO line equalize circuit 731.

As described above, controlling of a gate voltage applied onto the gate terminals of N channel MOS transistors 841 and 842 of GIO line gate circuit 84 so as to be substantially equal to or lower than a threshold voltage Vth or Vth+Vb is equivalent to controlling a current flowing between the source terminal and drain terminal of each of N channel MOS transistors 841 and 842 to be equal to or lower than a predetermined value.

In such a way, in the present invention, since voltage VccP applied onto the gate terminals of N channel MOS transistors of a GIO line gate circuit is controlled such that VccP≦Vcc+Vth or VccP≦Vcc+Vth+Vb, a leakage current to P channel MOS transistors of a GIO line write driver or a GIO line equalize circuit can be restricted low even when power supply voltage supplied to the GIO line write driver or the GIO line equalize circuit is lower than a power supply voltage supplied to a sense amplifier.

Figure 7:
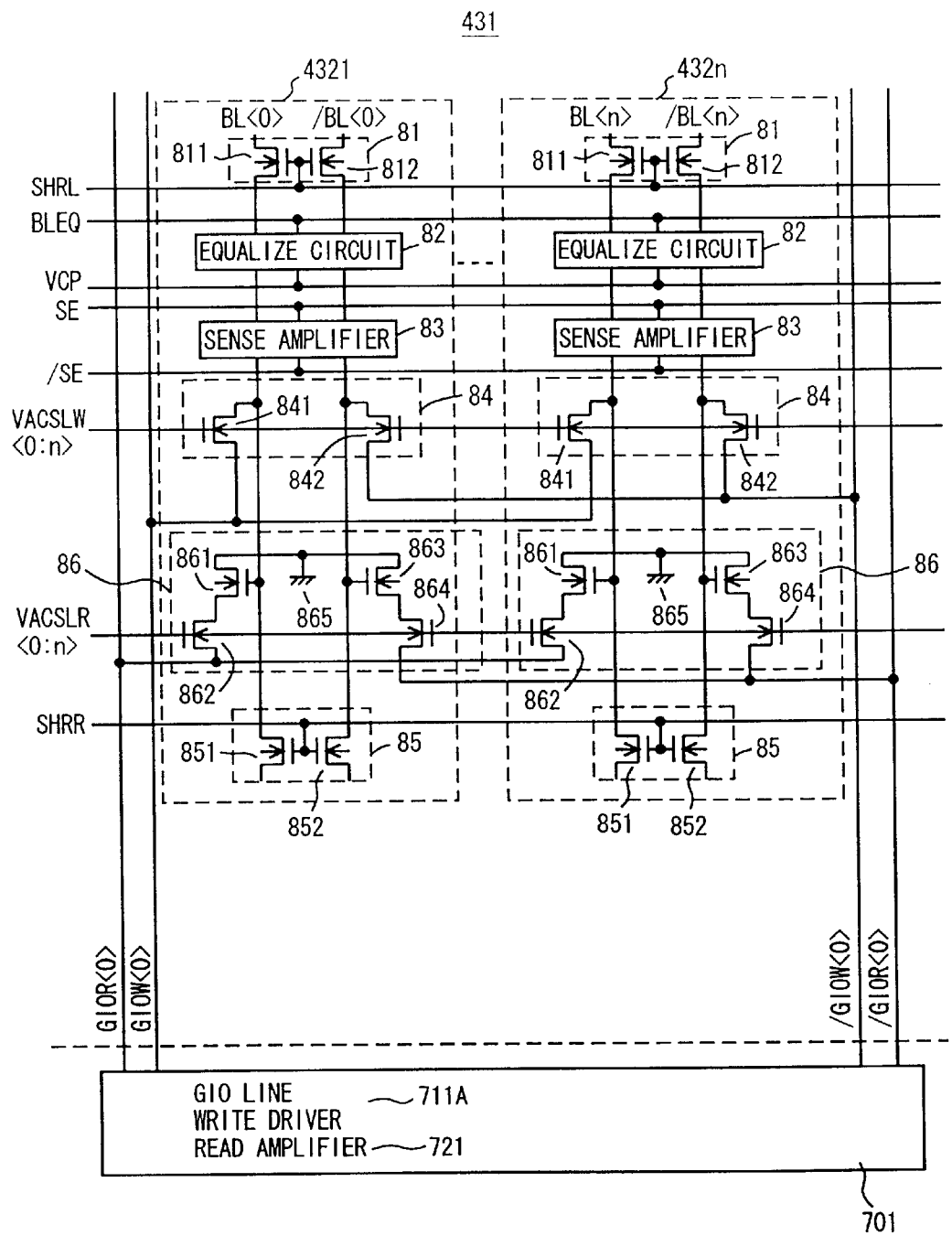
FIG. 7 is a block diagram and circuit diagram of an input/output control circuit in a case where a read-only global data line pair and a write-only global data line pair are used.

Referring to FIG. 7, input/output control circuit 431 of semiconductor memory device 100 may include sense amplifier circuit 4321 to 432n. Each of sense amplifier circuits 4321 to 432n is of a configuration in which a GIO line gate circuit 86 is added to each of the respective sense amplifier circuits 4311 to 431n shown FIG. 3 and the other points are the same as corresponding points in FIG. 7. In this case, GIO line gate circuit 84 is connected to write-only global data line pair GIOW <0> and /GIOW <0>. Hence, column select signal VACSL <0:n > is received by N channel MOS transistors 841 and 842 of GIO line gate circuit 84 at the gate terminal thereof.

GIO line gate circuit 86 includes N channel MOS transistors 861 to 864. N channel MOS transistor 862 is connected to read-only global data line GIOR <0> at the source terminal and further to the drain terminal of N channel MOS transistor 861 at the drain terminal thereof. N channel MOS transistor 861 is connected to a ground node 865 at the source terminal thereof and receives a voltage on one of bit lines BL <0> to BL <n> at the gate terminal thereof. N channel MOS transistor 863 is connected to ground node 865 at the source terminal thereof and receives a voltage on one of bit lines /BL <0> to /BL <n> at the gate terminal thereof N channel MOS transistor 864 is connected to read-only global data line /GLOR <0> at the source terminal thereof and further to the drain terminal of N channel MOS transistor 863 at the drain terminal thereof. N channel MOS transistors 862 and 864 receives column select signals VACSLR <0:n> at the gate terminals thereof.

In a case where input/output control circuit 431 includes sense amplifier circuits 4321 to 432n, command decoder circuit 63 shown in FIG. 1 outputs a signal CSLW to column decoder 51 when a write command is inputted, while outputting a signal CSLR to column decoder 51 when a read command is inputted. Column decoder 51 outputs column select signal VACSLW <0:n> to GIO line gate circuit 84 based on signal CSLW, while outputting column select signal VACSLR <0:n> to GIO line gate circuit 86 based on signal CSLR.

In this case, an input/output circuit 701 provided corresponding to sense amplifier circuit 431 includes GIO line write driver 711A instead of GIO line write driver 711.

Figure 8:
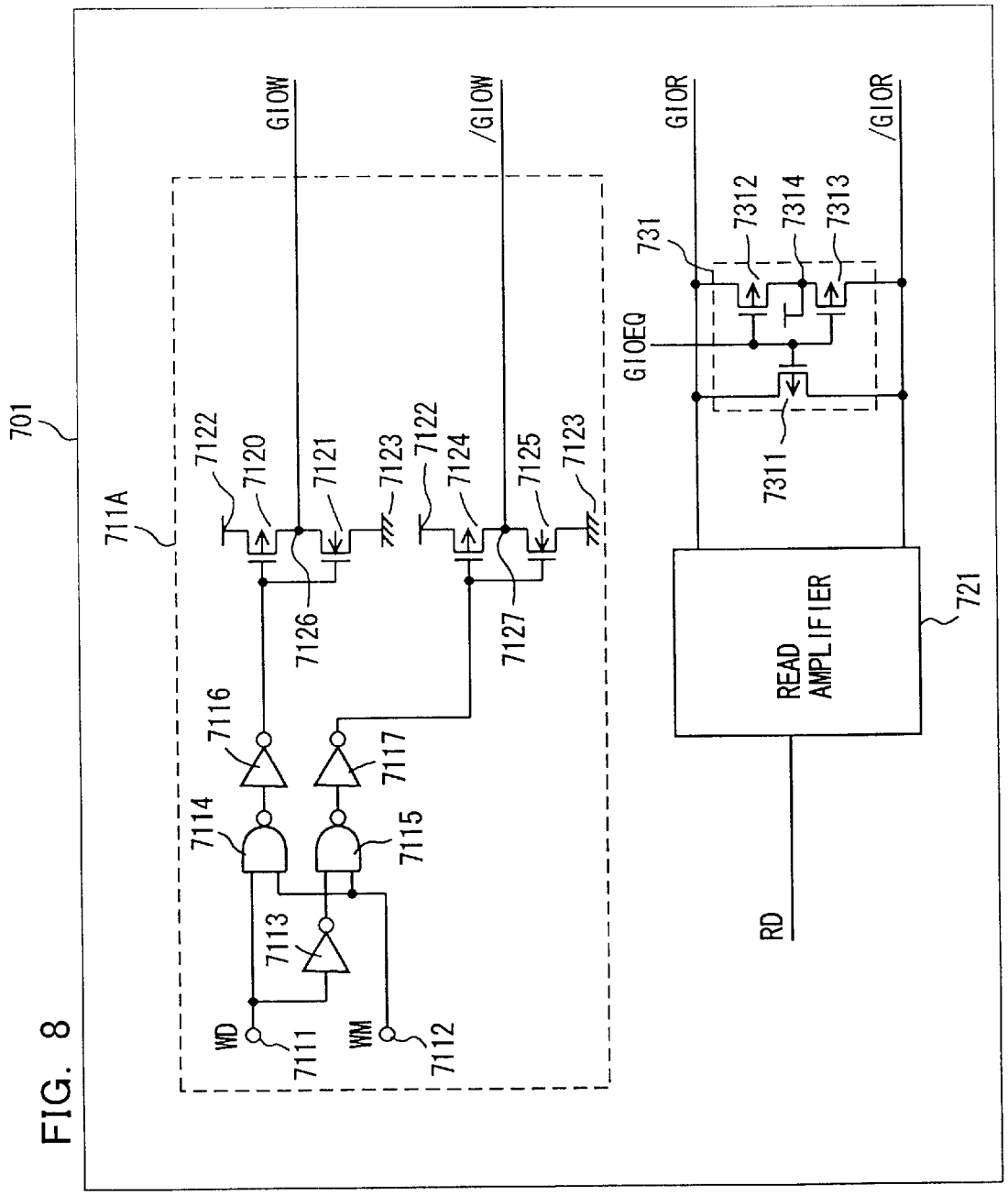
FIG. 8 is a circuit diagram of a GIO line write driver and a GIO line equalize circuit shown in FIG. 7.

Referring to FIG. 8, GIO line write driver 711A has a configuration obtained by deleting inverters 7118 and 7119 from GIO line write driver 711 shown in FIG. 4. In this case, P channel MOS transistor 7120 and N channel MOS transistor 7121 receives an output signal from inverter 7116 at the gate terminals thereof. Furthermore, P channel MOS transistor 7124 and N channel MOS transistor 7125 receive an output signal from inverter 7117 at the gate terminals thereof.

When data is written onto a memory cell in GIO line write driver 711A, too, signal WM of H level is inputted at a terminal 7112. When a signal of H level corresponding to data [1] is inputted at terminal 7111, inverter 7113 outputs a signal of L level, NAND gate 7115 outputs a signal of H level and inverter 7117 outputs a signal of L level to the gate terminals of P channel MOS transistor 7124 and N channel MOS transistor 7125. On the other hand, NAND gate 7114 outputs a signal of L level and inverter 7116 outputs a signal of H level to the gate terminals of P channel MOS transistor 7120 and N channel MOS transistor 7121.

In such a situation, P channel MOS transistor 7120 and N channel MOS transistor 7125 are turned off, while N channel MOS transistor 7121 and P channel MOS transistor 7124 are turned on, and GIO line write driver 711A outputs ground voltage onto global data line GIOW and power supply voltage Vcc onto global data line /GIOW.

On the other hand, when a signal of L level corresponding to data [0] is inputted at terminal 7111, inverter 7113 outputs a signal of H level, NAND gate 7115 outputs a signal of L level and inverter 7117 outputs a signal of H level to the gate terminals of P channel MOS transistor 7124 and N channel MOS transistor 7125. NAND gate 7114 outputs a signal of H level and inverter 7116 outputs a signal of L level to the gate terminals of P channel MOS transistor 7120 and N channel MOS transistor 7121.

In such a situation, P channel MOS transistor 7120 and N channel MOS transistor 7125 are turned on, while N channel MOS transistor 7121 and P channel MOS transistor 7124 are turned off, and GIO line write driver 711A outputs power supply voltage Vcc onto global data line GIOW and ground voltage onto global data line /GIOW.

That is, GIO line write driver 711A outputs a voltage opposite to that of GIO line write driver 711 for an input of data [1] or data [0] onto global data line pair GIOW and /GIOW.

In GIO line write driver 711A, as well, when no data is written onto a memory cell, signal WM of L level is inputted at terminal 7112. With signal WM of L level inputted, P channel MOS transistors 7120 and 7124 are turned on, while N channel MOS transistors 7121 and 7124 are turned off. Hence, GIO line write driver 711A outputs power supply voltage Vcc onto global data line pair GIOW and /GIOW to put global data line pair GIOW and /GIOW into an equalized state; therefore no data write is performed onto a memory cell.

Figure 9:
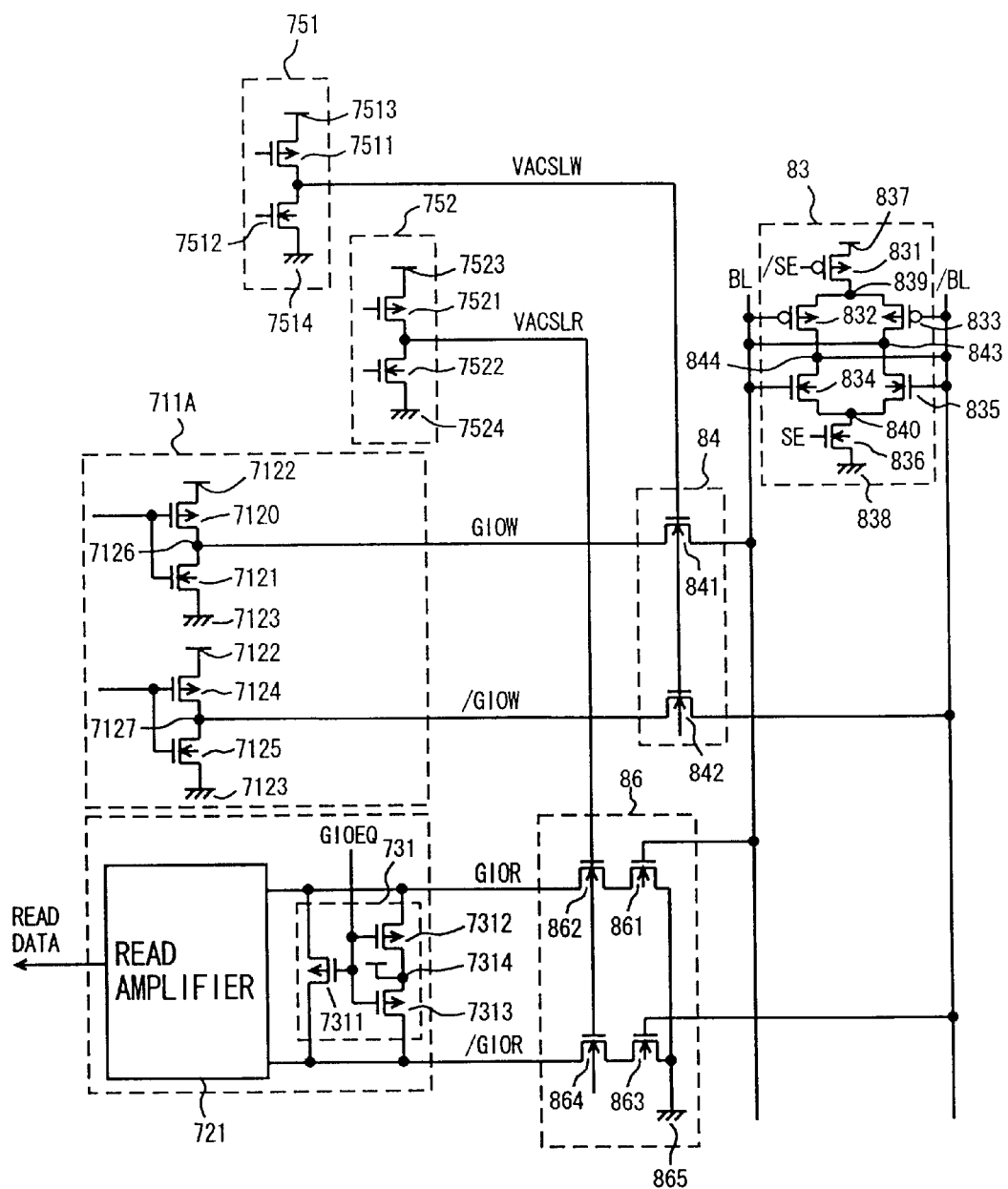
FIG. 9 is a circuit diagram of a GIO line write driver, a GIO line equalize circuit, a bit line driver, a gate circuit and a sense amplifier in a case where a read-only global data line pair and a write-only global data line pair are used.
Figure 10:
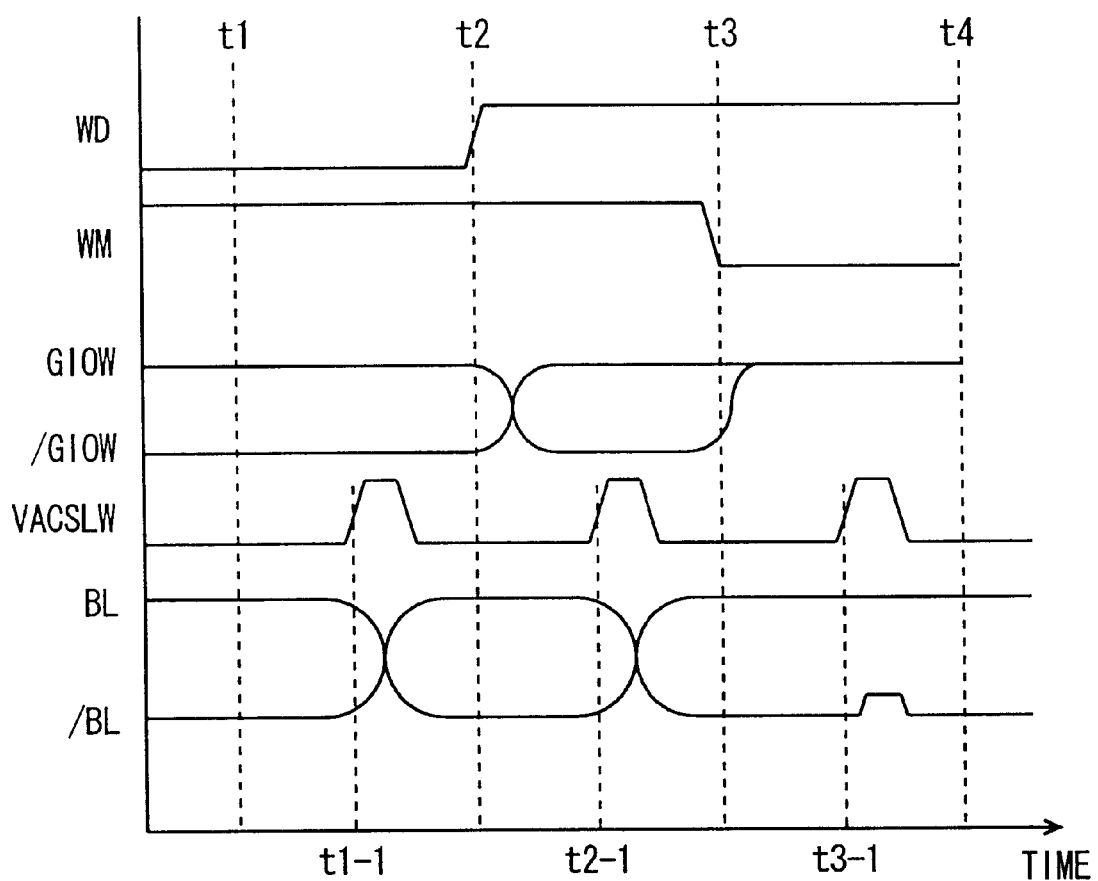
FIG. 10 is a timing chart for describing operation for inputting or outputting data to or from a memory cell in a case where a read-only global data line pair and a write-only global data line pair are used.

Referring to FIGS. 9 and 10, detailed description will be given of inputting and outputting of data to and from a memory cell in a semiconductor memory device using read-only global data line pair GIOR and /GIOR, and write-only global data line GIOW and /GIOW. FIG. 9 is a diagram corresponding to FIG. 5 in which description is given of inputting and outputting data to and from a memory cell in a semiconductor memory device using common global data line pair GIO and /GIO.

Referring to FIG. 9, a bit line driver 751 includes a P channel MOS transistor 7511 and an N channel MOS transistor 7512. P channel MOS transistor 7511 and N channel MOS transistor 7512 are connected in series between a power supply node 7513 and a ground node 7514. Power supply node 7513 is supplied with power supply voltage VccP from VccP generation circuit 10. Bit line driver 751 is included in column decoder 511 and inputted with a signal of H level or L level based on signal CSLW from command decoder circuit 63. Bit line driver 751 outputs column select signal VACSLW composed of power supply voltage Vcc or ground voltage to GIO line gate circuit 84.

A bit line driver 752 includes a P channel MOS transistor 7521 and an N channel MOS transistor 7522. P channel MOS transistor 7521 and N channel MOS transistor 7522 are connected in series between a power supply node 7523 and a ground node 7524. Power supply node 7523 is supplied with power supply voltage VccP from VccP generation circuit 10. Bit line driver 752 is included in column decoder 511 and inputted with a signal of H level or L level based on signal CSLR from command decoder circuit 63. Bit line driver 752 outputs column select signal VACSLR composed of power supply voltage Vcc or ground voltage to GIO line gate circuit 86.

In a case where data is written onto a memory cell and when bit line pair BL and /BL corresponding to bit line driver 751 is selected, P channel MOS transistor 7511 and N channel MOS transistor 7512 receive a signal of L level at the gate terminals thereof. As a result, P channel MOS transistor 7511 is turned on, while N channel MOS transistor 7512 is turned off, and bit line driver 751 outputs column select signal VACSLW composed of power supply voltage VccP to GIO line gate circuit 84.

When bit line pair BL and /BL corresponding to bit line driver 751 is not selected, P channel MOS transistor 7511 and N channel MOS transistor 7512 receive a signal of H level at the gate terminals thereof. As a result, P channel MOS transistor 7511 is turned off, while N channel MOS transistor 7512 is turned on, and bit line driver 751 outputs column select signal VACSLW composed of ground voltage to GIO line gate circuit 84.

Configuration and operation of GIO line gate circuit 84 are the same as those of FIG. 5 with the exception that GIO line gate circuit 84 receives column select signal VACSLW instead of column select signal VACSL.

When GIO line gate circuit 86 receives column select signal VACSLR composed of power supply voltage VccP from bit line driver 752, an N channel MOS transistors 862 and 864 are turned on. When read data from a memory cell is amplified in a sense amplifier 83 and is transmitted onto bit line pair BL and /BL as voltages (VccA and 0), an N channel MOS transistor 861 is turned on, while an N channel MOS transistor 863 is turned off. Then, read-only global data line GIOR decreases from power supply voltage Vcc, which is precharge voltage, down to ground voltage, while global data line /GIOR maintains its voltage at power supply voltage Vcc, which is precharge voltage. Therefore, when read data pass through GIO line gate circuit 86, potentials on global data line pair GIOR and /GIOR are inverted from respective potentials on bit line pair BL and /BL.

Description of the other points is the same as that of FIG. 5.

Referring to FIG. 10, description will be given of a data write operation onto one of memory cells 401 to 40n. In this case, it is assumed that GIO line equalize circuit 731 has finished equalization of global data line pair GIO and /GIO.

When, at a timing ti, signal WM of H level is inputted at terminal 7112 and signal WD of L level is inputted at terminal 7111, GIO line driver 711A outputs a signal of H level composed of power supply voltage Vcc onto global data line GIOW and a signal of L level composed of ground voltage onto global data line /GIOW as described above. Therefore, global data line /GIOW transitions from H level to L level. Thereafter, when, at a timing t1-1, bit line driver 751 outputs column select signal VACSLW of H level composed of power supply voltage VccP to GIO line gate circuit 84, N channel MOS transistors 841 and 842 of GIO line gate circuit 84 are turned on, and power supply voltage Vcc on global data line GIOW is transmitted onto bit line BL through N channel MOS transistor 841, while ground voltage on global data line /GIOW is transmitted onto bit line /BL through N channel MOS transistor 842. Voltages on bit line pair BL and /BL are inverted by sense amplifier 83 and written onto one of memory cells 401 to 40n.

Thereafter, at a timing t2, signal WD of H level and signal WM of H level are inputted at respective terminals 7111 and 7112. Then, as described above, GIO line write driver 711A outputs a signal of L level composed of ground voltage onto global data line GIOW, while outputting a signal of H level composed of power supply voltage Vcc onto global data line /GIOW. Hence, global data line GIOW transitions from H level to L level. Thereafter, when, at a timing t2-1, bit line driver 751 outputs column select signal VACSLW of H level composed of power supply voltage VccP to GIO line gate circuit 84, N channel MOS transistors 841 and 842 of GIO line gate circuit 84 are turned on and ground voltage on global data line GIOW is transmitted onto bit line BL through N channel MOS transistor 841, while power supply voltage Vcc on global data line /GIO is transmitted onto bit line /BL through N channel MOS transistor 842. Then, voltages on bit line pair BL and /BL are inverted by sense amplifier 83 and written onto one of memory cells 401 to 40n.

When, at a timing t3, signal WM of L level is inputted at terminal 7112, GIO line write driver 711A, as described above, outputs power supply voltage Vcc onto both of global data line pair GIOW and /GIOW. At a timing t3-1, bit line driver 751 outputs column select signal VACSLW composed of power supply voltage VccP to GIO line gate circuit 84. Then, voltages (Vcc and Vcc) on global data line pair GIOW and /GIOW are transmitted onto bit line pair BL and /BL through N channel MOS transistors 841 and 842. In this situation, no write of data is performed onto a memory cell since voltage Vcc is transmitted onto both of bit line pair BL and /BL.

A data read operation of data from one of memory cells 401 to 40n is the same as the operation in description of FIG. 5 with the exception that, when data passes through GIO line gate circuit 86, potentials on bit line pair BL and /BL are inverted and transmitted onto respective global data line pair GIOR and /GIOR.

When read-only global data line pair GIOR and /GIOR and write-only global data line pair GIOW and /GIOW are used as well, VccP generation circuit 10 generates power supply voltage VccP satisfying one of the equations (1) to (4) described above. Therefore, when read-only global data line pair GIOR and /GIOR and write-only global data line pair GIOW and /GIOW are used, a leakage current to P channel MOS transistors as constituents of GIO line write driver can also be restricted low by reducing power supply voltage supplied to GIO line write driver lower than power supply voltage supplied to a sense amplifier.

According to the first embodiment, a semiconductor memory device controls a voltage applied to the gate terminals of MOS transistors constituting a gate circuit connecting a global data line pair to a bit line pair to a voltage at which a current flowing between the source terminal and drain terminal of each of the MOS transistors is reduced to be equal to or less than a predetermined value; thereby enabling a leakage current flowing into a substrate of the MOS transistors constituting a GIO line write driver to be restricted low.

Second Embodiment

Figure 11:
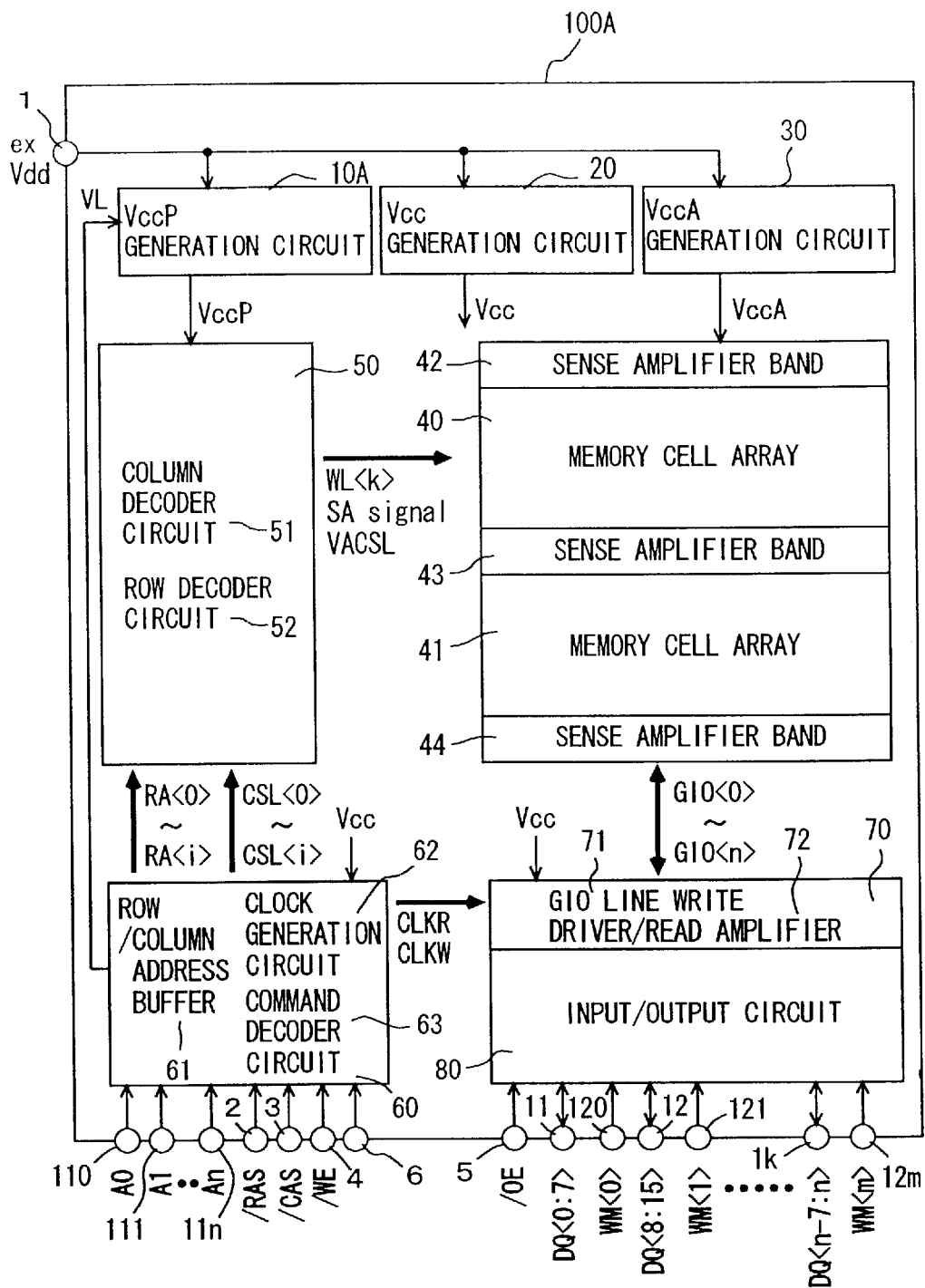
FIG. 11 is a schematic block diagram of a semiconductor memory device according to a second embodiment.

Referring to FIG. 11, a semiconductor memory device 100A according to a second embodiment is of a configuration in which in semiconductor memory device 100 of FIG. 1, VccP generation circuit 10 is replaced with a VccP generation circuit 10A and a terminal 6 is added, and the other configuration is the same as that of semiconductor memory device 100.

When a user uses a semiconductor memory device, a voltage level of power supply voltage Vcc is different according to a user. In a case where a user selects power supply voltage Vcc lower than a power supply voltage imagined by a manufacturer of the semiconductor memory device, a difference in amplitude between power supply voltage Vcc and power supply voltage VccA further increases, thereby increasing a leakage current into a substrate of a MOS transistor. Accordingly, in order to restrict a leakage current into a substrate of a MOS transistor at a low level, a voltage level of power supply voltage VccP is required to be changed according to a voltage level of power supply voltage Vcc.

Semiconductor memory device 100A is a semiconductor memory device containing VccP generation circuit 10A integrated thereon capable of changing a voltage level of power supply voltage VccP according to a voltage level of power supply voltage Vcc selected by a user.

A command signal indicating a voltage level of power supply voltage Vcc selected by a user is inputted at terminal 6. A command decoder circuit 63 decodes the command signal to output a signal VL for generating power supply voltage VccP in response to a voltage level of power supply voltage Vcc to VccP generation circuit 10A. VccP generation circuit 10A generates power supply voltage VccP in response to a voltage level of power supply voltage Vcc based on signal VL inputted.

Figures 12, 13:
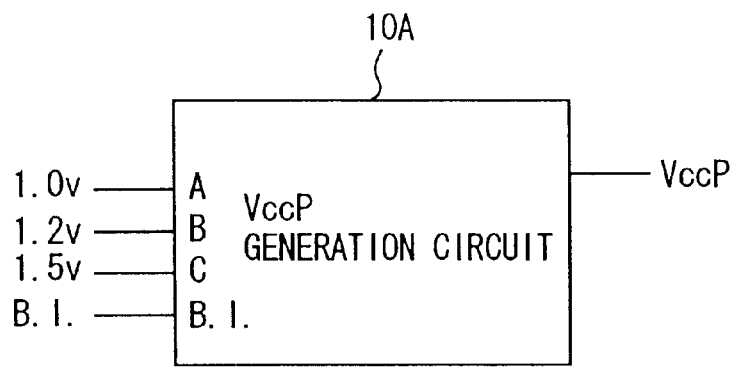
FIG. 12 is an illustration for describing a function of a VccP generation circuit shown in FIG. 11.
FIG. 13 is a table showing a relationship between input signals and output signals in the VccP generation circuit shown in FIG. 12.

Referring to FIG. 12, VccP generation circuit 10A has an A terminal, B terminal, C terminal and B.I. terminal. A terminal is a terminal for selecting 1.0 V as a reference voltage (power supply voltage Vcc selected by the user, this applies in the same way in description hereinafter) when VccP generation circuit 10A generates power supply voltage VccP stepping-down external power supply voltage exVdd. B terminal is a terminal for selecting 1.2 V as a reference voltage when VccP generation circuit 10A generates power supply voltage VccP stepping-down external power supply voltage exVdd. C terminal is a terminal for selecting 1.5 V as a reference voltage when VccP generation circuit 10A generates power supply voltage VccP stepping-down external power supply voltage exVdd. B.I. terminal is a terminal for selecting a B.I. voltage in B.I. as a reference voltage when VccP generation circuit 10A generates power supply voltage VccP stepping-down external power supply voltage exVdd using a B.I.change-over signal since B.I. terminal is inputted with the B.I. change-over signal in B.I. Therefore, signal VL is a signal of 4 bits constituted of [S1, S2, S3 and S4]. Each of components S1 to S4 is at H level or L level. Component S1 corresponds to a reference voltage of 1.0 V, component S2 to a reference voltage of 1.2 V, S3 to a reference voltage of 1.5 V and component S4 to a reference voltage B.I. voltage.

Referring to FIG. 13, when receiving signal VL constituted of [H, L, L and L], VccP generation circuit 10A generates power supply voltage VccP of 1.5 V referring to reference voltage of 1.0 V since a signal of H level is inputted only at A terminal. When receiving signal VL constituted of [L, H, L and L], VccP generation circuit 10A generates power supply voltage VccP of 1.7 V referring to reference voltage of 1.2 V since a signal of H level is inputted only at B terminal. When receiving signal VL constituted of [L, L, H and L], VccP generation circuit 10A generates power supply voltage VccP of 2.0 V referring to reference voltage of 1.5 V since a signal of H level is inputted only at C terminal. When receiving signal VL constituted of [L, L, L and H], VccP generation circuit 10A generates power supply voltage VccP of B.I.+0.5V referring to reference voltage of B.I. voltage since a signal of H level is inputted only at B.I. terminal. That is, VccP generation circuit 10A generates Vcc+Vth.

In such a way, VccP generation circuit 10A generates power supply voltage VccP whose voltage level changes in response to power supply voltage Vcc selected by a user and outputs thus generated power supply voltage VccP to a column decoder 511. Bit line drivers 741 and 751 included in column decoders 511 generate, respectively, column select signals VACSL and VACSLW composed of power supply voltage VccP according to a voltage level of power supply voltage Vcc and output thus generated column select signals VACSL and VACSLW to GIO line gate circuit 84 when corresponding bit line pairs are selected.

In such a configuration, when data is inputted to or outputted from a memory cell, leakage currents can be restricted low that flow into substrates of MOS transistors of GIO line write drivers 711 and 711A or GIO line equalize circuit 731 through GIO line gate circuit 84.

The other points are the same as corresponding points of the first embodiment.

According to the second embodiment, a semiconductor memory device changes a gate voltage of MOS transistors constituting a GIO line gate circuit connecting a global data line pair to a bit line pair in response to a voltage level of a power supply voltage selected by a user, so a leakage current can be restricted low even if a voltage level of the power supply voltage selected by a user varies.

Third Embodiment

Figure 14:
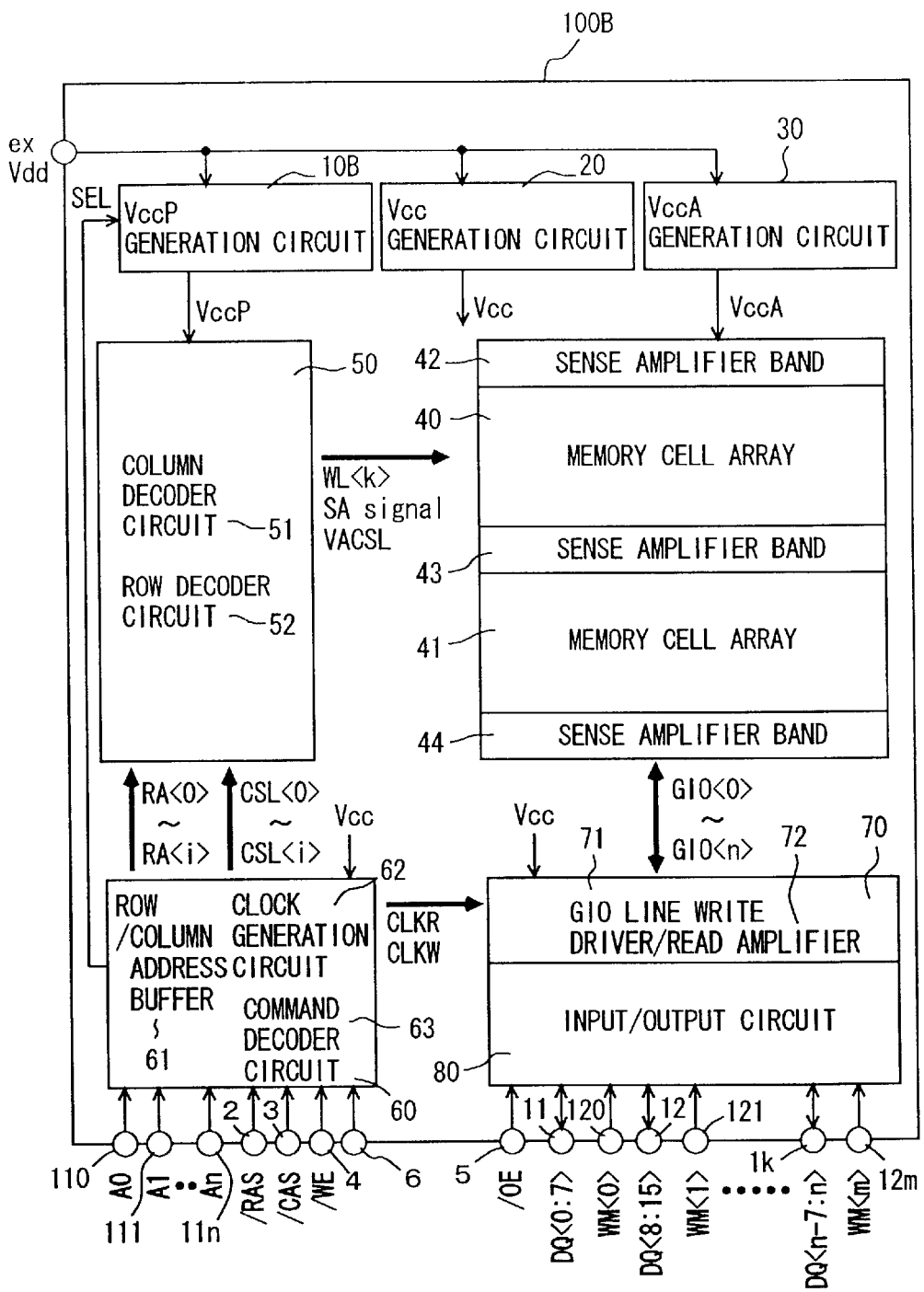
FIG. 14 is a schematic block diagram of a semiconductor memory device according to a third embodiment.

Referring to FIG. 14, a semiconductor memory device 100B according to a third embodiment is of a configuration in which in semiconductor memory device 100A of FIG. 11, VccP generation circuit 10A is replaced with a VccP generation circuit 10B and the other configuration is the same as that of semiconductor memory device 100A.

Semiconductor memory device 100B is a semiconductor memory device containing VccP generation circuit 10B integrated thereon capable of changing a voltage level of power supply voltage VccP in response to a voltage level of power supply voltage Vcc selected by a user.

A command signal indicating a voltage level of power supply voltage Vcc selected by a user is inputted at terminal 6. A command decoder circuit 63 decodes the command signal to output a select signal SEL for selecting a reference voltage when power supply voltage VccP is generated in response to a voltage level of power supply voltage Vcc to Vccp generation circuit 10B. VccP generation circuit 10B selects a reference voltage based on select signal SEL inputted to generate power supply voltage VccP in response to a voltage level of power supply voltage Vcc referring to thus selected reference voltage.

Figure 15:
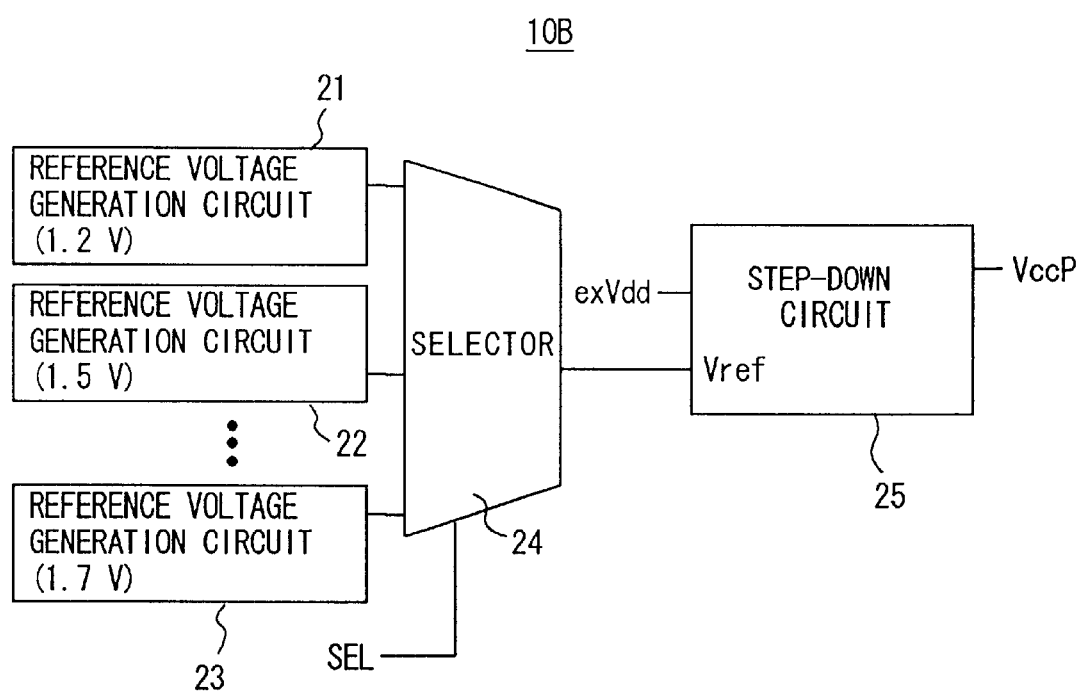
FIG. 15 is a schematic block diagram of a VccP generation circuit shown in FIG. 14.

Referring to FIG. 15, VccP generation circuit 10B includes: reference voltage generation circuits 21 to 23; a selector 24; and a step-down circuit 25. Reference voltage generation circuit 21 generates a reference voltage of 1.2 V. Reference voltage generation circuit 22 generates a reference voltage of 1.5 V. Reference voltage generation circuit 23 generates a reference voltage of 1.7 V. Selector 24 selects one of reference voltages 1.2 V, 1.5 V and 1.7 V based on select signal SEL. Step-down circuit 25 refers to a reference voltage Vref inputted from selector 24 to generate power supply voltage VccP obtained by stepping-down of external power supply voltage exVdd. Selector 24 selects a voltage of 1.2 V from reference voltage generation circuit 21 when a user selects power supply voltage Vcc of 1.2 V. Selector 24 selects a voltage of 1.5 V from reference voltage generation circuit 22 when a user selects power supply voltage Vcc of 1.5 V. Selector 24 selects a voltage of 1.7 V from reference voltage generation circuit 23 when a user selects power supply voltage Vcc of 1.7 V. Step-down circuit 25 generates power supply voltage VccP of 1.7 V when reference voltage Vref of 1.2 V is inputted from selector 24. Step-down circuit 25 generates power supply voltage VccP of 2.0 V when reference voltage Vref of 1.5 V is inputted from selector 24. Step-down circuit 25 generates power supply voltage VccP of 2.2 V when reference voltage Vref of 1.7 V is inputted from selector 24.

In such a way, VccP generation circuit 10B generates power supply voltage VccP whose voltage level varies in response to power supply voltage Vcc selected by a user to output thus generated power supply voltage VccP to column decoder 511. Bit line drivers 741 and 751 included in column decoders 511 generate, respectively, column select signals VACSL and VACSLW composed of power supply voltage VccP in response to a voltage level of power supply voltage Vcc to output thus generated column select signal VACSL and VACSLW to GIO line gate circuit 84 when corresponding bit line pair BL and /BL is selected.

In such a situation, when data is inputted to or outputted from a memory cell, leakage current can be restricted low that flows into substrates of MOS transistors of GIO line write drivers 711 and 711A or GIO line equalize circuit 731.

The other points are the same as corresponding points of the second embodiment.

According to the third embodiment, a semiconductor memory device changes a gate voltage of MOS transistors constituting a GIO line gate circuit connecting a global data line pair to a bit line pair, in response to a voltage level of a power supply voltage selected by a user, so leakage current can also be restricted low if a voltage level of the power supply voltage selected by a user varies.

Fourth Embodiment

Figure 16:
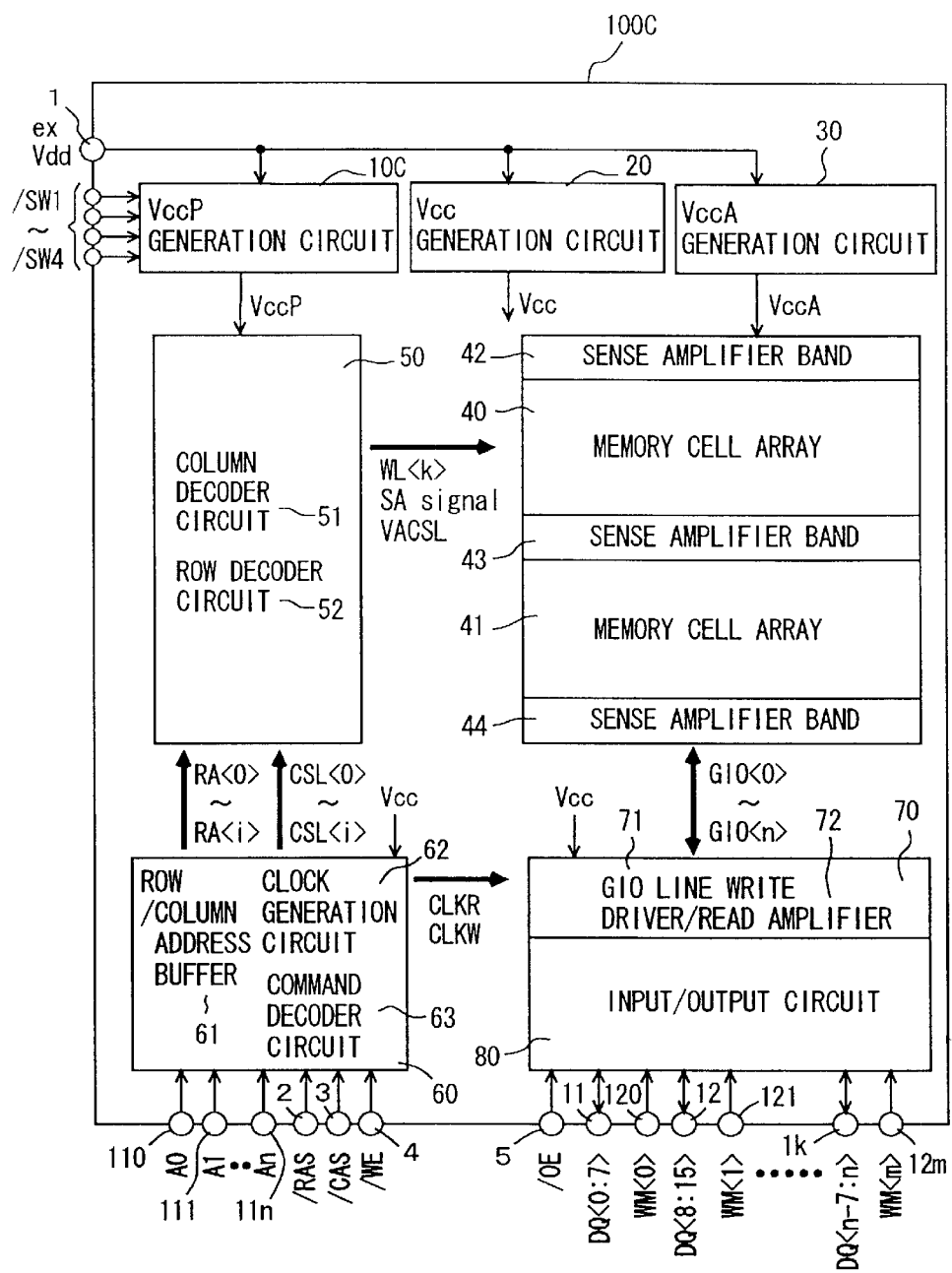
FIG. 16 is a schematic block diagram of a semiconductor memory device according to a fourth embodiment.

Referring to FIG. 16, a semiconductor memory device 100C according to a fourth embodiment is of a configuration in which in semiconductor memory device 100 of FIG. 1, VccP generation circuit 10 is replaced with a VccP generation circuit 10C and the other configuration is the same as that of semiconductor memory device 100.

Semiconductor memory device 100C is a semiconductor memory device containing VccP generation circuit 10C integrated thereon capable of changing a voltage level of power supply voltage VccP in response to a voltage level of power supply voltage Vcc selected by a user.

When inputted with signals /SW1 to /SW4 for changing a voltage level of power supply voltage VccP in response to power supply voltage Vcc selected by a user, VccP generation circuit 10C changes a voltage level of a reference voltage based on signals /SW1 to /SW4 inputted to generate power supply voltage VccP in response to a voltage level of power supply voltage Vcc referring to thus changed reference voltage.

Figure 17:
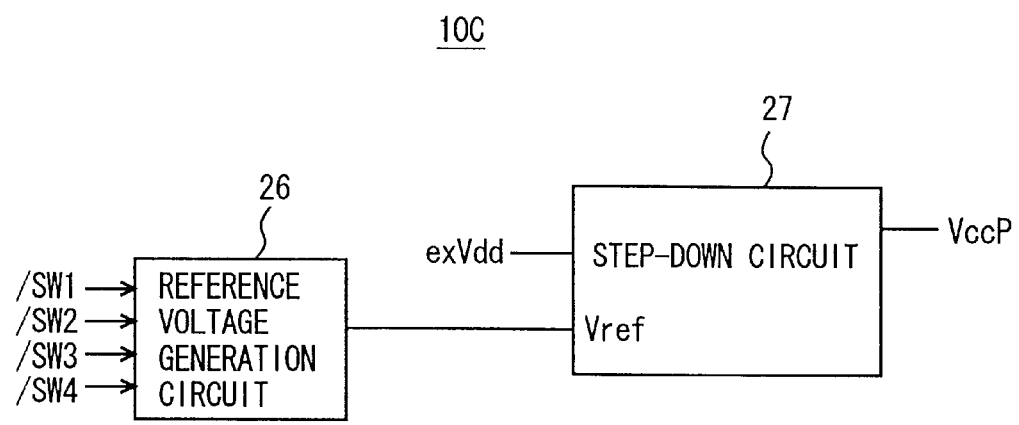
FIG. 17 is a schematic block diagram of a VccP generation circuit shown in FIG. 16.

Referring to FIG. 17, VccP generation circuit 10C includes: a reference voltage generation circuit 26 and a step-down circuit 27. Reference voltage generation circuit 26 changes a voltage level of reference voltage Vref based on signals /SW1 to /SW4 to output thus changed reference voltage to step-down circuit 27. Step-down circuit 27 refers to reference voltage Vref inputted from reference voltage generation circuit 26 to reduce external power supply voltage exVdd and generate power supply voltage VccP.

Figure 18:
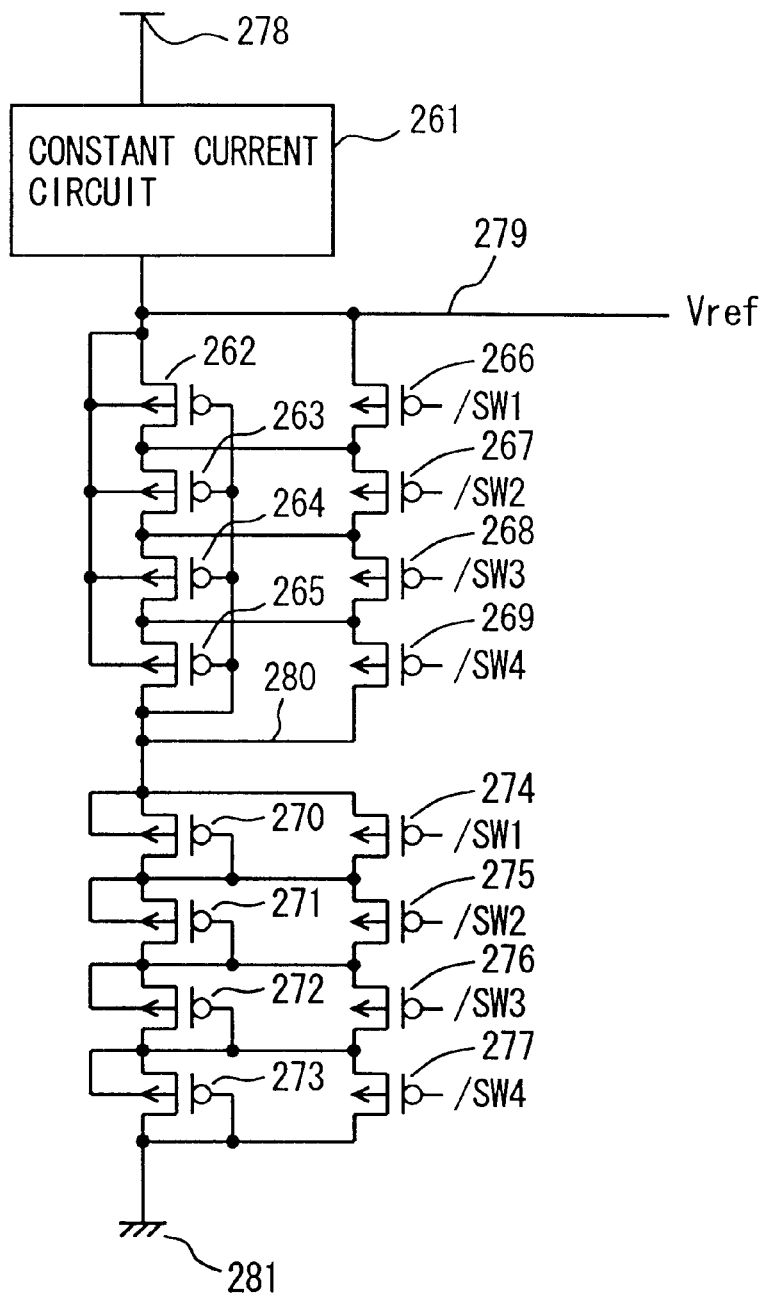
FIG. 18 is a circuit diagram of a reference voltage generation circuit shown in FIG. 17.

Referring to FIG. 18, reference voltage generation circuit 26 includes a constant-current circuit 261, and P channel MOS transistors 262 to 277. Constant current circuit 261 is provided between power supply node 278 and a node 279 to supply, to node 279, a current according to external power supply voltage exVdd supplied to power supply node 278.

P channel MOS transistors 262 to 265 are connected in series between nodes 279 and 280. P channel MOS transistors 262 to 265 receives a voltage on node 279 as a substrate voltage. Furthermore, P channel MOS transistors 262 to 265 receives a voltage on node 280 at the gate terminals thereof. P channel MOS transistors 266 to 269 are connected in series between nodes 279 and 280. Furthermore, P channel MOS transistors 266 to 269 in series connection are connected in parallel to P channel MOS transistors 262 to 265 in series connection. Still further, P channel MOS transistors 266 to 269 receive respective signals /SW1 to /SW4 at the gate terminals thereof. The drain terminal of P channel MOS transistor 266 is connected to the drain terminal of P channel MOS transistor 262. The drain terminal of P channel MOS transistor 267 is connected to the drain terminal of P channel MOS transistor 263. The drain terminal of P channel MOS transistor 268 is connected to the drain terminal of P channel MOS transistor 264. The drain terminal of P channel MOS transistor 269 is connected to the drain terminal of P channel MOS transistor 265.

P channel MOS transistors 270 to 273 are connected in series between node 280 and a ground 281. P channel MOS transistors 270 to 273 receives a voltage on node 280 as a substrate voltage. Furthermore, P channel MOS transistors 270 to 273 receives ground voltage supplied onto node 281 at the gate terminals thereof. P channel MOS transistors 274 to 277 are connected in series between node 280 and ground node 281. P channel MOS transistors 274 to 277 in series connection are connected in parallel to P channel MOS transistors 270 to 273 in series connection. Furthermore, P channel MOS transistors 274 to 277 receive respective signals /SW1 to /SW4 at the gate terminals thereof. The drain terminal of P channel MOS transistor 274 is connected to the drain terminal of P channel MOS transistor 270. The drain terminal of P channel MOS transistor 275 is connected to the drain terminal of P channel MOS transistor 271. The drain terminal of P channel MOS transistor 276 is connected to the drain terminal of P channel MOS transistor 272. The drain terminal of P channel MOS transistor 277 is connected to the drain terminal of P channel MOS transistor 273.

When all of signals /SW1 to /SW4 is at H level, reference voltage generation circuit 26 outputs reference voltage Vref at a stepped-up voltage level from node 279 to step-down circuit 27. When only signal /SW4 is at H level, reference voltage generation circuit 26 outputs reference voltage Vref at a stepped-down voltage level from node 279 to step-down circuit 27. In such a way, by setting each of signals /SW1 to /SW4 at H level or L level, reference voltage generation circuit 26 outputs reference voltage Vref with a changed voltage level to step-down circuit 27.

Hence, by changing logic levels of signals /SW1 to /SW4 in response to a voltage level of power supply voltage Vcc selected by user, VccP generation circuit 10C generates power supply voltage VccP in response to a voltage level of power supply voltage Vcc.

Then, VccP generation circuit 10C outputs thus generated power supply voltage VccP to column decoder 511. Bit line driver 741 are 751 included in column decoders 511 generate, respectively, column select signals VACSL and VACSLW composed of power supply voltage VccP in response to a voltage level of power supply voltage Vcc to output thus generated column select signal VACSL and VACSLW to GIO line gate circuits 84 when corresponding bit line pair BL and /BL are selected.

In such configuration and operation, when data is inputted to or outputted from a memory cell, leakage current can be restricted low that flows into substrates of MOS transistors of GIO line write driver 711 or 711A, or GIO line equalize circuit 731 through GIO line gate circuit 84.

The other points are the same as corresponding points of the first embodiment.

According to the fourth embodiment, a semiconductor memory device changes a gate voltage of MOS transistors constituting a GIO line gate circuit connecting a global data line pair to a bit line pair in response to a voltage level of a power supply voltage selected by a user, so leakage current can be restricted low even if a voltage level of the power supply voltage selected by a user varies.

Fifth Embodiment

Figure 19:
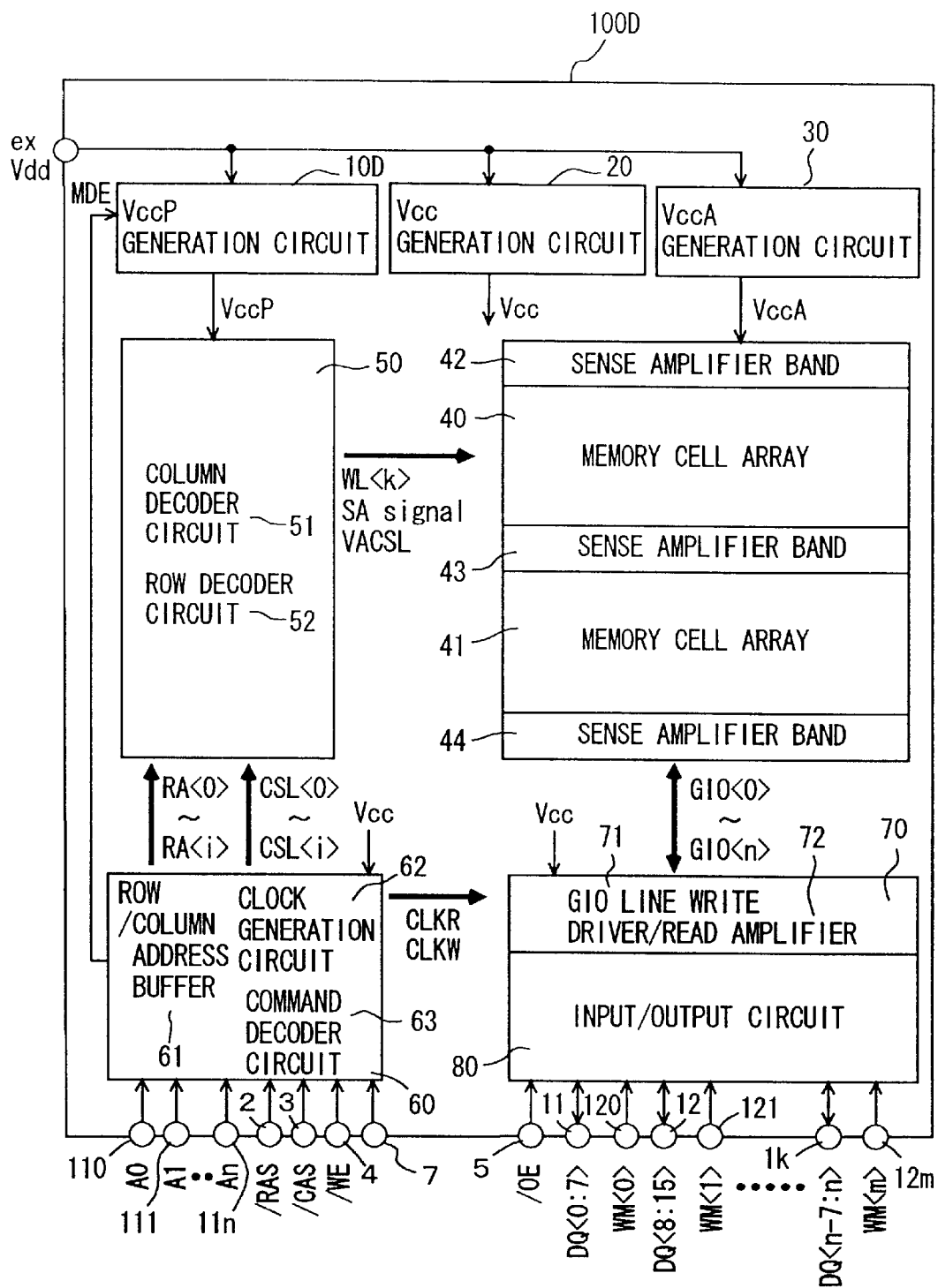
FIG. 19 is a schematic block diagram of a semiconductor memory device according to a fifth embodiment.

Referring to FIG. 19, a semiconductor memory device 100D according to a fifth embodiment is of a configuration in which in semiconductor memory device 100A of FIG. 11, VccP generation circuit 10A is replaced with a VccP generation circuit 10D, terminal 6 is replaced with a terminal 7 and the other configuration is the same as that of semiconductor memory device 100A.

Semiconductor memory device 100D is a semiconductor memory device containing VccP generation circuit 10D integrated thereon capable of changing a voltage level of power supply voltage VccP in response to a selected mode.

A signal MD for controlling a mode of semiconductor memory device 100D is inputted at terminal 7. A command decoder 63 decodes a signal inputted at terminal 7 to output a mode signal MDE to VccP generation circuit 10D. Mode signal MDE includes [S5, S6. S7 and S8]. Each of S5 to S8 is at H or L level. Component S5 corresponds to a high speed mode, component S6 corresponds to a low voltage mode, component S7 corresponds to a normal mode and component S8 corresponds to a low speed mode.

Figure 20:
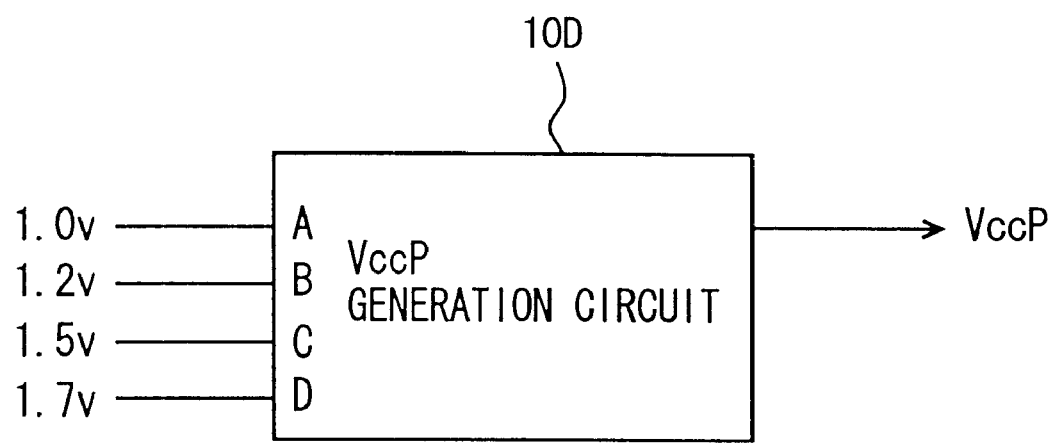
FIG. 20 is an illustration for describing a function of a VccP generation circuit shown in FIG. 19.

Referring to FIG. 20, VccP generation circuit 10D has an A terminal, B terminal, C terminal and D terminal. A terminal is a terminal for selecting 1.0 V as a reference voltage when VccP generation circuit 10D steps down external power supply voltage exVdd to generate power supply voltage VccP. B terminal is a terminal for selecting 1.2 V as a reference voltage when VccP generation circuit 10D steps down external power supply voltage exVdd to generate power supply voltage VccP. C terminal is a terminal for selecting 1.5 V as a reference voltage when VccP generation circuit 10D steps down external power supply voltage exVdd to generate power supply voltage VccP. D terminal is a terminal for selecting 1.7 V as a reference voltage when VccP generation circuit 10D steps down external power supply voltage exVdd to generate power supply voltage VccP.

Therefore, VccP generation circuit 10D selects 1.0 V as a reference voltage for a low voltage mode when mode signal MDE constituted of [H, L, L and L] is inputted, selects 1.2 V as a reference voltage for a low speed mode when mode signal MDE constituted of [L, H, L and L] is inputted, selects 1.5 V as a reference voltage for a normal mode when mode signal MDE constituted of [L, L, H and L] is inputted, and selects 1.7 V as a reference voltage for a high speed mode when mode signal MDE constituted of [L, L, L and H] is inputted.

Then, VccP generation circuit 10D generates power supply voltage VccP of 1.5 V referring to a reference voltage of 1.0 V, power supply voltage VccP of 1.7 V referring to a reference voltage of 1.2 V, power supply voltage VccP of 2.0 V referring to a reference voltage of 1.5 V and power supply voltage VccP of 2.2 V referring to a reference voltage of 1.7 V.

In such a way, VccP generation circuit 10D generates power supply voltage VccP composed of a changed voltage level in response to each mode to output thus generated power supply voltage VccP to column decoder 511. Bit line driver 741 and 751 included in column decoders 511 generate, respectively, column select signals VACSL and VACSLW composed of power supply voltage VccP in response to a voltage level of power supply voltage Vcc to output thus generated column select signals VACSL and VACSLW to GIO line gate circuits 84 when corresponding bit line pair BL and /BL is selected.

In such an operation, when data is inputted to or outputted from a memory cell, leakage current can be restricted low that flows into substrates of MOS transistors of GIO line write driver 711 or 711A, or GIO line equalize circuit 731 through GIO line gate circuit 84.

The other points are the same as corresponding points of the second embodiment.

Figure 21:
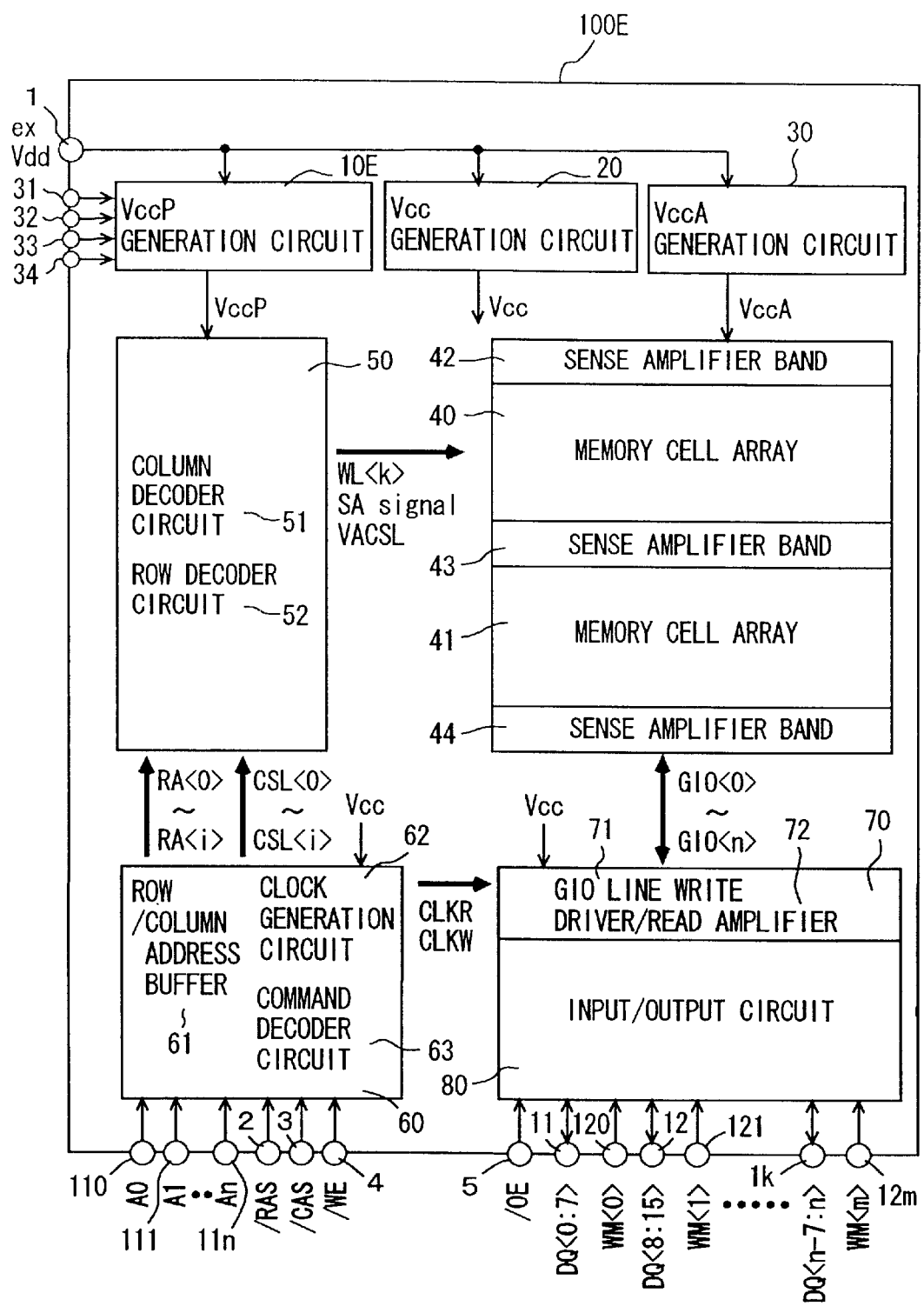
FIG. 21 is a schematic block diagram of a semiconductor memory device according to a sixth embodiment.

According to the fifth embodiment, a semiconductor memory device changes a gate voltage of MOS transistors constituting a GIO line gate circuit connecting a global data line pair to a bit line pair in response to each mode of the semiconductor memory device, so leakage current can be restricted low even if a mode of the semiconductor memory device changes Sixth Embodiment Referring to FIG. 21, a semiconductor memory device 100E according to a sixth embodiment is of a configuration in which in semiconductor memory device 100 of FIG. 1, VccP generation circuit 10 is replaced with a VccP generation circuit 10E and the other configuration is the same as that of semiconductor memory device 100.

Semiconductor memory device 100E is a semiconductor memory device containing VccP generation circuit 10E integrated thereon capable of changing a voltage level of power supply voltage VccP in response to a voltage level of power supply voltage Vcc selected by a user.

A terminal 31 is a terminal for supplying a voltage of 1.5 V, a terminal 32 is a terminal for supplying a voltage of 1.7 V, a terminal 33 is a terminal for supplying a voltage of 2.0 V and a terminal 34 is a terminal for supplying a voltage of 2.2 V.

When a user selects 1.0 V as power supply voltage Vcc, a voltage of 1.5 V is supplied from terminal 31; when a user selects 1.2 V as power supply voltage Vcc, a voltage of 1.7 V is supplied from terminal 32; when a user selects 1.5 V as power supply voltage Vcc, a voltage of 2.0 V is supplied from terminal 33; and when a user selects 1.7 V as power supply voltage Vcc, a voltage of 2.2 V is supplied from terminal 34.

VccP generation circuit 10E outputs a voltage from a terminal supplied with a voltage among terminals 31 to 34 as power supply voltage VccP.

Figure 22:
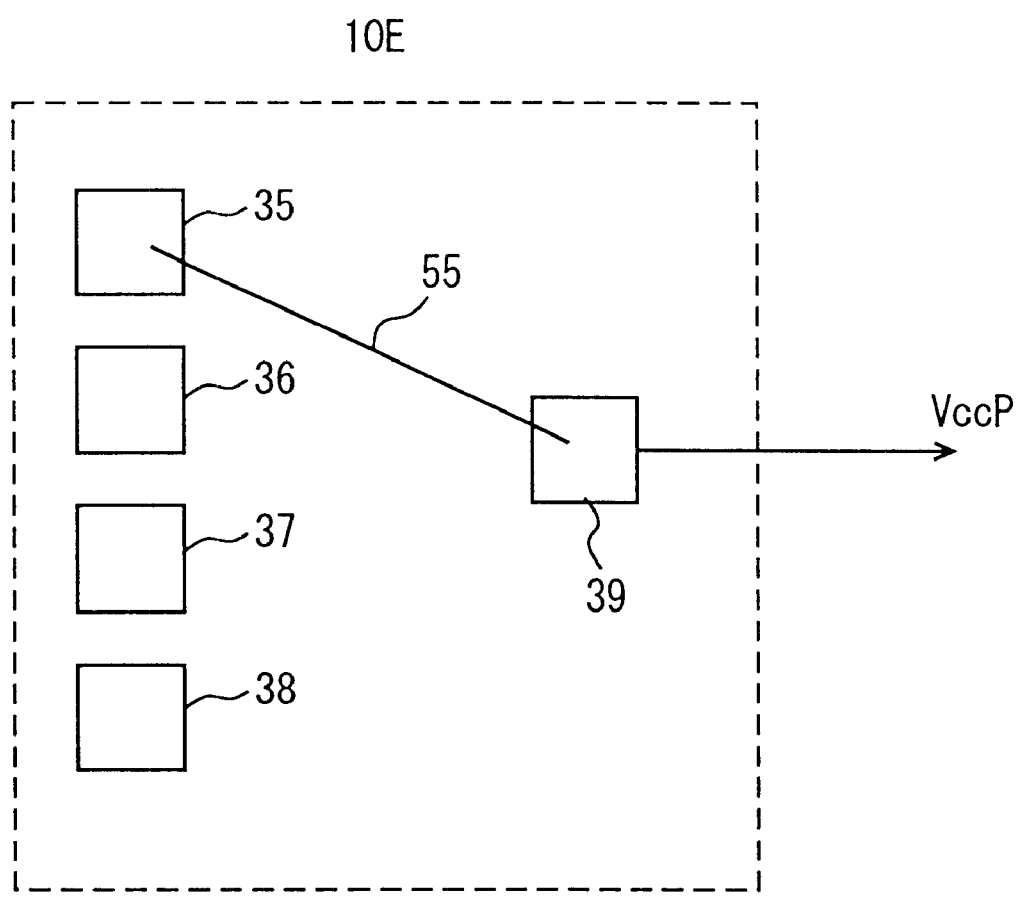
FIG. 22 is a circuit diagram of a VccP generation circuit shown in FIG. 21.

Referring to FIG. 22, VccP generation circuit 10E includes pads 35 to 39 and a wire 55. Pad 35 is provided correspondingly to terminal 31 to receive a voltage of 1.5 V supplied to terminal 31. Pad 36 is provided correspondingly to terminal 32 to receive a voltage of 1.7 V supplied to terminal 32. Pad 37 is provided correspondingly to terminal 33 to receive a voltage of 2.0 V supplied to terminal 33. Pad 38 is provided correspondingly to terminal 34 to receive a voltage of 2.2 V supplied to terminal 34. Pad 39 receives a voltage from one of pads 35 to 38 to which pad 39 is connected by wire 55 to output thus received voltage as power supply voltage VccP.

Hence, when a user selects 1.0 V as power supply voltage Vcc, a voltage of 1.5 V is supplied to terminal 31 and wire 55 connects pad 39 to pad 35. Then, VccP generation circuit 10E outputs power supply voltage VccP of 1.5V. When a user selects 1.2 V as power supply voltage Vcc, a voltage of 1.7 V is supplied to terminal 32 and wire 55 connects pad 39 to pad 36. Then, VccP generation circuit 10E outputs power supply voltage VccP of 1.7V. When a user selects 1.5 V as power supply voltage Vcc, a voltage of 2.0 V is supplied to terminal 33 and wire 55 connects pad 39 to pad 37. Then, VccP generation circuit 10E outputs power supply voltage VccP of 2.0. When a user selects 1.7 V as power supply voltage Vcc, a voltage of 2.2 V is supplied to terminal 34 and wire 55 connects pad 39 to pad 38. Then, VccP generation circuit 10E outputs power supply voltage VccP of 2.2 V.

In such a way, VccP generation circuit 10E selects power supply voltage VccP in response to a voltage level of power supply voltage Vcc selected by a user to output thus selected power supply voltage VccP to column decoder 511. Bit line drivers 741 and 751 included in column decoders 511 generates, respectively, column select signals VACSL and VACSLW composed of power supply voltage VccP with a voltage level in response to a voltage level of power supply voltage Vcc to output thus generated column select signals VACSL and VACSLW to GIO line gate circuits 84 when corresponding bit line pair BL and /BL is selected.

In such an operation, when data is inputted to or outputted from a memory cell, leakage current can be restricted low that flows into substrates of MOS transistors constructing GIO line write driver 711 or 711A or GIO line equalize circuit 731 through GIO line gate circuit 84.

The other points are the same as corresponding points of the first embodiment.

In the sixth embodiment, a voltage supplied to VccP generation circuit 10E may be changed according to a voltage level of power supply voltage Vcc, using a mask when semiconductor memory device 100E is manufactured. That is, when pad 39 shown in FIG. 22 is connected to one of pads 35 to 38, pad 39 may be connected to one of pads 35 to 38 using interconnection patterned by a mask instead of wire 55.

According to the sixth embodiment, a semiconductor memory device changes a gate voltage of MOS transistors constituting a GIO line gate circuit connecting a global data line pair to a bit line pair in response to a voltage level of power supply voltage selected by a user, so leakage current can be restricted low even if a voltage level of power supply voltage selected by a user changes.

Seventh Embodiment

Figure 23:
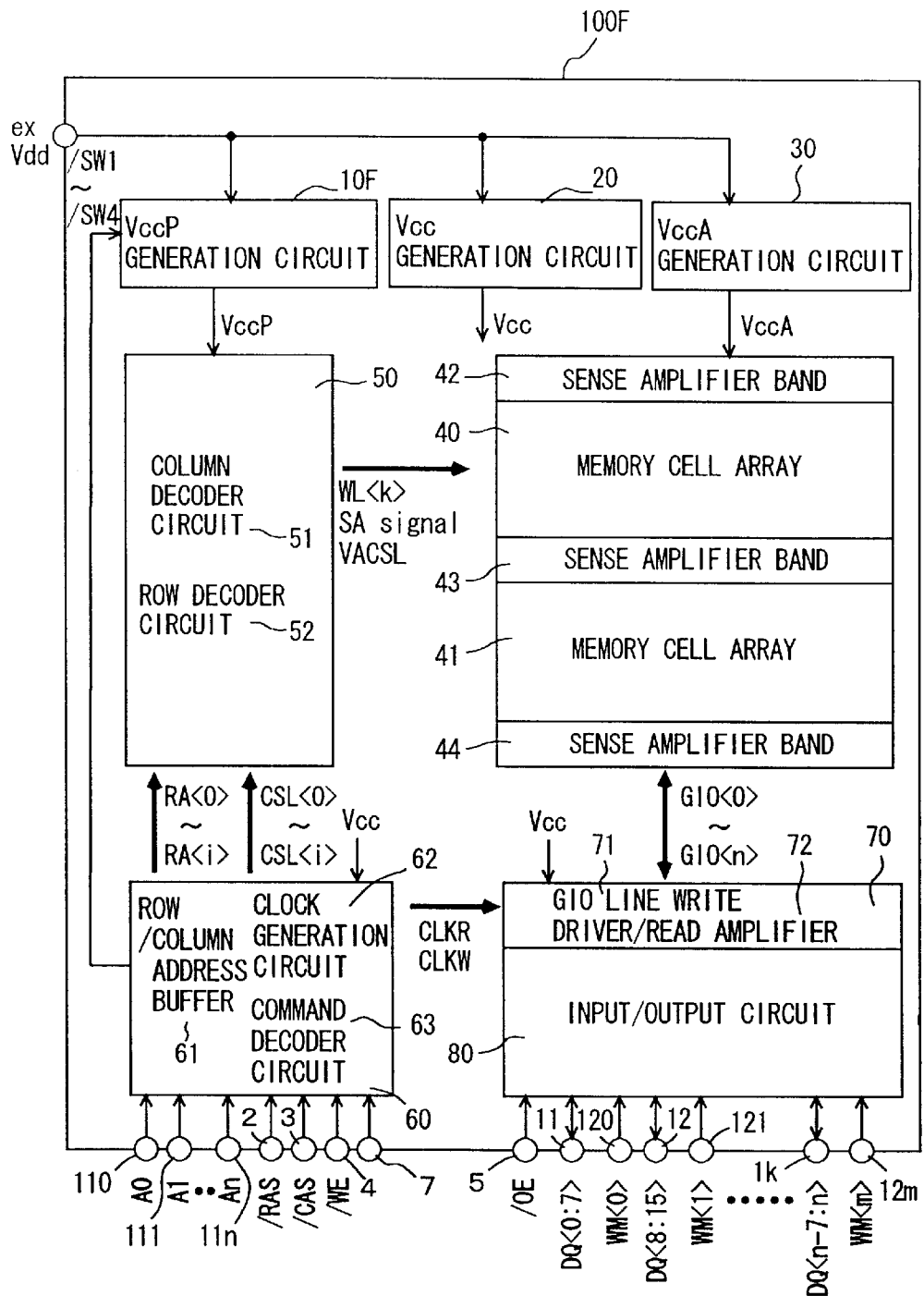
FIG. 23 is a schematic block diagram of a semiconductor memory device according to a seventh embodiment.

Referring to FIG. 23, a semiconductor memory device 100F according to a seventh embodiment is of a configuration in which in semiconductor memory device 100C of FIG. 16, a terminal 7 is added thereto and VccP generation circuit 10C is replaced with a VccP generation circuit 10F and the other configuration is the same as that of semiconductor memory device 100C.

Semiconductor memory device 100F is a semiconductor memory device containing VccP generation circuit 10F integrated thereon capable of changing a voltage level of power supply voltage VccP in response to a mode selected.

Signal MD for controlling a mode of semiconductor memory device 100F is inputted at terminal 7. Command decoder circuit 63 decodes signal MD inputted at terminal 7 to output signals /SW1 to /SW4 for changing a voltage level of power supply voltage VccP in response to a mode to VccP generation circuit 10F. Modes to be selected include a high speed mode, low speed mode, normal mode and low voltage mode.

VccP generation circuit 10F is of the same configuration as is VccP generation circuit 10C shown in FIG. 17.

Description of a reference voltage referred to by VccP generation circuit 10F and a relationship between the reference voltage and power supply voltage VccP in each mode is the same as that in the fifth embodiment.

In such a way, VccP generation circuit 10F generates power supply voltage VccP having a changed voltage level in response to each mode to output thus generated power supply voltage VccP to column decoder 511. Bit line drivers 741 and 751 included in column decoders 511 generate, respectively, column select signals VACSL and VACSLW composed of power supply voltage VccP with a voltage level in response to a voltage level of power supply voltage Vcc to output thus generated column select signals VACSL and VACSLW to GIO line gate circuits 84 when corresponding bit line pair BL and /BL is selected.

In such an operation, when data is inputted to or outputted from a memory cell, leakage current can be restricted low that flows into substrates of MOS transistors constructing GIO line write driver 711 or 711A or GIO line equalize circuit 731 through GIO line gate circuit 84.

The other points are the same as corresponding points of the fourth or fifth embodiment.

According to the seventh embodiment, a semiconductor memory device changes a gate voltage of MOS transistors constituting a GIO line gate circuit connecting a global data line pair to a bit line pair in response to each mode of the semiconductor memory device, so leakage current can be restricted low even if a mode of the semiconductor memory device changes.

Note that while in the first to seventh embodiments described above, a voltage applied to the gate terminals of N channel MOS transistors constituting a GIO line gate circuit have only to satisfy the above equations (1) to (4), more generally, the voltage has only to be one at which current that flows from bit line pair BL and /BL toward global data line pair GIO and /GIO or GIOW and /GIOW is restricted to be less than a predetermined value.

Eighth Embodiment

Figure 24:
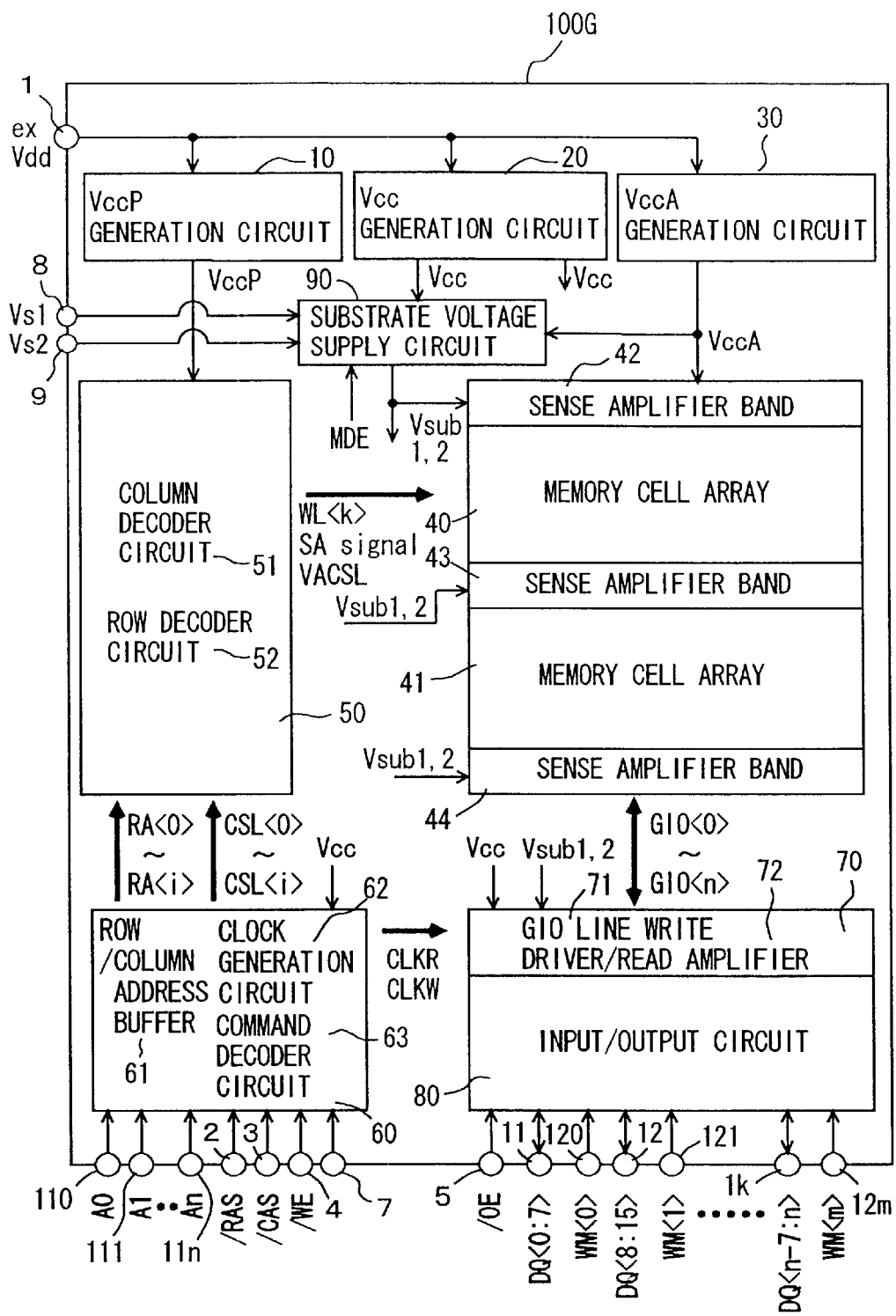
FIG. 24 is a schematic block diagram of a semiconductor memory device according to an eighth embodiment.

Referring to FIG. 24, a semiconductor memory device 100G according to an eighth embodiment is of a configuration in which in semiconductor memory device 100 of FIG. 1, a terminal 7 and a substrate voltage supply circuit 90 are added thereto and the other configuration is the same as that of semiconductor memory device 100.

Command decoder circuit 63 decodes a command signal indicating an operation mode inputted at terminal 7 to output mode signal MDE indicating each operation mode to substrate voltage supply circuit 90.

Substrate voltage supply circuit 90 selects a power supply voltage with higher voltage level out of power supply voltage Vcc from Vcc generation circuit 20 and power supply voltage VccA from VccA generation circuit 30 based on mode signal MDE, and outputs thus selected power supply voltage to sense amplifier bands 42 to 44 and GIO line write driver 71 of peripheral circuit 70 as a substrate Vsub1. Furthermore, substrate voltage supply circuit 90 selects a ground voltage with lower voltage level out of a ground voltage Vs1 supplied from a terminal 8 and a ground voltage Vs2 supplied from a terminal 9 based on mode signal MDE to output thus selected ground voltage to sense amplifier bands 42 to 44 and GIO line write driver 71 as substrate voltage Vsub2.

Figure 25:
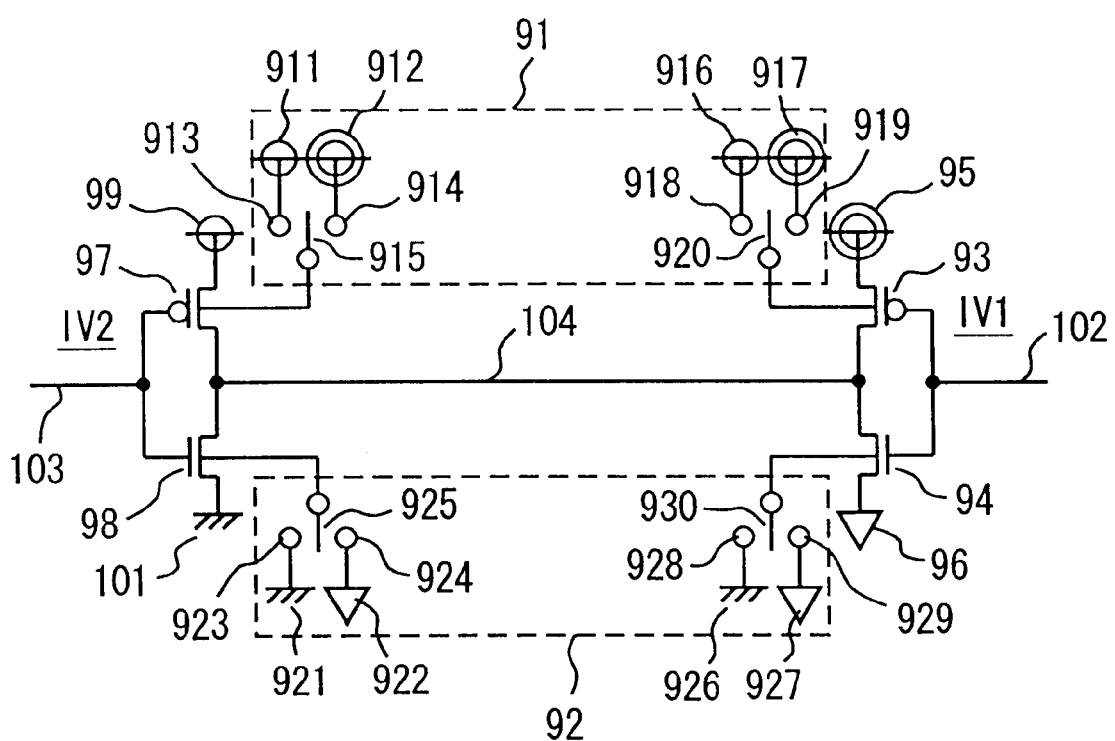
FIG. 25 is a circuit diagram of a substrate voltage supply circuit and a circuit diagram of a circuit using a common output node shown in FIG. 24.

Referring to FIG. 25, substrate voltage supply circuit 90 is constructed of a high voltage supply circuit 91 and a low voltage supply circuit 92. High voltage supply circuit 91 includes power supply nodes 911, 912, 916 and 917, terminals 913, 914, 918 and 919, and switches 915 and 920. Terminal 913 is supplied with power supply voltage Vcc from power supply node 911. Terminal 914 is supplied with power supply voltage VccA from power supply node 912. Terminal 918 is supplied with power supply voltage Vcc from power supply node 916. Terminal 919 is supplied with power supply voltage VccA from power supply node 917. Switch 915 selects a power supply voltage with higher voltage level out of power supply voltage Vcc and power supply voltage VccA based on a mode signal, from terminal 913 or 914 to supply thus selected power supply voltage to a substrate of a P channel MOS transistor 97. Switch 920 selects a power supply voltage with higher voltage level out of power supply voltage Vcc and power supply voltage VccA based on a mode signal, from terminal 918 or 919 to supply thus selected power supply voltage to a substrate of a P channel MOS transistor 93.

Low voltage supply circuit 92 includes ground nodes 921, 922, 926 and 927, terminals 923, 924, 928 and 929, and switches 925 and 930. Terminal 923 is supplied with ground voltage Vs1 from ground 921. Terminal 924 is supplied with ground voltage Vs2 from ground 922. Terminal 928 is supplied with ground voltage Vs1 from ground 926. Terminal 929 is supplied with ground voltage Vs2 from ground 927. Switch 925 selects a ground voltage with lower voltage level out of ground voltage Vs1 and ground voltage Vs2 based on a mode signal, from terminal 923 or 924 to supply thus selected power supply voltage to a substrate of an N channel MOS transistor 98. Switch 930 selects a ground voltage with lower voltage level out of ground voltage Vs1 and ground voltage Vs2 based on a mode signal, from terminal 928 or 929 to supply thus selected power supply voltage to a substrate of an N channel MOS transistor 94.

P channel MOS transistor 93 and N channel MOS transistor 94 are connected in series between a power supply node 95 and a ground node 96. Power supply node 95 is supplied with power supply voltage VccA and ground node 96 is supplied with ground voltage Vs2.

P channel MOS transistor 97 and N channel transistor 98 are connected in series between a power supply node 99 and a ground node 101. Power supply node 99 is supplied with power supply voltage Vcc and ground node 101 is supplied with ground voltage Vs1.

Inverter IV1 constructed of P channel MOS transistor 93 and N channel MOS transistor 94 uses an output node 104 of inverter IV2 constructed of P channel MOS transistor 97 and N channel MOS transistor 98 commonly therewith. That is, inverter IV1 inverts a signal inputted at input node 102 to output the inverted signal to an output node 104. Inverter IV2 inverts a signal inputted at input node 103 to output the inverted signal to output node 104.

Referring to FIGS. 24 and 25, when mode signal MDE is inputted from command decoder circuit 63 that indicates a operation mode in which power supply voltage VccA is higher than power supply voltage Vcc and ground voltage Vs2 is lower than ground voltage Vs1, substrate voltage supply circuit 90 selects power supply voltage VccA from terminal 914 with switch 915 to supply power supply voltage VccA to a substrate of P channel MOS transistor 97. Furthermore, substrate voltage supply circuit 90 selects power supply voltage VccA from terminal 919 with switch 920 to supply power supply voltage VccA to a substrate of P channel MOS transistor 93. Still furthermore, substrate voltage supply circuit 90 selects ground voltage Vs2 from terminal 924 with switch 925 to supply ground voltage Vs2 to a substrate of N channel MOS transistor 98. Yet furthermore, substrate voltage supply circuit 90 selects ground voltage Vs2 from terminal 929 with switch 930 to supply ground voltage Vs2 to a substrate of N channel MOS transistor 94. In such a situation, the PN junctions of P channel MOS transistor 97 and N channel MOS transistor 98 of inverter IV2 driven by a low power supply voltage and a high ground voltage are applied with a reverse bias; therefore, it can be prevented that forward leakage current flows across each PN junction.

In an operation mode in which power supply voltage Vcc is higher than power supply voltage VccA and ground voltage Vs1 is lower than ground voltage Vs2, substrate voltage supply circuit 90, as described above, supplies power supply voltage Vcc to substrates of P channel MOS transistors 93 and 97 and supplies ground voltage Vs1 to substrates of N channel MOS transistors 94 and 98. In such a situation, the PN junctions of P channel MOS transistor 93 and N channel MOS transistor 94 of inverter IV1 driven by a low power supply voltage and a high ground voltage are applied with a reverse bias; therefore, it can be prevented that forward leakage current flows across each PN junction.

Figure 26A:
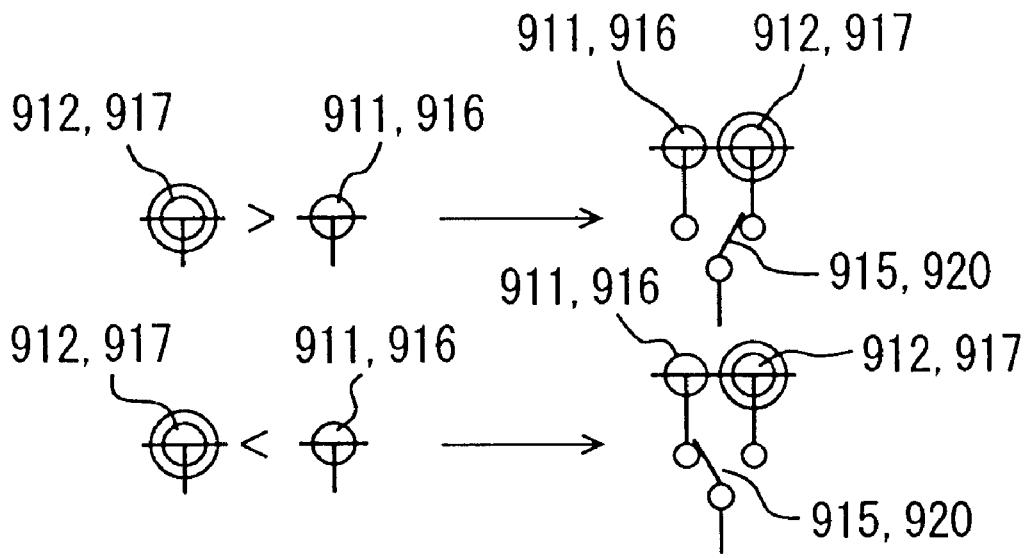
FIG. 26A is an illustration for describing a power supply voltage supplied onto a power supply node and FIG. 26B is an illustration for describing a ground voltage supplied onto a ground node.

In the present invention, as shown in FIG. 26A, when power supply voltage VccA supplied onto power supply nodes 912 and 917 is higher than power supply voltage Vcc supplied onto power supply nodes 911 and 916, switches 915 and 920 select power supply voltage VccA supplied to power supply nodes 912 and 917. On the other hand, when power supply voltage Vcc supplied to power supply nodes 911 and 916 is higher than power supply voltage VccA supplied to power supply nodes 912 and 917, switches 915 and 920 selects power supply voltage Vcc supplied to power supply nodes 911 and 916.

Figure 26B:
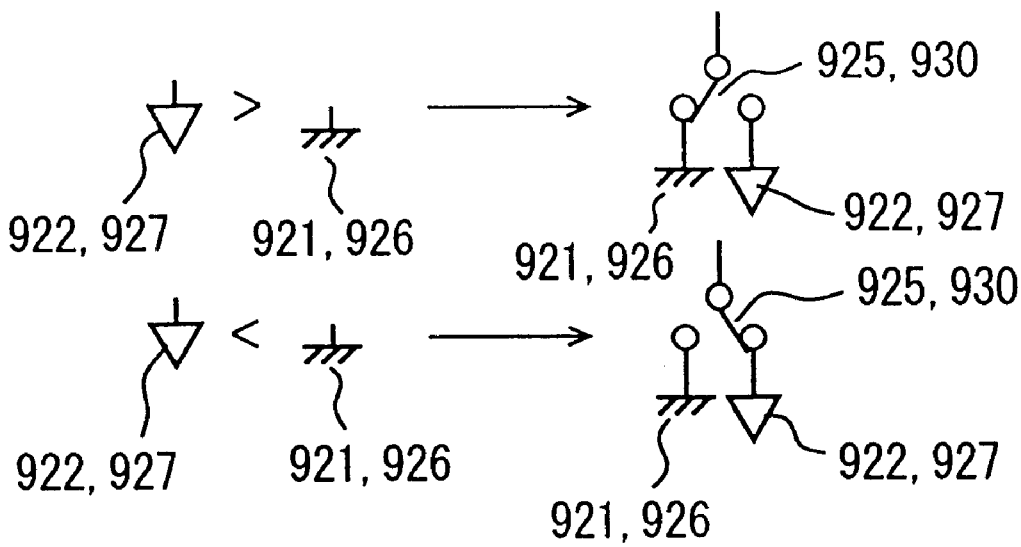

As shown in FIG. 26B, when ground voltage Vs1 supplied to ground nodes 921 and 926 is lower than ground voltage Vs2 supplied to ground nodes 922 and 927, switches 925 and 930 selects ground voltage Vs1 supplied to ground nodes 921 and 926. On the other hand, when ground voltage Vs2 supplied to ground nodes 922 and 927 is lower than ground voltage Vs1 supplied to ground nodes 921 and 926, switches 925 and 930 selects ground voltage Vs2 supplied to ground nodes 922 and 927.

Figure 27:
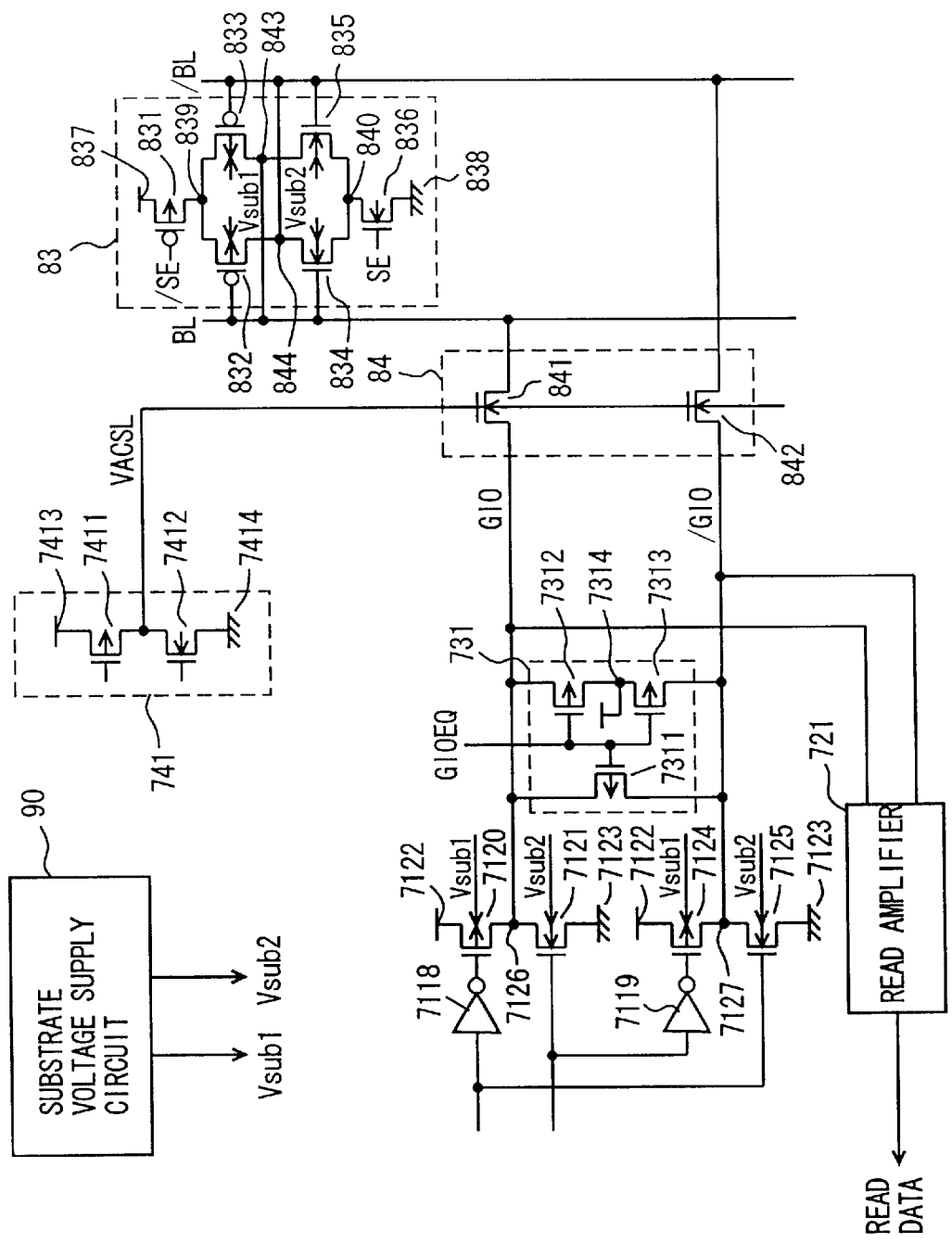
FIG. 27 is a circuit diagram of a GIO line write driver and a sense amplifier to which a substrate voltage supply circuit supplies a substrate voltage.

FIG. 27 is a diagram having a configuration obtained by adding substrate voltage supply circuit 90 to the configuration of FIG. 5. In the eighth embodiment, a method for preventing a forward leakage current shown in FIG. 25 is applied to P channel MOS transistor 833 and N channel MOS transistor 835 constituting sense amplifier 83 and to P channel MOS transistor 7120 and N channel MOS transistor 7121 constituting a GIO line write driver 711. That is, substrate voltage supply circuit 90 supplies power supply voltage VccA or Vcc with higher voltage level to substrates of P channel MOS transistors 833 and 7120 as a substrate voltage Vsub1, while supplying ground voltage Vs1 or Vs2 with lower voltage level to substrates of N channel MOS transistors 835 and 7121 as a substrate voltage Vsub2. With such a method for preventing a leakage current applied, forward leakage current is prevented from generating in P channel MOS transistors 833 and 7120, and N channel MOS transistors 835 and 7121.

Furthermore, the method for preventing a forward leakage current shown in FIG. 25 is applied to between a pair of P channel MOS transistor 832 and N channel MOS transistor 834 constituting sense amplifier 83, and a pair of P channel MOS transistor 7124 and N channel MOS transistor 7125 constituting GIO line write driver 711.

Still furthermore, the method for preventing a forward leakage current shown in FIG. 25 is applied to between a pair of P channel MOS transistor 832 and N channel MOS transistor 834 constituting sense amplifier 83, and a set of P channel MOS transistors 7311 to 7313 constituting GIO line equalize circuit 731.

Yet furthermore, the method for preventing a forward leakage current shown in FIG. 25 is applied to between a pair of P channel MOS transistor 833 and N channel MOS transistor 835 constituting sense amplifier 83, and a set of P channel MOS transistors 7311 to 7313 constituting GIO line equalize circuit 731.

Note that while, taken up in the above description is power supply voltages at two voltage levels, which are compared with each other or ground voltages at two voltage levels, which are compared with each other, no specific limitation is given to the cases in the present invention; it is only required that supplied as a substrate voltage is a power supply voltage with the highest level among plural power supply voltages or a ground voltage with the lowest level among plural ground voltages.

In the present invention, substrate voltage supply circuit 90 may be applied to any of semiconductor memory devices 100A to 100F according to the respective second to seventh embodiments.

According to the eighth embodiment, a semiconductor memory device supplies a power supply voltage with the highest voltage level among plural power supply voltages having respective different voltage levels to substrates of P channel MOS transistors, while supplying a ground voltage with the lowest voltage level among plural ground voltages having respective different voltage levels to substrates of N channel MOS transistors; therefore, forward leakage current across the PN junction can be prevented in any of the MOS transistors.

Ninth Embodiment

Figure 28:
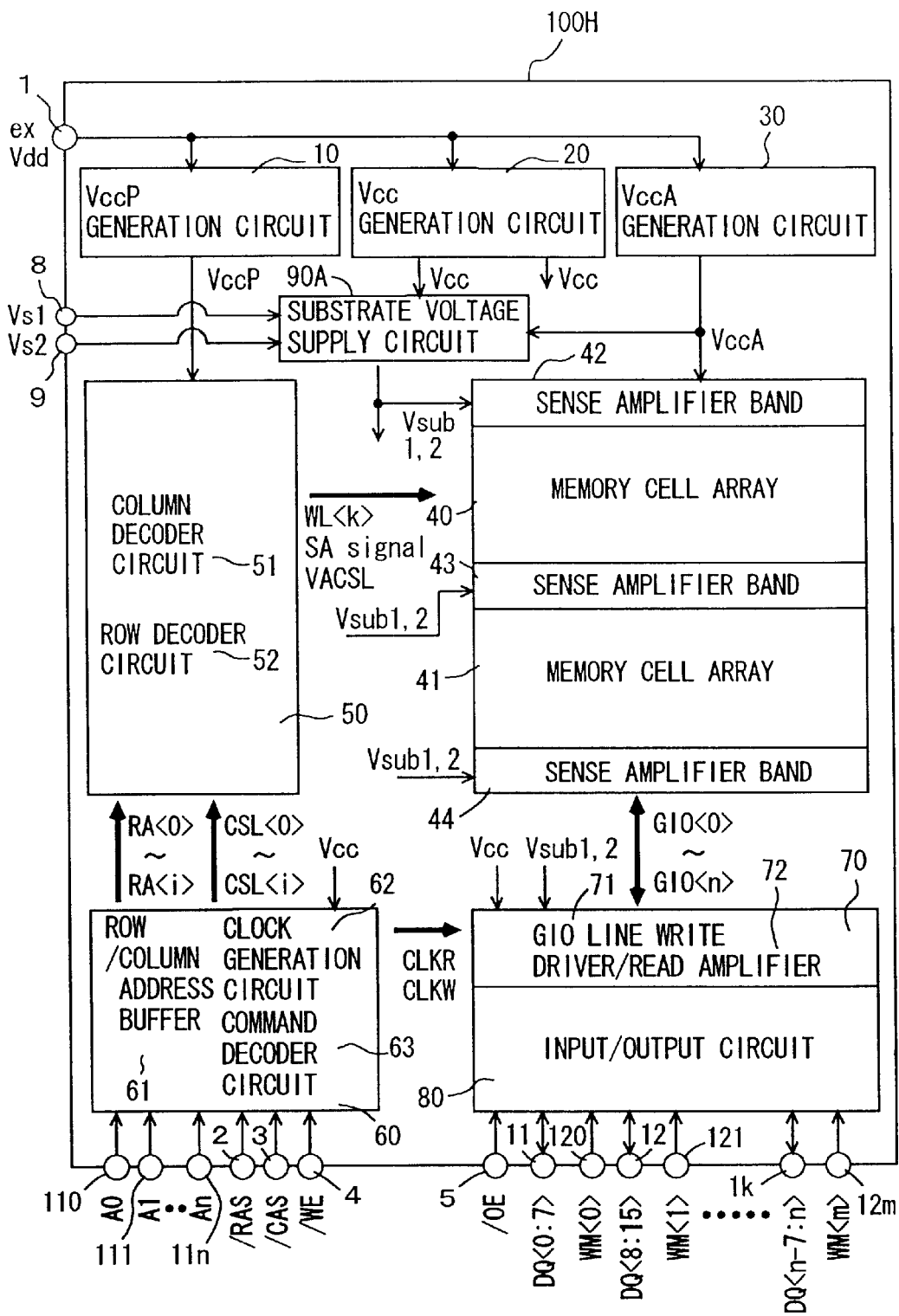
FIG. 28 is a schematic block diagram of a semiconductor memory device according to a ninth embodiment.

Referring to FIG. 28, a semiconductor memory device 100H according to a ninth embodiment is of a configuration in which in semiconductor memory device 100G shown in FIG. 24, a substrate voltage supply circuit 90 is replaced with a substrate voltage supply circuit 90A and the other configuration is the same as that of semiconductor memory device 100G.

Substrate voltage supply circuit 90A compares power supply voltage Vcc from Vcc generation circuit 20 with power supply voltage VccA from VccA generation circuit 30 to select a power supply voltage with a higher level therebetween and output thus selected power supply voltage to sense amplifier bands 42 to 44 and GIO line write driver 71 of peripheral circuit 70 as substrate voltage Vsub1. Furthermore, substrate voltage supply circuit 90A compares ground voltage Vs1 from terminal 8 with ground voltage Vs2 from terminal 9 to select a ground voltage with a lower level therebetween and output thus selected ground voltage to sense amplifier bands 42 to 44 and GIO line write driver 71 of peripheral circuit 70 as substrate voltage Vsub2.

Figure 29:
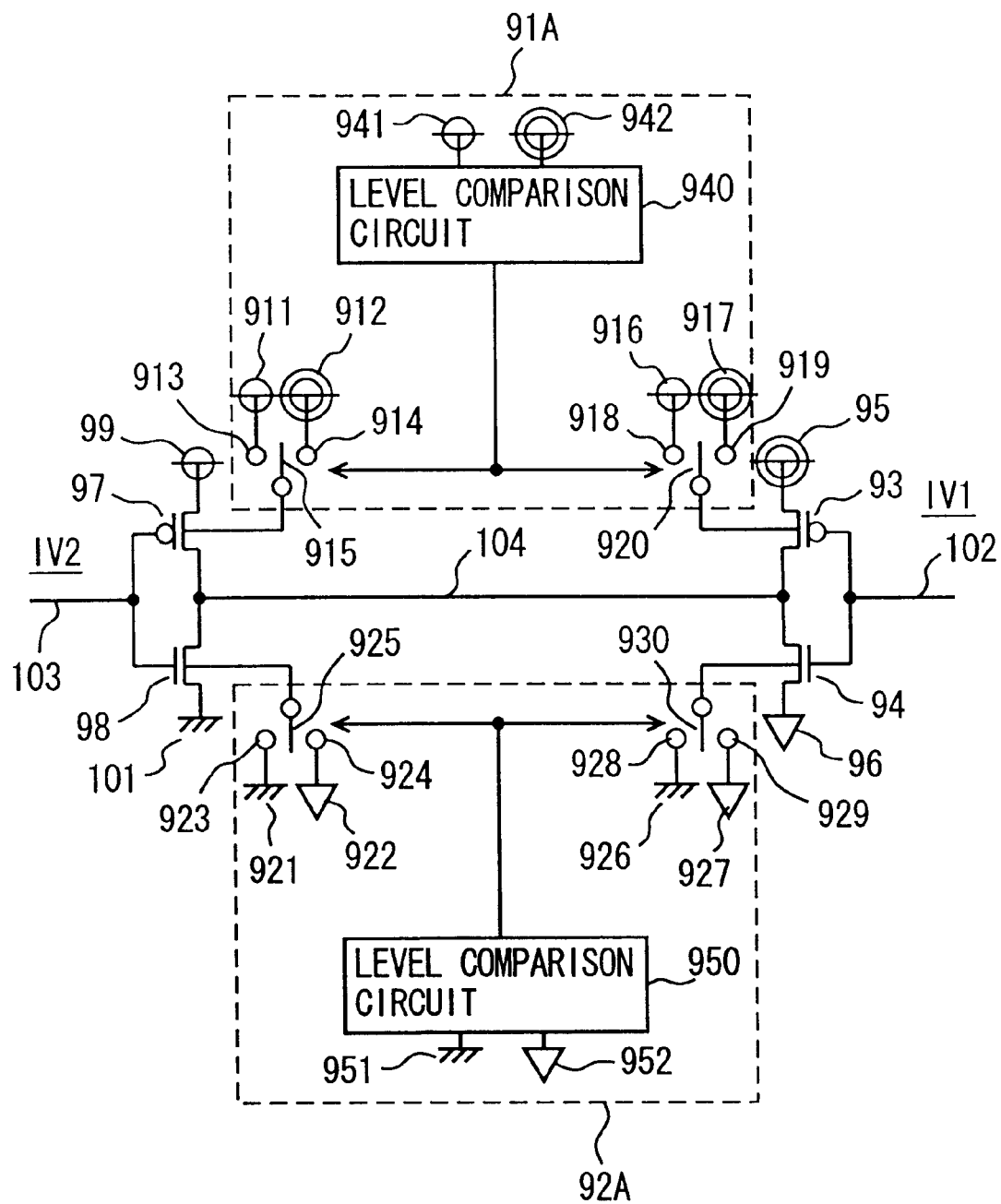
FIG. 29 is a circuit diagram of a substrate voltage supply circuit and a circuit diagram of a circuit using a common output node shown in FIG. 28.

Referring to FIG. 29, substrate voltage supply circuit 90A includes a high voltage supply circuit 91A and a low voltage supply circuit 92A. High voltage supply circuit 91A has a configuration obtained by adding a level comparison circuit 940 and power supply nodes 941 and 942 to high voltage supply circuit 91 shown in FIG. 25 and the other configuration is the same as that of high voltage supply circuit 91. Level comparison circuit 940 compares power supply voltage Vcc supplied to power supply node 941 from Vcc generation circuit 20 with power supply voltage VccA supplied to power supply node 942 from VccA generation circuit 30 to output a result of the comparison to switches 915 and 920. Switches 915 and 920 selects power supply voltage Vcc supplied to terminals 913 and 918 or power supply voltage VccA supplied to terminals 914 and 919 based on the result of the comparison inputted from level comparison circuit 940 to output thus selected power supply voltage to substrates of P channel MOS transistors 97 and 93.

Low voltage supply circuit 92A has a configuration obtained by adding a level comparison circuit 950 and ground nodes 951 and 952 to low voltage supply circuit 92 shown in FIG. 25 and the other configuration is the same as that of low voltage supply circuit 92. Level comparison circuit 950 compares ground voltage Vs1 supplied to ground node 951 from terminal 8 with ground voltage Vs2 supplied to ground node 952 from terminal 9 to output a result of the comparison to switches 925 and 930. Switches 925 and 930 selects ground voltage Vs1 supplied to terminals 921 and 926 or ground voltage Vs2 supplied to terminals 922 and 927 based on the comparison result inputted from level comparison circuit 950 to supply thus selected ground voltage to substrates of N channel MOS transistors 98 and 94.

In the ninth embodiment as well, a method for preventing a forward leakage current shown in FIG. 29 is applied to between a pair of P channel MOS transistor 833 and N channel MOS transistor 835 constituting sense amplifier 83, and a pair of P channel MOS transistor 7120 and N channel MOS transistor 7121 constituting GIO line write driver 711 shown in FIG. 27.

Furthermore, the method for preventing a forward leakage current shown in FIG. 29 is also applied to between a pair of P channel MOS transistor 832 and N channel MOS transistor 834 constituting sense amplifier 83, and a pair of P channel MOS transistor 7124 and N channel MOS transistor 7125 constituting GIO line write driver 711.

Still furthermore, the method for preventing a forward leakage current shown in FIG. 29 is applied to between a pair of P channel MOS transistor 832 and N channel MOS transistor 834 constituting sense amplifier 83, and a set of P channel MOS transistors 7311 to 7313 constituting GIO line equalize circuit 731.

Yet furthermore, the method for preventing a forward leakage current shown in FIG. 29 is applied to between a pair of P channel MOS transistor 833 and N channel MOS transistor 835 constituting sense amplifier 83, and a set of P channel MOS transistors 7311 to 7313 constituting GIO line equalize circuit 731.

Figure 30:
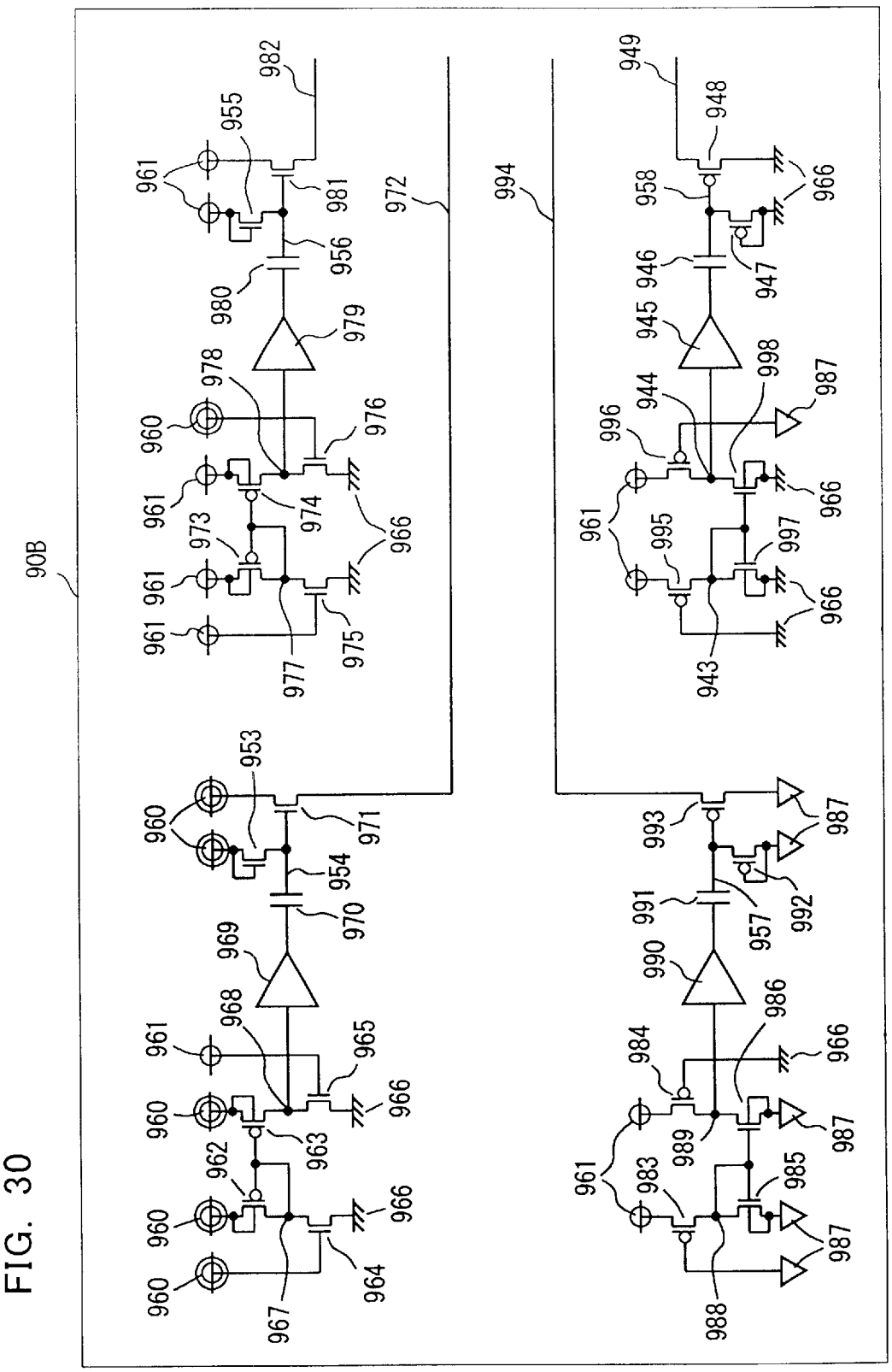
FIG. 30 is a circuit diagram of another substrate voltage supply circuit integrated on a semiconductor memory device shown in FIG. 28.

Semiconductor memory device 100H may be integrated with substrate voltage supply circuit 90B shown in FIG. 30 instead of substrate voltage supply circuit 90A.

Substrate voltage supply circuit 90B includes P channel MOS transistors 962, 963, 973, 974, 983, 984, 992, 993, 947, 948, 995 and 996, N channel MOS transistors 953, 955, 964, 965, 971, 975, 976, 981, 985, 986, 997 and 998, and amplification circuits 945, 969, 979 and 990, and capacitors 946, 970, 980 and 991.

P channel MOS transistor 962 and N channel MOS transistor 964 are connected in series between a power supply node 960 and a ground node 966. P channel MOS transistor 963 and N channel MOS transistor 965 are connected in series between power supply node 960 and ground node 966. A voltage on a node 967 is given to the gate terminals of P channel MOS transistors 962 and 963. N channel MOS transistor 964 receives power supply voltage VccA from power supply node 960 at the gate terminal thereof. N channel MOS transistor 965 receives power supply voltage Vcc from a power supply node 961 at the gate terminal thereof.

Amplification circuit 969 receives a voltage on a node 968 to amplify the received voltage and output the amplified voltage to capacitor 970. N channel MOS transistor 953 is connected in diode connection between power supply node 960 and a node 954. N channel MOS transistor 971 is connected between power supply node 960 and a node 972 to receive a voltage on node 954 at the gate terminal thereof.

P channel MOS transistors 962 and 963 and N channel MOS transistors 964 and 965 differentially compare power supply voltage VccA supplied to power supply node 960 with power supply voltage Vcc supplied to power supply node 961 and output a result of the comparison as a voltage on node 968. When power supply voltage VccA supplied to power supply node 960 is higher than power supply voltage Vcc supplied to power supply node 961, a voltage on node 968 becomes relatively high. Since an electrical charge supplied to capacitor 970 through amplification circuit 969 increases, an electrical charge supplied to node 954 from power supply node 960 through N channel MOS transistor 953 also increases with increase in the electrical charge supplied to capacitor 970. As a result, a voltage on node 954 increases and N channel MOS transistor is thereby turned on to supply power supply voltage VccA to a node 972 from power supply node 960.

When power supply voltage VccA supplied onto power supply node 960 is lower than power supply voltage Vcc supplied onto power supply node 961, a voltage on node 968 becomes relatively low. Then, since an electrical charge supplied to capacitor 970 through amplification circuit 969 decreases, an electrical charge supplied to node 954 from power supply node 960 through N channel MOS transistor 953 also decreases with decrease in the electrical charge supplied to capacitor 970. As a result, a voltage on node 954 becomes low to turn off N channel MOS transistor 971; therefore, power supply voltage VccA is not supplied to node 972 from power supply node 960.

P channel MOS transistor 973 and N channel MOS transistor 975 are connected in series between power supply node 961 and a ground node 966. P channel MOS transistor 974 and N channel MOS transistor 976 are connected in series between power supply node 961 and ground node 966. A voltage on a node 977 is given to the gate terminals of P channel MOS transistors 973 and 974. N channel MOS transistor 975 receives power supply voltage Vcc from power supply node 961 at the gate terminal thereof N channel MOS transistor 976 receives power supply voltage VccA from power supply node 960 at the gate terminal thereof Amplification circuit 979 receives a voltage on a node 978 to amplify the received voltage and output the amplified voltage to capacitor 980. N channel MOS transistor 955 is connected in diode connection between power supply node 961 and a node 956. N channel MOS transistor 981 is connected between power supply node 961 and a node 982 to receive a voltage on node 956 at the gate terminal thereof.

P channel MOS transistors 973 and 974 and N channel MOS transistors 975 and 976 differentially compare power supply voltage Vcc supplied onto power supply node 961 with power supply voltage VccA supplied onto power supply node 960 to output a result of the comparison as a voltage on node 978. When power supply voltage Vcc supplied onto power supply node 961 is higher than power supply voltage VccA supplied onto power supply node 960, a voltage on node 978 becomes relatively high. Since an electrical charge supplied to capacitor 980 through amplification circuit 979 increases, an electrical charge supplied to node 956 from power supply node 961 through N channel MOS transistor 955 increases with increase in the electrical charge supplied to capacitor 980. As a result, a voltage on node 956 becomes high to turn on N channel MOS transistor 981; therefore; power supply voltage Vcc is supplied to node 982 from power supply node 961.

When power supply voltage Vcc supplied onto power supply node 961 is lower than power supply voltage VccA supplied onto power supply node 960, a voltage on node 978 becomes relatively low. In this state, since an electrical charge supplied to capacitor 980 through amplification circuit 979 decreases, an electrical charge supplied to node 956 through N channel MOS transistor 955 from power supply node 961 also decreases with decrease in the electrical charge supplied to capacitor 980. As a result, a voltage on node 956 becomes low to turn off N channel MOS transistor 981; therefore power supply voltage Vcc is not supplied to node 982 from power supply node 961.

Accordingly, when power supply voltage VccA is higher than power supply voltage Vcc, power supply voltage VccA is outputted from node 972, while when power supply voltage Vcc is higher than power supply voltage VccA, power supply voltage Vcc is outputted from node 982.

P channel MOS transistor 983 and N channel MOS transistor 985 are connected in series between power supply node 961 and ground node 987. P channel MOS transistor 984 and N channel MOS transistor 986 are connected in series between power supply node 961 and ground node 987. A voltage on a node 988 is given to the gate terminals of N channel MOS transistors 985 and 986. P channel MOS transistor 983 receives ground voltage Vs2 from ground node 987 at the gate terminal thereof. P channel MOS transistor 984 receives ground voltage Vs1 from ground node 966 at the gate terminal thereof.

Amplification circuit 990 receives a voltage on a node 989 to amplify the received voltage and output the amplified voltage to capacitor 991. P channel MOS transistor 992 is connected in diode connection between ground node 987 and a node 957. P channel MOS transistor 993 is connected between ground node 987 and a node 994 to receive a voltage on node 957 at the gate terminal thereof.

P channel MOS transistors 983 and 984, and N channel MOS transistors 985 and 986 differentially compare ground voltage Vs2 supplied onto ground node 987 with ground voltage Vs1 supplied onto ground node 966 to output a result of the comparison as a voltage on node 989. When ground voltage Vs2 supplied onto ground node 987 is lower than ground voltage Vs1 supplied onto ground node 966, a voltage on node 989 becomes relatively low. In this state, since an electrical charge supplied to capacitor 991 through amplification circuit 990 decreases, an electrical charge increases that flows to ground node 987 through P channel MOS transistor 992 with decrease in the electrical charge supplied to capacitor 991. As a result, a voltage on node 957 decreases to turn on P channel MOS transistor 993; therefore, ground voltage Vs2 is supplied to node 994 from ground node 987.

When ground voltage Vs2 supplied onto ground node 987 is higher than ground voltage Vs1 supplied onto ground node 966, a voltage on node 989 becomes relatively high. In this state, since an electrical charge supplied to capacitor 991 through amplification circuit 990 increases, an electrical charge decreases that flows to ground node 987 through P channel MOS transistor 992 with increase in the electrical charge supplied to capacitor 991. As a result, a voltage on node 957 increases to turn off P channel MOS transistor 993; therefore, ground voltage Vs2 is not supplied to node 994 from ground node 987.

P channel MOS transistor 995 and N channel MOS transistor 997 are connected in series between power supply node 961 and ground node 966. P channel MOS transistor 996 and N channel MOS transistor 998 are connected in series between power supply node 961 and ground node 966. A voltage on a node 943 is given to the gate terminals of N channel MOS transistors 997 and 998. P channel MOS transistor 995 receives ground voltage Vs1 from ground node 966 at the gate terminal thereof. P channel MOS transistor 996 receives ground voltage Vs2 from ground node 987 at the gate terminal thereof.

Amplification circuit 945 receives a voltage on a node 944 to amplify the received voltage and output the amplified voltage to capacitor 946. P channel MOS transistor 947 is connected in diode connection between ground node 966 and a node 958. P channel MOS transistor 948 is connected between ground node 966 and a node 949 to receive a voltage on node 958 at the gate terminal thereof.

P channel MOS transistors 995 and 996, and N channel MOS transistors 997 and 998 differentially compare ground voltage Vs1 supplied onto ground node 966 with ground voltage Vs2 supplied onto ground node 987 to output a result of comparison as a voltage on node 944. When ground voltage Vs1 supplied onto ground node 966 is lower than ground voltage Vs2 supplied onto ground node 987, a voltage on node 944 becomes relatively low. In this state, since an electrical charge supplied to capacitor 946 through amplification circuit 945 decreases, an electrical charge increases that flows to ground node 966 through P channel MOS transistor 947 with decrease in the electrical charge supplied to capacitor 946. As a result, a voltage on node 958 decreases to turn on P channel MOS transistor 948; therefore, ground voltage Vs1 is supplied onto node 949 from ground node 966.

When ground voltage Vs1 supplied onto ground node 966 is lower than ground voltage Vs2 supplied onto ground node 987, a voltage on node 944 becomes relatively high. In this state, since an electrical charge supplied to capacitor 946 through amplification circuit 945 increases, an electrical charge decreases that flows to ground node 966 through P channel MOS transistor 947 with increase in the electrical charge supplied to capacitor 946. As a result, a voltage on node 958 increases to turn off P channel MOS transistor 948; therefore, ground voltage Vs1 is not supplied onto node 949 from ground node 966.

Accordingly, when ground voltage Vs2 is lower than ground voltage Vs1, ground voltage Vs2 is outputted from node 994, while when ground voltage Vs1 is lower than ground voltage Vs2, ground voltage Vs1 is outputted from node 949.

As described above, substrate voltage supply circuit 90B compares power supply voltage VccA with power supply voltage Vcc to automatically select a power supply voltage with a higher level therebetween and output thus selected power supply voltage; while comparing ground voltage Vs1 with ground voltage Vs2 to automatically select a ground voltage with a lower level therebetween and output thus selected ground voltage.

A power supply voltage and ground voltage outputted from substrate voltage supply circuit 90B are supplied, as substrate voltages Vsub1 and Vsub2, to P channel MOS transistor 833 and N channel MOS transistor 835 constituting sense amplifier 83 shown in FIG. 27, and to P channel MOS transistor 7120 and N channel MOS transistor 7121 constituting GIO line write driver 711.

Furthermore, a power supply voltage and ground voltage outputted from substrate voltage supply circuit 90B are supplied, as substrate voltages Vsub1 and Vsub2, to P channel MOS transistor 832 and N channel MOS transistor 834 constituting sense amplifier 83, and to P channel MOS transistor 7124 and N channel MOS transistor 7125 constituting GIO line write driver 711.

Still furthermore, a power supply voltage and ground voltage outputted from substrate voltage supply circuit 90B are supplied, as substrate voltages Vsub1 and Vsub2, to P channel MOS transistor 832 and N channel MOS transistor 834 constituting sense amplifier 83, and to P channel MOS transistors 7311 to 7313 constituting GIO line equalize circuit 731.

Yet furthermore, a power supply voltage and ground voltage outputted from substrate voltage supply circuit 90B are supplied, as substrate voltages Vsub1 and Vsub2, to P channel MOS transistor 833 and N channel MOS transistor 835 constituting sense amplifier 83, and to P channel MOS transistors 7311 to 7313 constituting GIO line equalize circuit 731.

Figure 31:
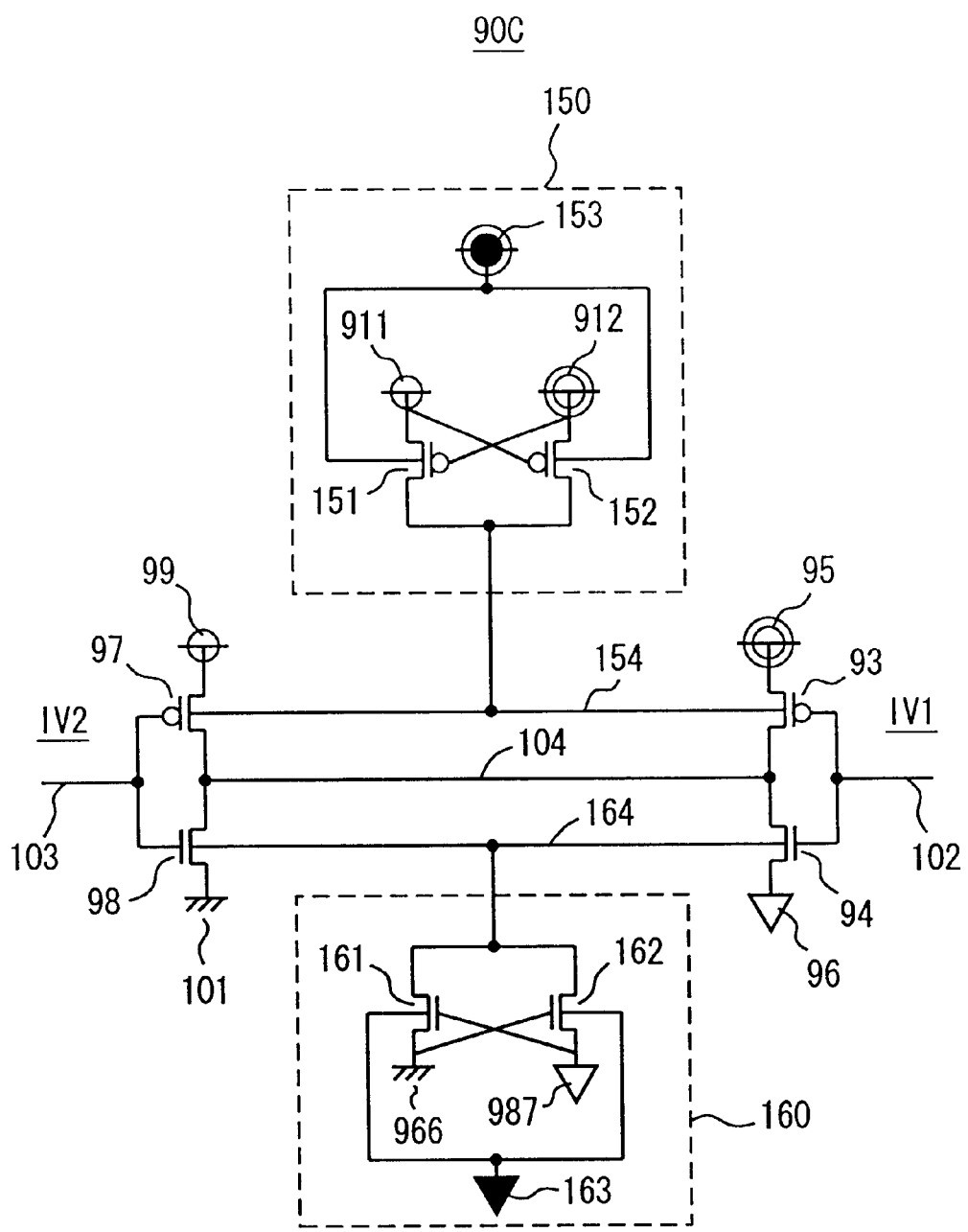
FIG. 31 is a circuit diagram of still another substrate voltage supply circuit integrated on a semiconductor memory device shown in FIG. 28.

Semiconductor memory circuit 100H according to the ninth embodiment may be integrated with substrate voltage supply circuit 90C shown in FIG. 31 instead of substrate voltage supply circuit 90A.

FIG. 31 is a configuration obtained by replacing high voltage supply circuit 91A shown in FIG. 29 with a high voltage supply circuit 150 and further replacing low voltage supply circuit 92A shown in the figure with a low voltage supply circuit 160. Referring to FIG. 31, high voltage supply circuit 150 includes P channel MOS transistors 151 and 152. P channel MOS transistor 151 is connected between a power supply node 911 and a node 154 to receive power supply voltage VccA from a power supply node 912 at the gate terminal thereof. P channel MOS transistor 152 is connected between power supply node 912 and node 154 to receive power supply voltage Vcc from power supply node 911 at the gate terminal thereof. P channel MOS transistors 151 and 152 receive a voltage from power supply node 153 as a substrate voltage.

When power supply voltage VccA is higher than power supply voltage Vcc, P channel MOS transistor 151 is turned off, while P channel MOS transistor 152 is turned on; therefore, high voltage supply circuit 150 supplies power supply voltage VccA to substrates of P channel MOS transistors 93 and 97 through node 154 from power supply node 912. On the other hand, when power supply voltage Vcc is higher than power supply voltage VccA, P channel MOS transistor 152 is turned off, while P channel MOS transistor 151 is turned on; therefore, high voltage supply circuit 150 supplies power supply voltage Vcc to the substrates of P channel MOS transistors 93 and 97 through node 154 from power supply node 911.

Low voltage supply circuit 160 includes N channel MOS transistors 161 and 162. N channel MOS transistor 161 is connected between a ground node 966 and a node 164 to receive ground voltage Vs2 from ground node 987 at the gate terminal thereof. N channel MOS transistor 162 is connected between ground node 987 and node 164 to receive ground voltage Vs1 from ground node 966 at the gate terminal thereof. N channel MOS transistors 161 and 162 receive a voltage from a ground node 163 as a substrate voltage.

When ground voltage Vs2 is lower than ground voltage Vs1, N channel MOS transistor 161 is turned off, while N channel MOS transistor 162 is turned on; therefore, low voltage supply circuit 160 supplies ground voltage Vs2 to substrates of N channel MOS transistors 94 and 98 through node 164 from ground node 987. On the other hand, when ground voltage Vs1 is lower than ground voltage Vs2, N channel MOS transistor 162 is turned off, while N channel MOS transistor 161 is turned on; therefore, low voltage supply circuit 160 supplies ground voltage Vs1 to the substrates of N channel MOS transistors 94 and 98 through node 164 from ground node 966.

As described above, substrate voltage supply circuit 90C compares power supply voltage VccA with power supply voltage Vcc to automatically select a power supply voltage with a higher level therebetween and output the selected power supply voltage, while comparing ground voltage Vs1 with ground voltage Vs2 to automatically select a ground voltage with a lower level therebetween and output the selected ground voltage.

A power supply voltage and ground voltage outputted from substrate voltage supply circuit 90C are supplied as substrate voltages Vsub1 and Vsub2 to P channel MOS transistor 833 and N channel MOS transistor 835 constituting sense amplifier 83 and to P channel MOS transistor 7120 and N channel MOS transistor 7121 constituting GIO line write driver 711 shown in FIG. 27.

Furthermore, a power supply voltage and ground voltage outputted from substrate voltage supply circuit 90C are supplied as substrate voltages Vsub1 and Vsub2 to P channel MOS transistor 832 and N channel MOS transistor 834 constituting sense amplifier 83 and to P channel MOS transistor 7124 and N channel MOS transistor 7125 constituting GIO line write driver 711.

Still furthermore, a power supply voltage and ground voltage outputted by substrate voltage supply circuit 90C are supplied as substrate voltages Vsub1 and Vsub2 to P channel MOS transistor 832 and N channel MOS transistor 834 constituting sense amplifier 83 and to P channel MOS transistors 7311 to 7313 constituting GIO line equalize circuit 731.

Yet furthermore, a power supply voltage and ground voltage outputted by substrate voltage supply circuit 90C are supplied as substrate voltages Vsub1 and Vsub2 to P channel MOS transistor 833 and N channel MOS transistor 835 constituting sense amplifier 83 and to P channel MOS transistors 7311 to 7313 constituting GIO line equalize circuit 731.

Note that while, taken up in the above description is power supply voltages at two voltage levels, which are compared with each other or ground voltages at two voltage levels, which are compared with each other, no specific limitation is given to the cases in the present invention; it is only required that supplied as a substrate voltage is a power supply voltage at the highest level among plural power supply voltages or a ground voltage at the lowest level among plural ground voltages.

In the present invention, substrate voltage supply circuits 90A, 90B and 90C may be applied to any of semiconductor memory devices 100A to 100F according to the respective second to seventh embodiments.

According to the ninth embodiment, a semiconductor memory device supplies a power supply voltage at the highest level among plural power supply voltages having respective different voltage levels to substrates of P channel MOS transistors, while supplying a ground voltage at the lowest level among plural ground voltages having respective different voltage levels to substrates of N channel MOS transistors; therefore, a forward leakage current across a PN junction can be prevented in any of the MOS transistors.

Figure 32:
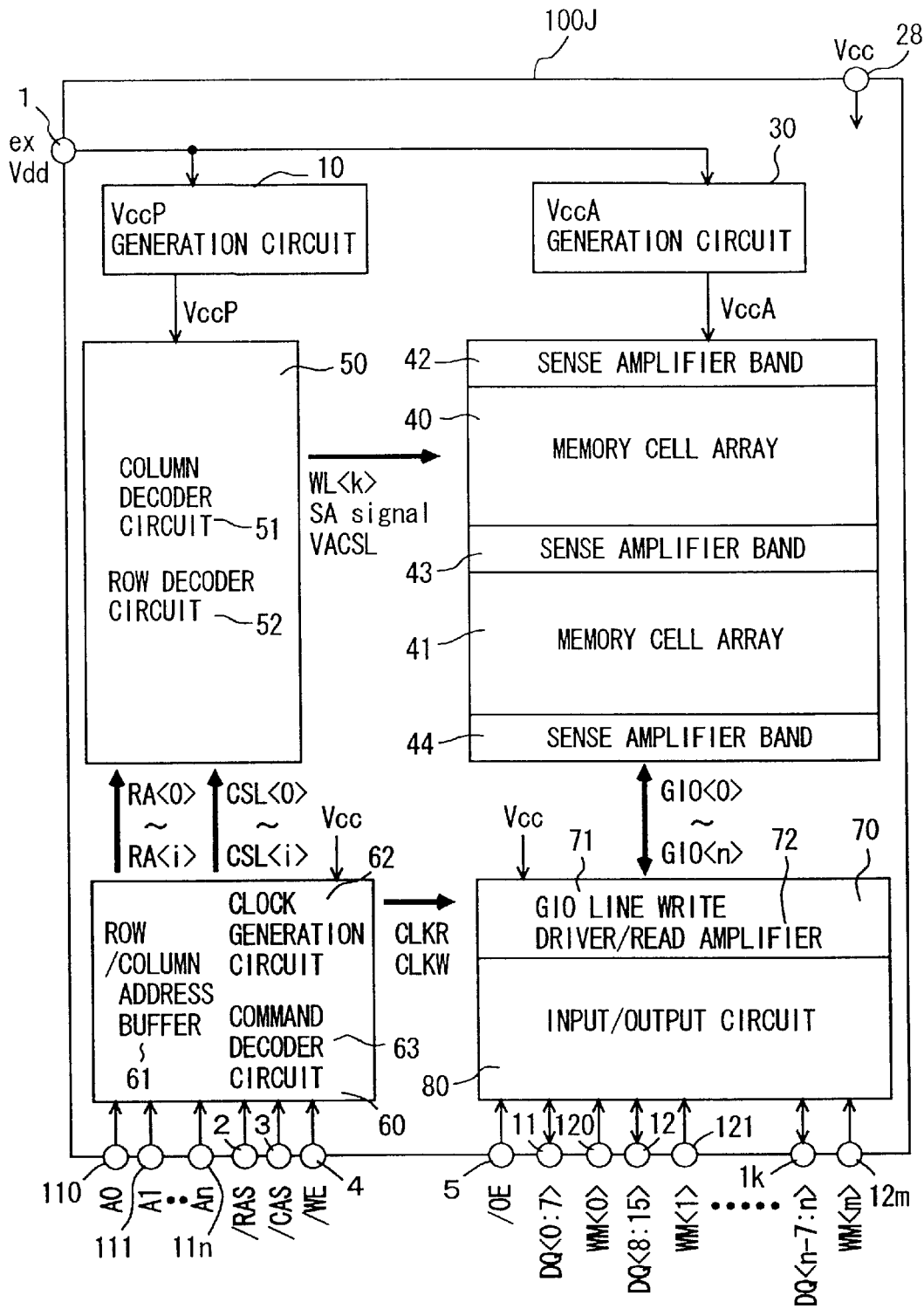
FIG. 32 is a schematic block diagram of another semiconductor memory device according to the first to ninth embodiments.
Figure 33:
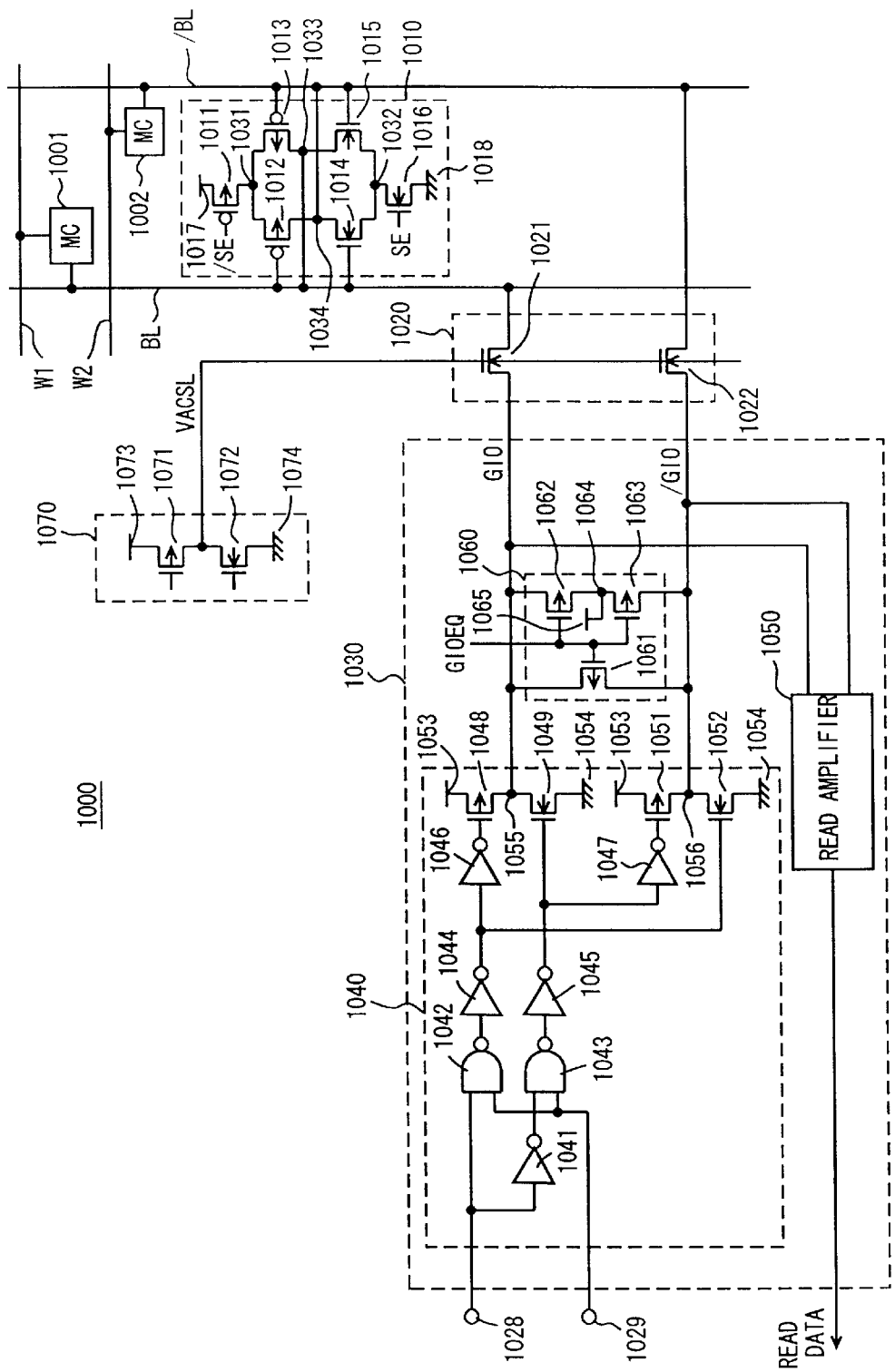
FIG. 33 is a circuit diagram of a GIO line write driver, a GIO line equalize circuit, a bit line driver, and a sense amplifier combined in a prior art semiconductor memory device.
Figure 34:
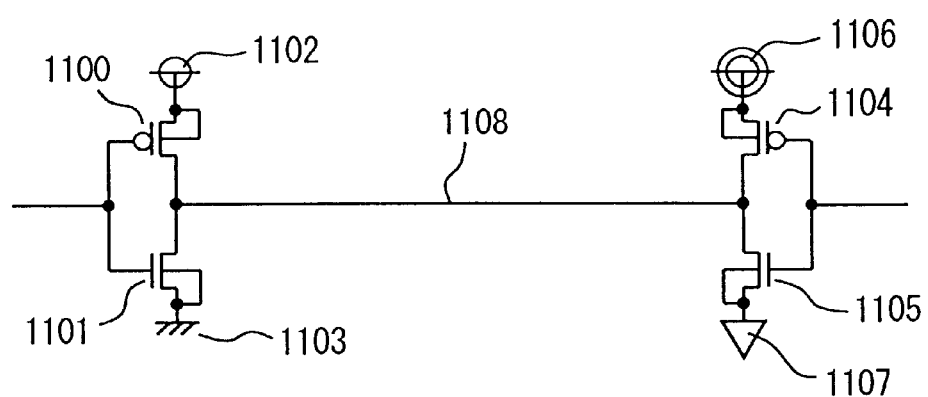
FIG. 34 is a circuit diagram of a circuit using a common output node.

Note that while, in semiconductor memory device 100, description is given such that power supply voltage Vcc, as shown in FIG. 1, is generated inside semiconductor memory device 100, a semiconductor memory device according to the first embodiment may be semiconductor memory device 100J shown in FIG. 32. Semiconductor memory device 100J is a semiconductor memory device whose power supply voltage Vcc is supplied externally through a terminal 28. Semiconductor memory device 100J whose power supply voltage Vcc is supplied externally through terminal 28 as shown in FIG. 32 can be applied in the following cases: semiconductor memory device 100A according to the second embodiment shown in FIG. 11, semiconductor memory device 100B according to the third embodiment shown in FIG. 14, semiconductor memory device 100C according to the fourth embodiment shown in FIG. 16, semiconductor memory device 100D according to the fifth embodiment shown in FIG. 19, semiconductor memory device 100E according to the sixth embodiment shown in FIG. 21, semiconductor memory device 100F according to the seventh embodiment shown in FIG. 23, semiconductor memory device 100G according to the eighth embodiment shown in FIG. 24, and semiconductor memory device 100H according to the ninth embodiment shown in FIG. 28.

Furthermore, while, in the above description, power supply voltage VccA and power supply voltage VccP are generated inside a semiconductor memory device, power supply voltages VccA and VccP may be externally supplied in the present invention.

In such a way, in the present invention, power supply voltages Vcc, VccA and VccP may be generated inside a semiconductor memory device or supplied from outside it.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

plural memory cells;

plural bit line pairs, provided correspondingly to said plural memory cells, and each for inputting or outputting data to or from a memory cell;

plural sense amplifiers, provided correspondingly to said plural bit line pairs, and each supplying a first power supply voltage to one of a corresponding bit line pair when data is inputted to or outputted from said memory cell;

plural global data line pairs provided correspondingly to said plural bit line pairs;

a write/read circuit supplying a second power supply voltage lower than said first power supply voltage to one of a corresponding global data line pair when data is written onto said memory cell, and receiving said second power supply voltage from said one of said corresponding global data line pair when data is read from said memory cell;

a column decoder circuit outputting an activation signal for activating a bit line pair provided correspondingly to a memory cell to or from which data is inputted or outputted among said plural bit line pairs when data is inputted to or outputted from said memory cell, and a deactivation signal for deactivating bit line pairs provided correspondingly to memory cells other than said memory cell to or from which data is inputted or outputted; and plural gate circuits provided correspondingly to said plural bit line pairs and said plural global data line pairs, wherein each of said plural gate circuits connects a corresponding bit line pair to a corresponding global data line pair when receiving said activation signal, while disconnecting a corresponding bit line pair from a corresponding global data line pair when receiving said deactivation signal, and a current flowing from said bit line pair toward said global data line pair through a gate circuit receiving said activation signal is smaller than a predetermined value.

2. The semiconductor memory device according to claim 1, wherein said activation signal is composed of a third power supply voltage and each of said plural gate circuits includes MOS transistors to be activated by said third power supply voltage.

3. The semiconductor memory device according to claim 2, wherein each of said plural gate circuits includes:

a first MOS transistor connected to one of a global data line pair at a source terminal thereof and to one of a bit line pair at a drain terminal thereof, and receiving said third power supply voltage at a gate terminal thereof; and a second MOS transistor connected to the other of said global data line pair at a source terminal thereof and to the other of said bit line pair at a drain terminal thereof, and receiving said third power supply voltage at a gate terminal thereof, wherein when threshold voltages of said first and second MOS transistors are Vth, said second power supply voltage is Vcc and said third power supply voltage is VccP by definition, a relation VccP≦Vcc+Vth is satisfied.

4. The semiconductor memory device according to claim 2, wherein each of said plural gate circuits includes:

a first MOS transistor of a first conductive type, connected to one of a global data line pair at a source terminal thereof and to one of a bit line pair at a drain terminal thereof, and receiving said third power supply voltage at a gate terminal thereof; and a second MOS transistor of said first conductive type, connected to the other of said global data line pair at a source terminal thereof and to the other of said bit line pair at a drain terminal thereof, and receiving said third power supply voltage at a gate terminal thereof and said write/read circuit includes a third MOS transistor of a second conductive type, wherein when threshold voltages of said first and second MOS transistors are Vth, said second power supply voltage is Vcc, said third power supply voltage is VccP and a built-in potential of said third MOS transistor is Vb by definition, a relation $VccP \leq Vcc+Vth+Vb$ is satisfied.

5. The semiconductor memory device according to claim 1, wherein said activation signal is composed of a third power supply voltage generated in response to a voltage level of said second power supply voltage.

6. The semiconductor memory device according to claim 5, further comprising:

a power supply voltage change-over circuit receiving a voltage level change-over signal for changing voltage levels of said third power supply voltage therebetween in response to the voltage level of said second power supply voltage to change over voltage levels of said third power supply voltage based on thus received voltage change-over signal and output said third power supply voltage with a changed voltage level to said column decoder circuit, wherein said column decoder circuit generates said activation signal composed of said third power supply voltage outputted by said power supply change-over circuit.

7. The semiconductor memory device according to claim 6, wherein each of said plural gate circuits includes:

a first MOS transistor connected to one of a global data line pair at a source terminal thereof and to one of a bit line pair at a drain terminal thereof, and receiving said third power supply voltage at a gate terminal thereof; and a second MOS transistor connected to the other of said global data line pair at a source terminal thereof and to the other of said bit line pair at a drain terminal thereof, and receiving said third power supply voltage at a gate terminal thereof, wherein when threshold voltages of said first and second MOS transistors are Vth, said second power supply voltage is Vcc and said third power supply voltage is VccP by definition, a relation $VccP \leq Vcc+Vth$ is satisfied.

8. The semiconductor memory device according to claim 6, wherein each of said plural gate circuits includes:

a first MOS transistor of a first conductive type, connected to one of a global data line pair at a source terminal thereof and to one of a bit line pair at a drain terminal thereof, and receiving said third power supply voltage at a gate terminal thereof; and a second MOS transistor of said first conductive type, connected to the other of said global data line pair at a source terminal thereof and to the other of said bit line pair at a drain terminal thereof, and receiving said third power supply voltage at a gate terminal thereof and said write/read circuit includes a third MOS transistor of a second conductive type, wherein when threshold voltages of said first and second MOS transistors are Vth, said second power supply voltage is Vcc, said third power supply voltage is VccP and a built-in potential of said third MOS transistor is Vb by definition, a relation $VccP \leq Vcc+Vth+Vb$ is satisfied.

9. The semiconductor memory device according to claim 6, wherein said power supply voltage change-over circuit changes over voltage levels of said third power supply voltage based on a mode change-over signal.

10. The semiconductor memory device according to claim 6, wherein said power supply voltage change-over circuit changes over voltage levels of said third power supply voltage by means of changing wire bonding or changing masks.

11. The semiconductor memory device according to claim 6, wherein said power supply voltage change-over circuit receives said voltage level change-over signal from a decoding circuit changing modes.

12. The semiconductor memory device according to claim 5, further comprising:

a power supply voltage change-over circuit changing voltage levels of said third power supply voltage with reference to a reference voltage whose voltage level changes in response to the voltage level of said second power supply voltage.

13. The semiconductor memory device according to claim 12, wherein said power supply voltage change-over circuit includes:

a reference voltage generation circuit generating plural reference voltages;

a select circuit selecting said reference voltage according to the voltage level of said second power supply voltage among said plural reference voltages; and a step-down circuit reducing an external power supply voltage down to said selected reference voltage to generate said third power supply voltage.

14. The semiconductor memory device according to claim 12, wherein said power supply voltage change-over circuit includes:

a reference voltage generation circuit generating said reference voltage with a different voltage level by changing a voltage division ratio for an external power supply voltage in response to the voltage level of said second power supply voltage; and a step-down circuit reducing said external power supply voltage down to said reference voltage received from said reference voltage generation circuit to generate said third power supply voltage.

15. A semiconductor memory device comprising:

plural power supply terminals for supplying plural power supply voltages with different voltage levels;

plural ground terminals for supplying plural ground voltages with different voltage levels; and plural circuits using an output node commonly therebetween, and for inputting or outputting data to or from a memory cell, wherein each of said plural circuits is different from the other in drive voltage and includes a MOS transistor of a first conductive type provided between a power supply node and said output node; and a MOS transistor of a second conductive type provided between said output node and a ground node, said MOS transistor of a first conductive type receiving a power supply voltage with the highest voltage level among said plural power supply voltages as a substrate voltage thereof from said power supply terminal, and said MOS transistor of a second conductive type receiving a ground voltage with the lowest voltage level among said plural ground voltages as a substrate voltage thereof from said ground terminal.

16. The semiconductor memory device according to claim 15, wherein said power supply voltage with the highest voltage level coincides with a voltage supplied to a power supply node of a circuit whose drive voltage is the highest among said plural circuits, and said ground voltage with the lowest voltage level coincides with a voltage supplied to a ground node of a circuit whose drive voltage is the highest among said plural circuit.

17. The semiconductor memory device according to claim 16, further comprising:

a first switch selecting said power supply voltage with the highest voltage level among said plural power supply voltages to give the selected power supply voltage to said MOS transistor of a first conductive type; and a second switch selecting said ground voltage with the lowest voltage level among said plural ground voltages to give the selected ground voltage to said MOS transistor of a second conductive type.

18. The semiconductor memory device according to claim 16, further comprising:

a first comparison circuit comparing voltage levels of said plural power supply voltages therebetween to output a result of the comparison;

a second comparison circuit comparing voltage levels of said plural ground voltages therebetween to output a result of the comparison;

a first switch selecting said power supply voltage with the highest voltage level based on said result of the comparison from said first comparison circuit to give the selected power supply voltage to said MOS transistor of a first conductive type; and a second switch selecting said ground voltage with the lowest voltage level based on said result of the comparison from said second comparison circuit to give the selected ground voltage to said MOS transistor of a second conductive type.

19. The semiconductor memory device according to claim 15, further comprising:

a power supply voltage supply circuit selecting said power supply voltage with the highest voltage level based on voltage levels of said plural power supply voltages to give the selected power supply voltage to said MOS transistor of a first conductive type; and a ground voltage supply circuit selecting said ground voltage with the lowest voltage level based on voltage levels of said plural ground voltages to give the selected ground voltage to said MOS transistor of a second conductive type.

* * * * *